United States Patent
Zhang et al.

(10) Patent No.: US 10,109,696 B2
(45) Date of Patent: Oct. 23, 2018

(54) DISPLAY APPARATUS AND METHOD OF MANUFACTURING DISPLAY APPARATUS

(71) Applicant: NLT Technologies, Ltd., Kawasaki, Kanagawa (JP)

(72) Inventors: Buxiang Zhang, Kawasaki (JP); Yoshihiro Nonaka, Kawasaki (JP)

(73) Assignee: NLT Technologies, Ltd., Kawasaki, Kanagawa (JP)

( * ) Notice: Subject to any disclaimer, the term of this patent is extended or adjusted under 35 U.S.C. 154(b) by 0 days.

(21) Appl. No.: 15/392,025

(22) Filed: Dec. 28, 2016

(65) Prior Publication Data

US 2017/0186832 A1   Jun. 29, 2017

(30) Foreign Application Priority Data

Dec. 29, 2015  (JP) ................................. 2015-257697
Sep. 2, 2016   (JP) ................................. 2016-172061

(51) Int. Cl.
| | |
|---|---|
| H01L 27/32 | (2006.01) |
| G09G 3/3266 | (2016.01) |
| G09G 3/3291 | (2016.01) |
| H01L 27/12 | (2006.01) |
| G09G 3/3233 | (2016.01) |

(52) U.S. Cl.
CPC ....... *H01L 27/3262* (2013.01); *G09G 3/3233* (2013.01); *H01L 27/124* (2013.01); *H01L 27/1255* (2013.01); *H01L 27/1259* (2013.01); *H01L 27/3265* (2013.01); *G09G 2300/0852* (2013.01); *G09G 2300/0861* (2013.01); *G09G 2310/0251* (2013.01); *G09G 2310/0262* (2013.01); *G09G 2320/0233* (2013.01); *G09G 2330/04* (2013.01)

(58) Field of Classification Search
CPC ............... H01L 27/3262; H01L 27/124; H01L 27/1225; H01L 27/1259; H01L 27/3265; G09G 3/3233; G09G 2300/0852; G09G 2300/0861; G09G 2310/0251; G09G 2310/0262; G09G 2320/0233; G09G 2330/04
USPC .............................................. 257/72; 345/76
See application file for complete search history.

(56) References Cited

U.S. PATENT DOCUMENTS

2014/0111404 A1*  4/2014  Omata .................. H05B 33/08
                                                              345/76

FOREIGN PATENT DOCUMENTS

JP          2014-163991 A        9/2014

* cited by examiner

*Primary Examiner* — Cuong Q Nguyen
*Assistant Examiner* — Tong-Ho Kim
(74) *Attorney, Agent, or Firm* — Sughrue Mion, PLLC

(57) ABSTRACT

A display apparatus includes: a light emitting device in which a first electrode, a light emitting layer, and a second electrode are laminated; a pixel circuit, which is arranged on a lower side of the light emitting device, having a drive transistor including a source electrode connected to the first electrode and controlling a current supplied to the light emitting device; a first metal plate and a second metal plate arranged to face the light emitting layer across the first electrode; and a first insulating layer arranged between the first electrode and both the first metal plate and the second metal plate. The first metal plate is connected to a gate electrode of the drive transistor, the second metal plate is connected to a first voltage line, and the first metal plate and the second metal plate are arranged on the same plane face.

20 Claims, 57 Drawing Sheets

F I G. 8
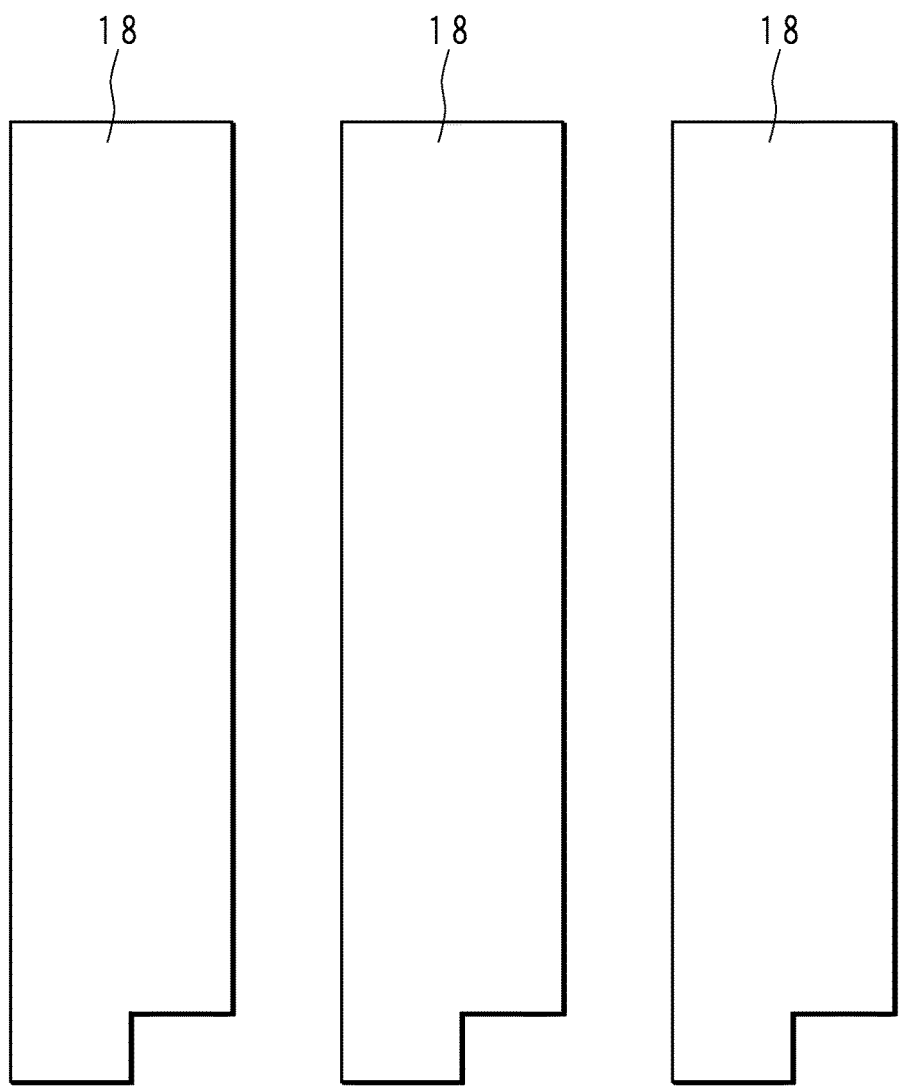

DISPLAY APPARATUS AND METHOD OF MANUFACTURING DISPLAY APPARATUS

CROSS-REFERENCE TO RELATED APPLICATIONS

This non-provisional application claims priority under 35 U.S.C. §119(a) on Patent Application No. 2015-257697 filed in Japan on Dec. 29, 2015, and Patent Application No. 2016-172061 filed in Japan on Sep. 2, 2016, the entire contents of which are hereby incorporated by reference.

FIELD

The present disclosure relates to a display apparatus and a method of manufacturing a display apparatus.

BACKGROUND

An organic electroluminescent display apparatus displays an image by using organic light emitting diodes (OLED) (see Japanese Patent Application Laid-Open No. 2014-163991). Here, a display apparatus of the OLED type will be referred to as a display apparatus.

Each pixel configuring an image display unit of the display apparatus includes a laminated body of an organic light emitting diode, which is a self light-emitting device, and a pixel circuit. The pixel circuit supplies a drive current to the organic light emitting diode. The pixel circuit includes a thin film transistor (TFT) and a storage capacitor.

The luminance of each of a plurality of pixels of display apparatus is determined by an image signal acquired from the outside. The display apparatus controls the pixel circuit to apply a drive current according to the luminance to the organic light emitting diode.

SUMMARY

There are cases where a current according to an image signal and a drive current actually supplied to the organic light emitting diode does not match each other. Due to such a mismatch, there are cases where the luminance of organic light emitting devices is non-uniform on a display panel (so-called luminance unevenness).

A display apparatus according to one aspect of the present disclosure includes: a light emitting device in which a first electrode, a light emitting layer, and a second electrode are laminated; a pixel circuit, which is disposed on a lower side of the light emitting device, having a drive transistor including a source electrode connected to the first electrode and controlling a current supplied to the light emitting device; a first metal plate and a second metal plate arranged to face the light emitting layer across the first electrode; and a first insulating layer disposed between the first electrode and both the first metal plate and the second metal plate. The first metal plate is connected to a gate electrode of the drive transistor, the second metal plate is connected to a first voltage line, and the first metal plate and the second metal plate are disposed on the same plane surface.

It is to be understood that both the foregoing general description and the following detailed description are exemplary and explanatory and are not restrictive of this disclosure.

The above and further objects and features will more fully be apparent from the following detailed description with accompanying drawing.

BRIEF DESCRIPTION OF THE DRAWINGS

FIG. 8 is a schematic plan view of a first electrode.

DETAILED DESCRIPTION OF NON-LIMITING EXAMPLE EMBODIMENTS

Hereinafter, display apparatuses according to embodiments will be described referring to related drawings. In description and claims presented here, ordinal numbers such as "a first" and "a second" are assigned for clarifying a relation among elements and preventing confusion among the elements. Thus, such ordinal numbers are not for the purpose of limiting the elements in a numerical manner.

The dimension, the ratio, and the like of each illustrated constituent element may not be illustrated to match those of an actual constituent element. In addition, for the convenience of illustration or description of the drawings, a constituent element included in an actual object may be omitted, or the dimension of an illustrated constituent element may be exaggerated from a constituent element included in an actual object.

A term called "connection" means that connection targets are electrically connected. The "electrically connected" includes a case where connection targets are connected through an electrical element such as an electrode, a wiring, a resistor, or a capacitor as well. Here, the term "electrode" or "wiring" does not functionally limit such a constituent element. For example, the "wiring" may be used as a part of the "electrode". To the contrary, the "electrode" may be used as a part of the "wiring".

Embodiment 1

Figure 1:
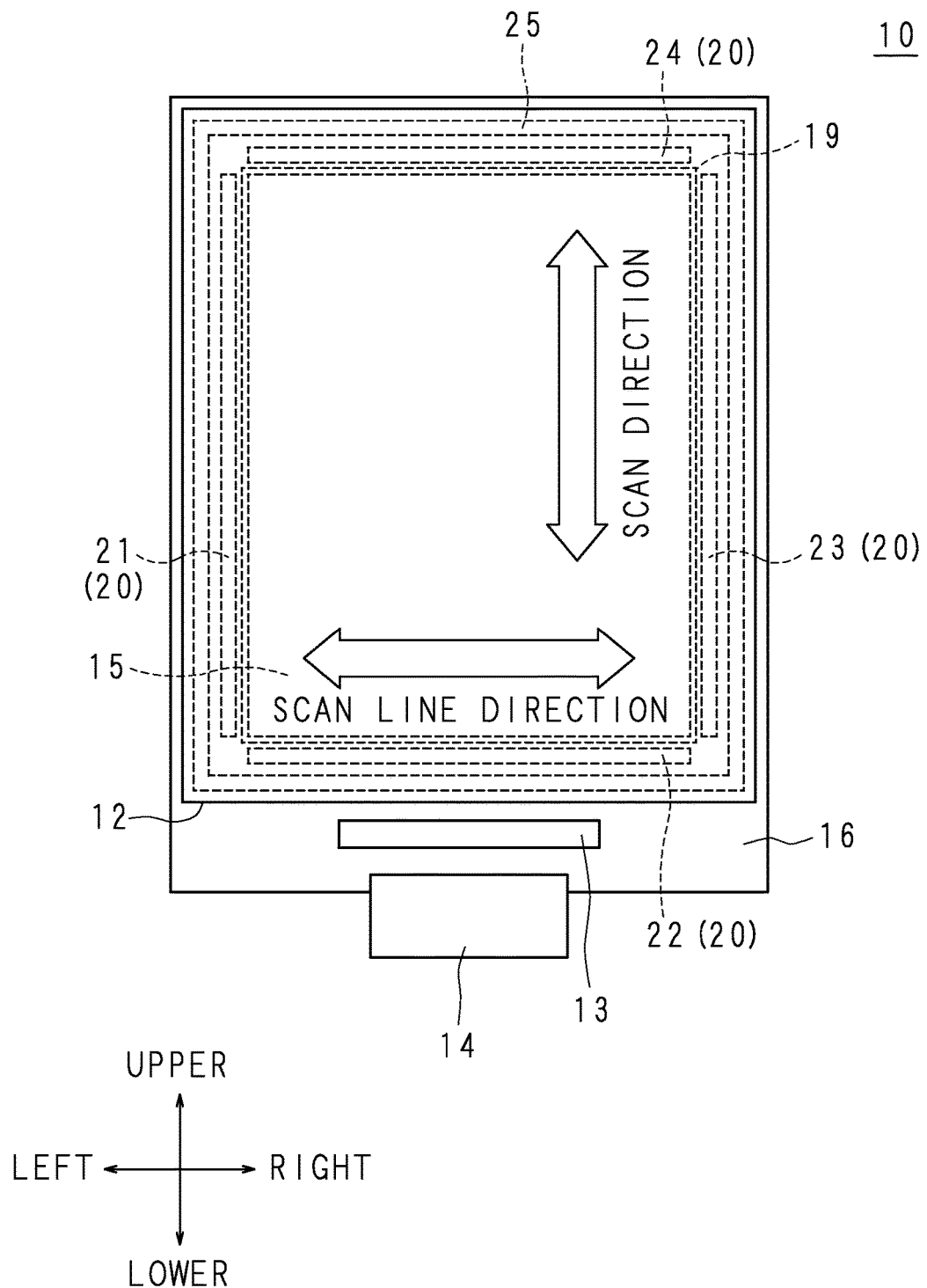
FIG. 1 is an external view of an example of non-limiting display apparatus.

FIG. 1 is an external view of an example of non-limiting display apparatus 10. FIG. 1 is a diagram of the display apparatus 10 viewed from the front side, in other words, from the side of a face on which an image is displayed. The display apparatus 10 is an apparatus that displays a still image and a moving image. The display apparatus 10 is used with being built in an electronic apparatus. The electronic apparatus, for example, is a smartphone, a tablet terminal, a personal computer, a television set, or the like. The display apparatus 10 according to this embodiment is a display panel (hereinafter, abbreviated to a display panel) of an OLED. In description presented hereinafter, the upper side, the lower side, the left side, and the right side of each drawing will be used.

The display apparatus 10 includes: a second substrate 12; a driver IC 13; a flexible printed circuit (FPC) 14; and a display substrate 16. The display substrate 16 is a substrate made of glass including an image display unit 15, a drive circuit 20, and a wiring and the like not illustrated in the drawing on one face.

The second substrate 12, for example, is a substrate made of glass covering the image display unit 15 and the drive circuit 20. The second substrate 12 may be a flexible substrate. A space 27 (see FIG. 4) between the second electrode 19 and the second substrate 12 is sealed by a sealing unit 25 enclosing the image display unit 15 and the drive circuit 20 to be airtight. In the space 27, an inert gas such as a nitrogen gas is enclosed.

The driver IC 13 is an integrated circuit that is mounted on the display substrate 16 by using an anisotropic conduction film and is conductive for the display substrate 16. The function of the driver IC 13 will be described later.

The FPC 14 is a substrate having flexibility that is connected to the display substrate 16. The FPC 14, the driver IC 13, and the drive circuit 20 included in the display substrate 16 are interconnected through a wiring not illustrated in the drawing. The display apparatus 10 acquires an image signal from a control unit of an electronic apparatus through the FPC 14.

The image display unit 15 includes a plurality of pixels 90 (see FIG. 2) that are regularly disposed. The image display unit 15 is covered with a second electrode 19. Each pixel 90 includes three subpixels 99 (see FIG. 5). A relation between the pixel 90 and the subpixels 99 will be described later.

Figure 3:
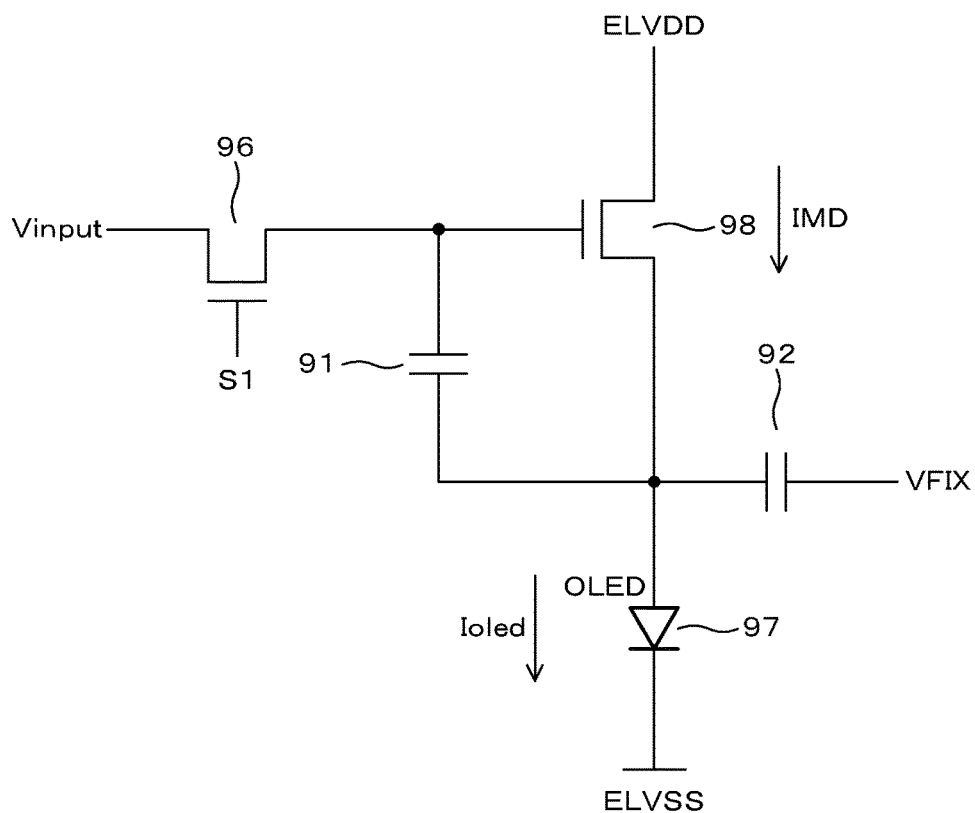
FIG. 3 is an equivalent circuit diagram that illustrates a circuit driving an organic light emitting diode.

Each subpixel 99 includes an organic light emitting diode 97 (see FIG. 3) and a pixel circuit that controls a current supplied to the organic light emitting diode 97 (see FIG. 3). The organic light emitting diode 97 emits light based on a current supplied by the pixel circuit. The pixel circuit will be described later.

The second electrode 19 is a common electrode connected to each of the subpixel 99. The second electrode 19, for example, is a semi-transparent electrode made of indium tin oxide (ITO), transparent conductive ink, graphene, or the like. The material of the second electrode 19, for example, may be a material acquired by laminating silver (Ag), magnesium (Mg), calcium (Ca), or the like into a very thin film or an alloy thereof (for example, an MgAg alloy). The second electrode 19 is a cathode electrode of the organic light emitting diode 97 according to this embodiment.

The drive circuit 20 includes: a scan driver 21; a data driver 22, an emission driver 23; and a protection circuit 24. The drive circuit 20 is formed by a semiconductor process. In addition, a part of the drive circuit 20 may have its function built in the driver IC 13 and be not formed on the display substrate 16. Furthermore, the data driver 22 may not be formed on the display substrate 16. Hereinafter, an overview of the drive circuit 20 will be described.

The scan driver 21 is positioned on the outer side of the image display unit 15 along the left side of the image display unit 15. The scan driver 21 sequentially drives a plurality of pixels 90 arranged in each row in units of rows, thereby controlling timing of light emission. In other words, the scan driver 21 drives wirings (see FIG. 2) extending from the scan driver 21 in the horizontal direction, thereby controlling the timing of light emission of the pixels 90. Hereinafter, the wirings will be appropriately referred to as scan lines.

In FIG. 1, a thick line illustrated in the vertical direction represents a scan direction. By performing switching of scan lines to be driven in the scan direction, the scan driver 21 applies a timing signal on the image display unit 15. An order that the scan driver 21 switches the scan lines may be one of an order from the upper side of the image display unit 15 to the lower side or an order from the lower side to the upper side. In addition, the scan driver 21 may perform switching of the scan lines in an arbitrary order. Furthermore, according to its usage, there are cases where two or more scan lines are simultaneously selected and driven, and switching in a combining manner.

The data driver 22 is positioned on the outer side of the image display unit 15 along the lower side of the image display unit 15. The data driver 22 outputs data voltages representing the luminance of the pixels 90 according to an image signal acquired from the FPC 14 to data lines of the image display unit 15. The data voltage is stored simultaneously in capacitors of pixels 90 aligned on one scan line.

The emission driver 23 is positioned on the outer side of the image display unit 15 along the right side of the image display unit 15. The emission driver 23 is a circuit that controls a light emission timing of each organic light emitting diode 97 disposed inside the image display unit 15.

The protection circuit 24 is positioned on the outer side of the image display unit 15 along the upper side of the image display unit 15. The protection circuit 24 is a circuit that prevents damage in the display panel due to the discharge of static electricity and the like.

Figure 2:
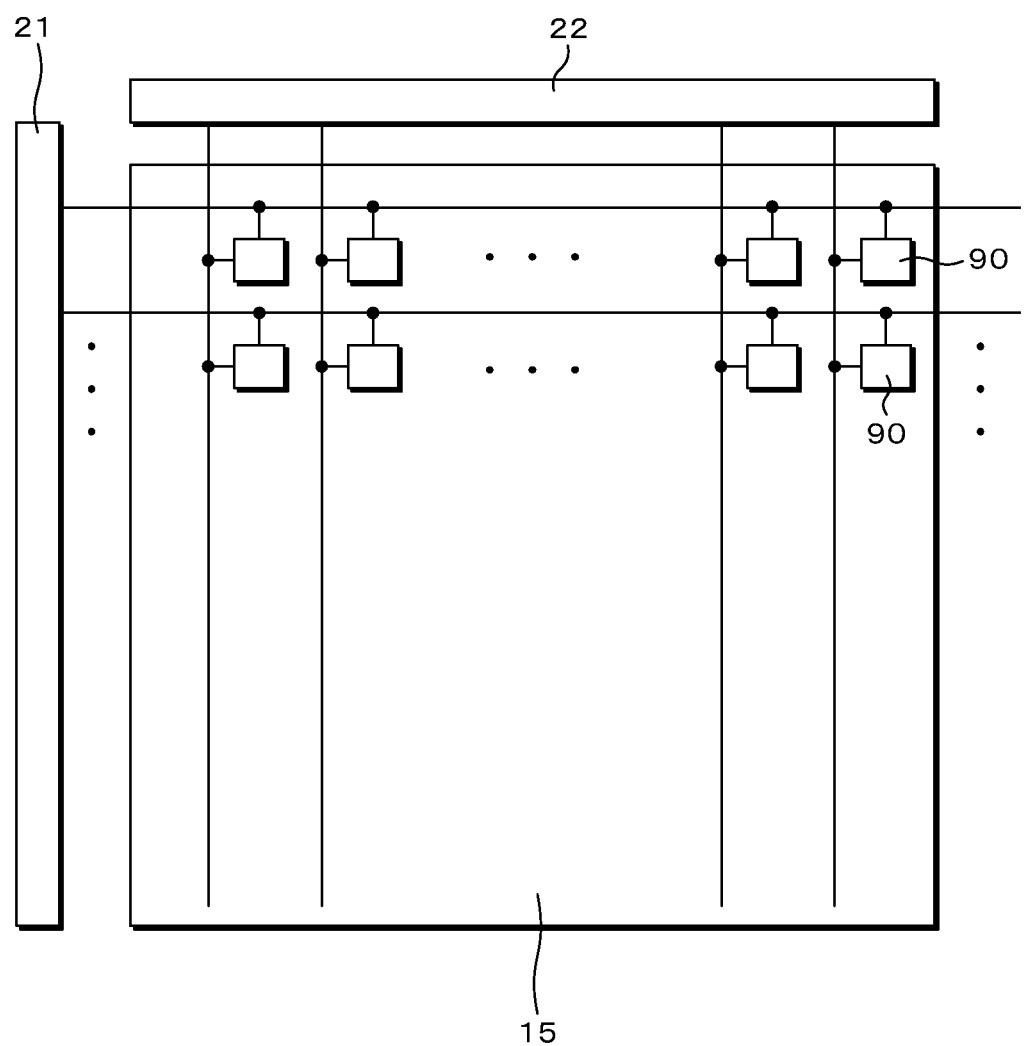
FIG. 2 is a schematic diagram that illustrates the disposition of pixels.

FIG. 2 is a schematic diagram that illustrates the disposition of the pixels 90. The pixels 90 are disposed in a matrix pattern on the image display unit 15. The scan driver 21 and the data driver 22 are positioned on the outer side of the image display unit 15. Each wiring extending from the scan driver 21 in the horizontal direction is connected to pixels 90. In addition, each wiring extending from the data driver 22 in the vertical direction is connected to pixels 90. In other words, each pixel 90 is connected to the scan driver 21 and the data driver 22.

As described above, each pixel 90 includes three subpixels 99. Signals output to each pixel 90 by the scan driver 21 and the data driver 22 are input to such three subpixels 99. The signals output to each pixel 90 by the scan driver 21 and the data driver 22 will be described later.

FIG. 3 is an equivalent circuit diagram that illustrates a circuit driving an organic light emitting diode 97. In FIG. 3, one organic light emitting diode 97 is illustrated using a graphic symbol of an OLED representing an organic light emitting diode. Each pixel 90 illustrated using a rectangle in FIG. 2 includes three circuits, one of which is illustrated in FIG. 3. In other words, each of the subpixels 99 includes one circuit illustrated in FIG. 3. The circuit illustrated in FIG. 3 is an example of the pixel circuit included in one subpixel 99.

The pixel circuit illustrated in FIG. 3 is a circuit that controls the light emission of the organic light emitting diode 97 and includes a first capacitor 91, a second capacitor 92, a switch transistor 96, and a drive transistor 98. A source electrode of the drive transistor 98 is an example of a source electrode according to this embodiment. A gate electrode of the drive transistor 98 is an example of a gate electrode according to this embodiment.

A high-power source line ELVDD, a low-power source line ELVSS, an input line Vinput, a switch line S1, and a fixed electric potential line VFIX are connected to the circuit. Here, the low-power source line is a power source line to which a voltage having a voltage value less than the voltage value of the high-power source line is supplied. The input line Vinput is connected to the data driver 22. The voltage of the input line Vinput is alternately changed to one of a reference voltage Vref (an example of a third voltage) and a data voltage. The data voltage is a voltage representing the emission luminance at the time of driving the organic light emitting diode 97. The switch line S1 is connected to the scan driver 21.

The input line Vinput is connected to a drain electrode of the switch transistor 96. The switch line S1 is connected to a gate electrode of the switch transistor 96. The high-power source line ELVDD is connected to a drain electrode of the drive transistor 98. The low-power source line ELVSS is connected to a cathode electrode of the organic light emitting diode 97. The fixed electric potential line VFIX (in other words, a first voltage line) is connected to a first terminal of the second capacitor 92. The first terminal of the second capacitor 92, for example, is a second metal plate 352 illustrated in FIG. 4. The drive transistor 98 and the switch transistor 96 according to this embodiment are N-type TFTs.

A source electrode of the switch transistor 96 is connected to a first terminal of the first capacitor 91 and a gate electrode of the drive transistor 98. The first terminal of the first capacitor 91 is connected to the gate electrode of the drive transistor 98. The source electrode of the drive transistor 98 is connected to a second terminal of the first capacitor 91, a second terminal of the second capacitor 92, and an anode electrode of the organic light emitting diode 97. The first terminal of the first capacitor 91, for example, is a first metal plate 351 illustrated in FIG. 4.

Figure 4:
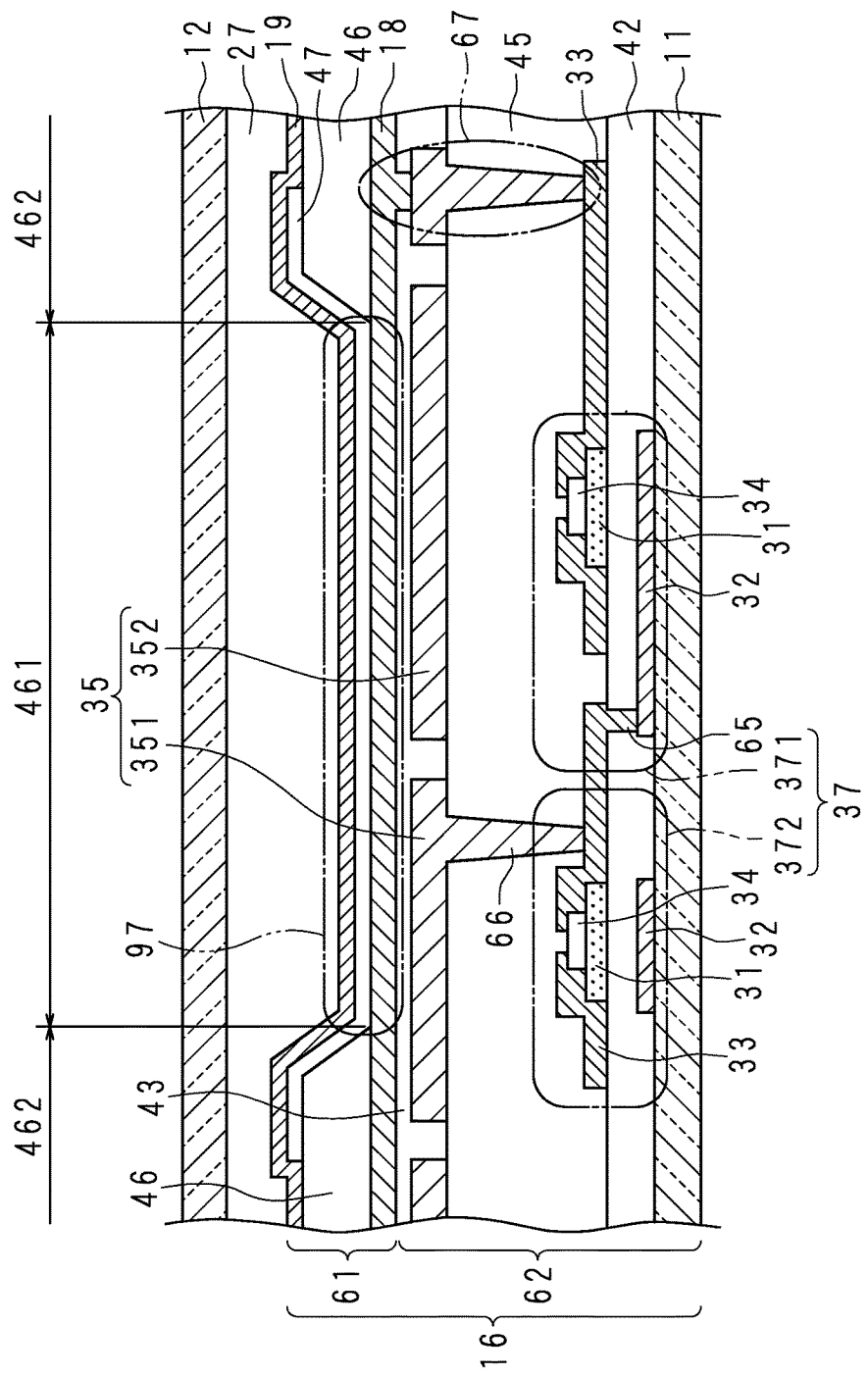
FIG. 4 is a schematic cross-sectional view of a display apparatus.

Here, a first electrode 18 (for example, then anode electrode of the organic light emitting diode 97) illustrated in FIG. 4 is used as the second terminal of the first capacitor 91 and the second terminal of the second capacitor 92.

The organic light emitting diode 97 emits light based on signals input from the switch line S1 and the input line Vinput. Details of the operations of the switch transistor 96 and the drive transistor 98 will be described later.

FIG. 4 is a schematic cross-sectional view of the display apparatus 10. FIG. 4 illustrates a part including one organic light emitting diode 97 in an enlarged scale. In description presented below, the upper side of the schematic cross-sectional view represents the front side of the display apparatus 10.

The display apparatus 10 may have a TFE encapsulation structure in which the image display unit 15 is covered with a multi-layer thin film encapsulation (TFE) lamination acquired by alternately overlapping an inorganic film and an organic film. In such a case, the display apparatus 10 does not include the second substrate 12 and the space 27.

The display substrate 16 includes a first laminated body 61 and a second laminated body 62. The first laminated body 61 includes an organic light emitting diode 97 in which a first electrode 18, an organic light emitting layer 47, and a second electrode 19 are laminated. Described in more detail, the first laminated body 61 includes a first electrode 18, a second insulating layer 46, an organic light emitting layer 47, and a second electrode 19. The first laminated body 61 is also called an OLED layer. In addition, the second laminated body 62 is also called a TFT layer or a pixel circuit layer. In the second laminated body 62, a first transistor 371, for example, corresponds to the drive transistor 98 (see FIG. 3) that controls a current supplied to the organic light emitting diode 97. In addition, in the second laminated body 62, a second transistor 372 corresponds to the switch transistor 96 (see FIG. 3) that controls the operation of the drive transistor 98. In this way, the display apparatus 10 includes a pixel circuit (see FIG. 3) disposed on the lower side of the organic light emitting diode 97. Here, the lower side represents a lower side of a drawing of FIG. 4.

The first electrode 18 is an electrode that is separate for each organic light emitting diode 97. The first electrode 18 has a planar shape. The first electrode 18, for example, is an electrode having a three-layer structure in which ITO, silver, and ITO are laminated. The first electrode 18 is the anode electrode of the organic light emitting diode 97 according to this embodiment.

The second insulating layer 46 is positioned on the first electrode 18. In the second insulating layer 46, an aperture 461 not covering the first electrode 18 is disposed. In description presented below, the insulating layer 46 from which the aperture 461 is excluded will be described as a non-aperture 462. The second insulating layer 46 is a layer made of an organic material.

The organic light emitting layer 47 is positioned in the aperture 461 and on the periphery of the aperture 461. The organic light emitting layer 47 is a layer of an organic compound that emits light when a current flows. The organic light emitting layer 47, for example, is configured by a plurality of layers such as a hole injection layer (HIL)/a hole transport layer (HTL)/an EL/an electron transport layer (ETL)/an electron injection layer (EIL). Here, "/" represents laminating of layers before and after the sign. The second electrode 19 is positioned on the organic light emitting layer 47 and the second insulating layer 46.

The second laminated body 62 includes a first substrate 11, a gate 32 (also called a gate part 32 or a gate electrode 32), a third insulating layer 42, a semiconductor part 31, a source drain 33 (also called a source drain part 33, or a source drain electrode 33), an etching stop part 34, a planarization layer 45, a metal plate layer 35, and a first insulating layer 43. The first substrate 11, for example, is a rectangular glass substrate. The first substrate 11, for example, may be a flexible substrate.

The gate 32 is positioned on the first substrate 11. The gate 32 partly covers the first substrate 11. The gate 32 has a predetermined shape to be described later. The material of the gate 32, for example, is pure meal such as molybdenum or aluminum. The material of the gate 32, for example, may be molybdenum/aluminum, titanium/aluminum/titanium, ITO, or an alloy thereof. Here, "/" represents both a layered body of metals before and after the sign and an alloy of the metals before and after the sign. The gate 32 may be a layered body of a pure metal and an alloy. The materials listed here are examples, and the material of the gate 32 is not limited to the materials listed here.

The third insulating layer 42 covers the whole faces of the gate 32 and the first substrate 11 not covered with the gate 32. The third insulating layer 42, for example, is a layer made of an insulating material such as silicon oxide.

The semiconductor part 31 is positioned on the third insulating layer 42. The semiconductor part 31 partly covers the third insulating layer 42. The semiconductor part 31 has a predetermined shape to be described later. The semiconductor part 31, for example, is a layer made of a semiconductor such as an oxide semiconductor. The oxide semiconductor, for example, is InGaZnO.

The etching stop part 34 is positioned on the semiconductor part 31. Although not illustrated in the cross-section illustrated in FIG. 4, the etching stop part 34 is positioned also on the third insulating layer 42 disposed on the periphery of the semiconductor part 31. The etching stop part 34 partly covers the semiconductor part 31 and the third insulating layer 42. The etching stop part 34 has a predetermined shape to be described later. The etching stop part 34, for example, is a layer made of silicon oxide.

The source drain 33 is positioned on the etching stop part 34, the semiconductor part 31 not covered with the etching stop part 34, and the third insulating layer 42 not covered with the semiconductor part 31 or the etching stop part 34. The source drain 33 partly covers the etching stop part 34, the semiconductor part 31, and the third insulating layer 42. The source drain 33 has a predetermined shape to be described later.

The source drain 33 of the second transistor 372 and the gate 32 of the first transistor 371 are connected through a first conduction part 65.

The source drain 33 is made of a conductor. The material of the source drain 33, for example, is a pure metal such as molybdenum or aluminum. The material of the source drain 33 may be molybdenum/aluminum, titanium/aluminum/titanium, ITO, or an alloy thereof. The source drain 33 may be a layered body of a pure metal and an alloy. The materials listed here are examples, and the material of the source drain 33 is not limited to the materials listed here.

The material of the source drain 33 may be different from the material of the gate 32. Alternatively, the material of the source drain 33 may be the same as the material of the gate 32.

The planarization layer 45 covers the whole faces of the source drain 33, the etching stop part 34 not covered with the source drain 33, and the third insulating layer 42 not covered with the etching stop part 34 or the source drain 33. Between the planarization layer 45 and the source drain 33, the etching stop part 34 and the third insulating layer 42, an inorganic insulating layer not illustrated in the drawing is interposed.

The planarization layer 45 is a layer made of an organic material. The material of the planarization layer 45, for example, is a photosensitive acrylic resin. The material of the inorganic insulating layer, for example, is SiNx, SiOx, or SiNx/SiOx.

The metal plate layer 35 is positioned on the planarization layer 45. The metal plate layer 35 includes a first metal plate 351 and a second metal plate 352. In other words, the metal plate layer 35 is not a layer covering the whole face of the planarization layer 45 but a layer partly covering the planarization layer 45. And there is the slit space between the first metal plate and the second metal plate. Thus, the planarization layer 45 includes both a part on which the metal plate layer 35 is positioned and a part on which the metal plate layer is not positioned. The shape of the metal plate layer 35 will be described later.

The first metal plate 351 is connected to the source drain 33 of the second transistor 372 through a second conduction part 66. Accordingly, the first metal plate 351 is connected to the gate 32 of the first transistor 371 through the second conduction part 66, the source drain 33 of the second transistor 372, and the first conduction part 65. In other words, the first metal plate 351 and the gate 32 of the first transistor 371 are connected together.

The thickness of the metal plate layer 35, for example, is about 100 nanometers to 300 nanometers. The total area of the metal plate layer 35 is slightly smaller than the total area of the first electrode 18. The area of the second metal plate 352 is preferably larger than the area of the first metal plate 351. The reason for this will be described later.

The metal plate layer 35, for example, is a plate made of a pure metal such as molybdenum or aluminum. The metal plate layer 35, for example, may be a plate made of molybdenum/aluminum, titanium/aluminum/titanium, ITO, or an alloy thereof. The metal plate layer 35 may be a plate of a layered body of a pure metal and an alloy. The materials listed here are examples, and the material of the metal plate layer 35 is not limited to the materials listed here.

As described above, the first metal plate 351 and the second metal plate 352 of the display apparatus 10 are arranged in a same layer. In other words, the first metal plate 351 and the second metal plate 352 are arranged on the same plane surface (for example, the front face of the planarization layer 45).

The first insulating layer 43 covers the whole front faces of the metal plate layer 35 and the planarization layer 45 not covered with the metal plate layer 35. Therefore, the same first insulating layer is disposed on the first metal plate and the second metal plate, and cover the slit space between the first metal plate and the second metal plate. The thickness of the first insulating layer 43, for example, is about 100 nanometers to 300 nanometers. The thickness of the first insulating layer 43 disposed on the upper side of the first metal plate 351 is equal to the thickness of the first insulating layer 43 disposed on the upper side of the second metal plate 352. The first insulating layer 43, for example, is a layer made of silicon nitride.

The first electrode 18 is positioned on the first insulating layer 43. The first electrode 18 partly covers the first insulating layer 43. The first electrode 18 has a predetermined shape to be described later. A distance between the first electrode 18 and the first metal plate 351 is equal to the thickness of the first insulating layer 43 disposed between the first electrode 18 and the first metal plate 351. A distance between the first electrode 18 and the second metal plate 352 is equal to the thickness of the first insulating layer 43 disposed between the first electrode 18 and the second metal plate 352. Accordingly, the distance between the first electrode 18 and the first metal plate 351 is equal to the distance between the first electrode 18 and the second metal plate 352.

As described above, on the upper side of the first electrode 18, the organic light emitting layer 47 is positioned. The first metal plate 351 and the second metal plate 352 face (also referred to as opposes) the organic light emitting layer 47 across the first insulating layer 43 and the first electrode 18.

As described above, the first insulating layer 43 is disposed between the first electrode 18 and both the first metal plate 351 and the second metal plate 352. In other words, the display apparatus 10 includes the same first insulating layer 43 between the first metal plate 351 and the first electrode 18, and between the second metal plate 352 and the first electrode 18. In addition, a distance between the first metal plate 351 and the first electrode 18 is equal to a distance between the second metal plate 352 and the first electrode 18.

The first metal plate 351 and the second metal plate 352 are disposed to face (also referred to as oppose) the organic light emitting layer 47 across the first electrode 18 in the first laminated body 61. The second insulating layer 46 is disposed on a layer different from a layer in which the first metal plate 351 and the second metal plate 352 are disposed. Although not illustrated in FIG. 4, as described with reference to FIG. 3, the second metal plate 352 is connected to a first voltage line (for example, the fixed electric potential line VFIX). The first metal plate 351 and the second metal plate 352 are in an electrically non-contact state (in other words, an insulated state).

The first electrode 18 and the source drain 33 are interconnected through a third conduction part 67. The third conduction part 67 has a structure in which a conductor connecting the first electrode 18 and the first metal plate 351 is connected on the second conduction part 66 connecting the first metal plate 351 and the source drain 33. The source drain 33 connected to the third conduction part 67 functions as a source electrode according to this embodiment.

The semiconductor part 31, the gate 32, and the source drain 33 form a transistor 37. The transistor 37 illustrated in FIG. 4 is a schematic diagram for the purpose of description of an overview of the structure of the display apparatus 10. The transistor 37 includes the first transistor 371 and the second transistor 372. The source electrode and the gate electrode described above, for example, are the source electrode and the gate electrode of the drive transistor 98.

As described above, in the second laminated body 62, the first transistor 371 controlling a current supplied to the organic light emitting diode 97 is disposed. The first metal plate 351 is connected to the gate electrode of the first transistor 371 through the second conduction part 66, the source drain 33 of the second transistor 372 and the first conduction part 65. The second laminated body 62 includes a source electrode (also referred to as a first transistor electrode) of the first transistor 371 connected to the first electrode 18 through the third conduction part 67.

Figure 5:
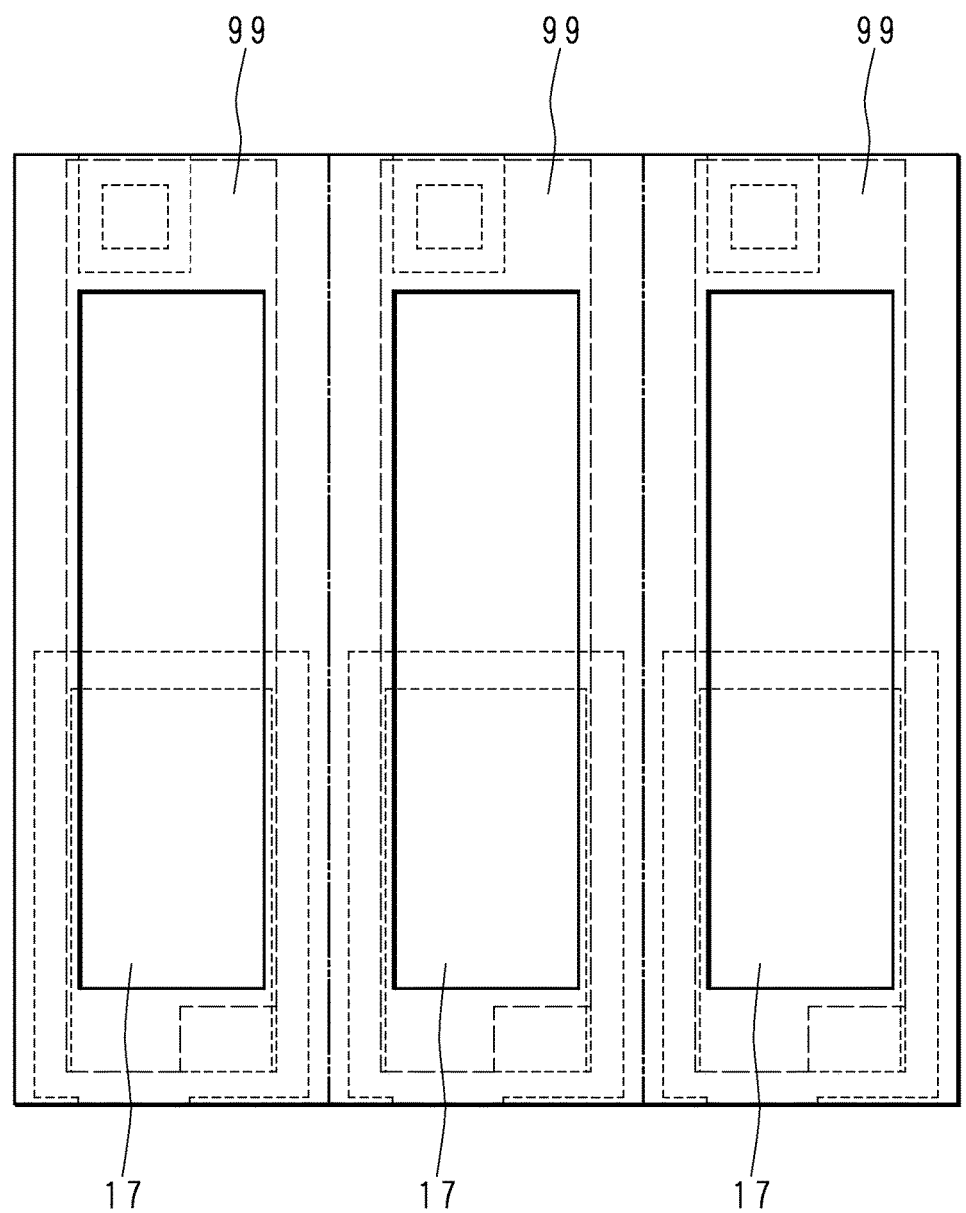
FIG. 5 is a schematic plan view of a pixel.

FIG. 5 is a schematic plan view of the pixel 90. The pixels 90 are disposed in a matrix pattern on the image display unit 15. In a display apparatus 10 for color display, for example, the color of one pixel included in an image signal is represented by combining the emission luminance of organic light emitting diodes 97 of three colors including red, green, and blue. Thus, a part including the organic light emitting diode 97 of one color is referred to as a subpixel 99, and a set of three subpixels 99 is referred to as a pixel 90.

The subpixels 99 of the colors are the same except for the emission colors. Each subpixel 99 has a rectangular shape. The subpixel 99 includes a light emitting part 17 of a quadrangular shape (also called a quadrilateral).

Figure 6:
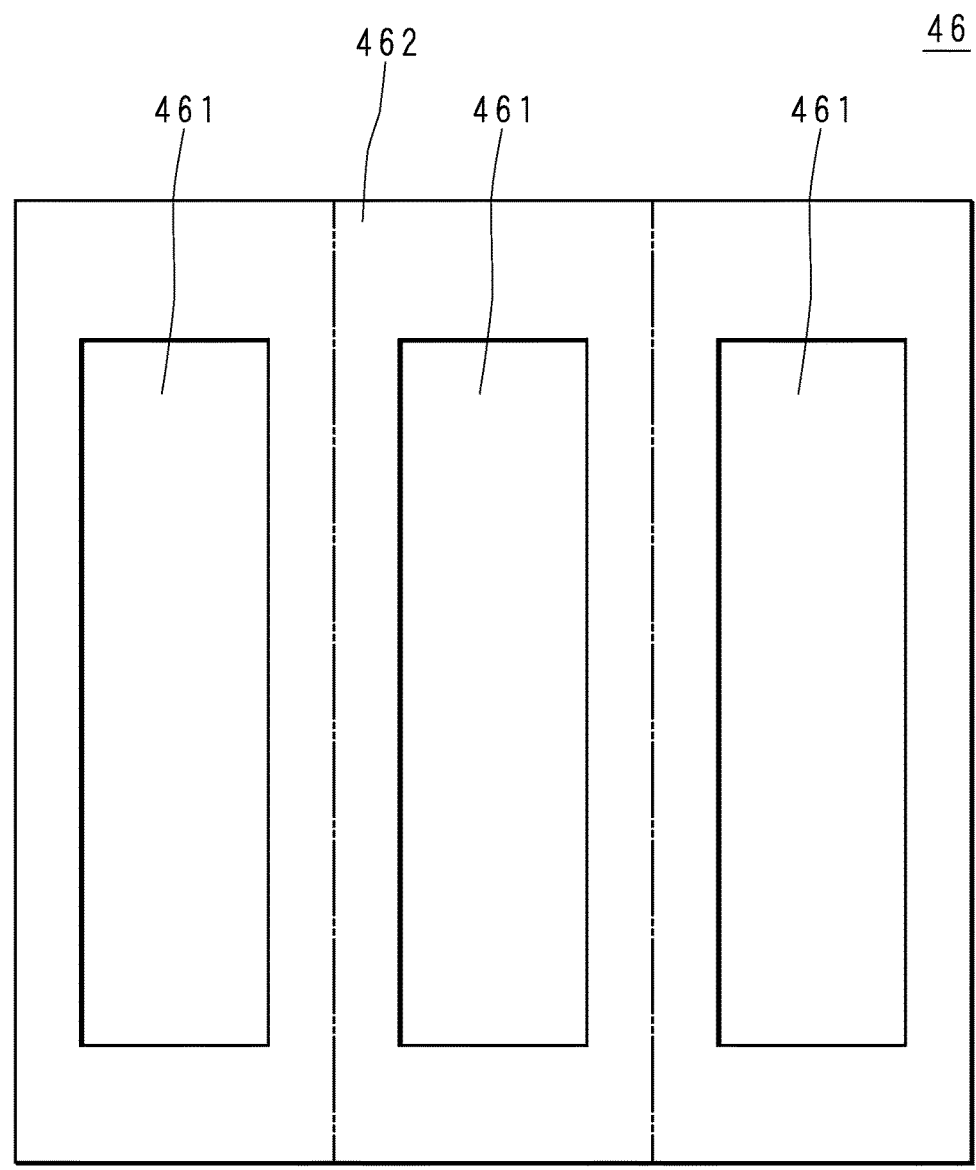
FIG. 6 is a schematic plan view of a second insulating layer.

FIGS. 6 to 9 to be described below represent a same range as that illustrated in FIG. 5. FIG. 6 is a schematic plan view of the second insulating layer 46. The second insulating layer 46 has a planar shape. An aperture 461 disposed in the second insulating layer 46 has a rectangular shape. Non-aperture 462 of the subpixels 99 are connected together.

Figure 7:
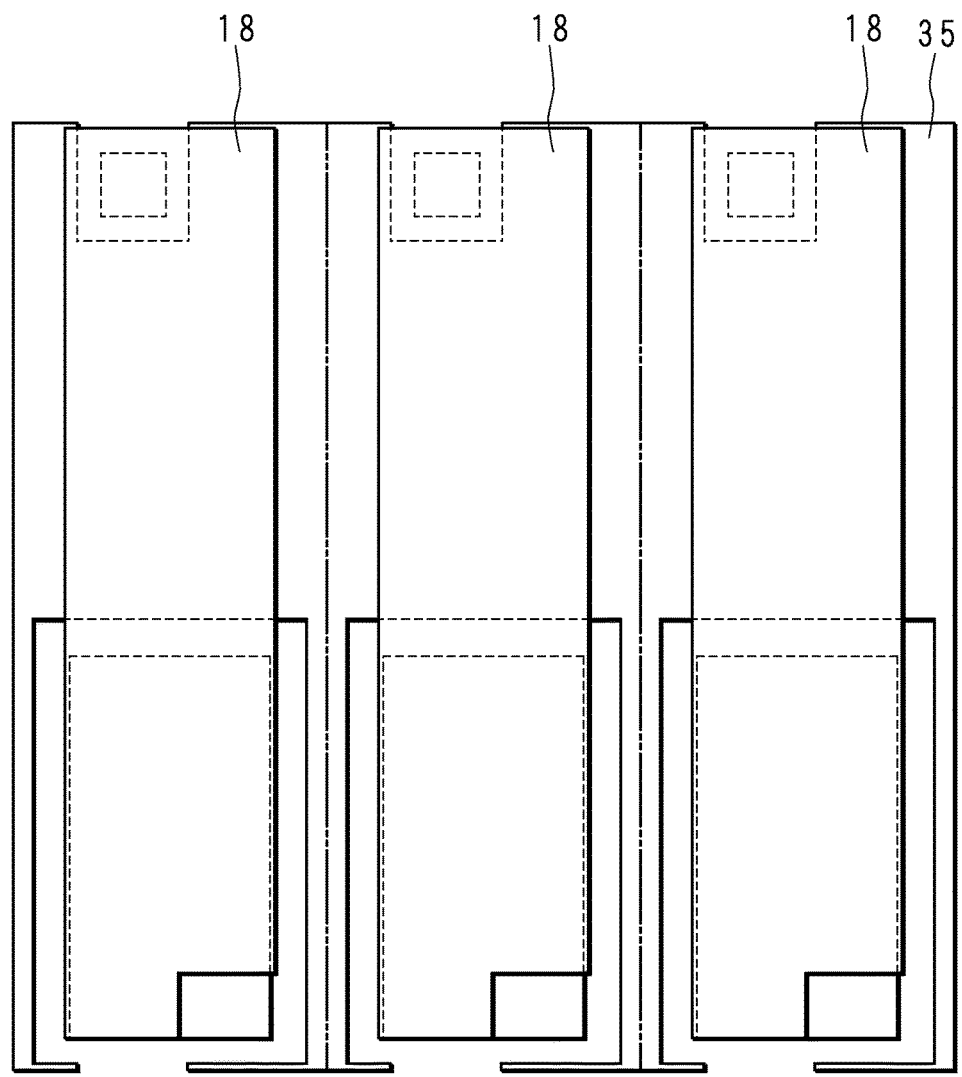
FIG. 7 is a schematic plan view of a pixel that the second insulating layer is removed.

FIG. 7 is a schematic plan view of the pixel 90 from which the second insulating layer 46 is removed. FIG. 7 illustrates the first electrode 18 and the metal plate layer 35.

FIG. 8 is a schematic plan view of the first electrode 18. The first electrode 18 has an "L" shape. One subpixel 99 includes one first electrode 18. The first electrode 18 is larger than the aperture 461. In other words, below the aperture 461, the first electrode 18 is positioned.

Figure 9:
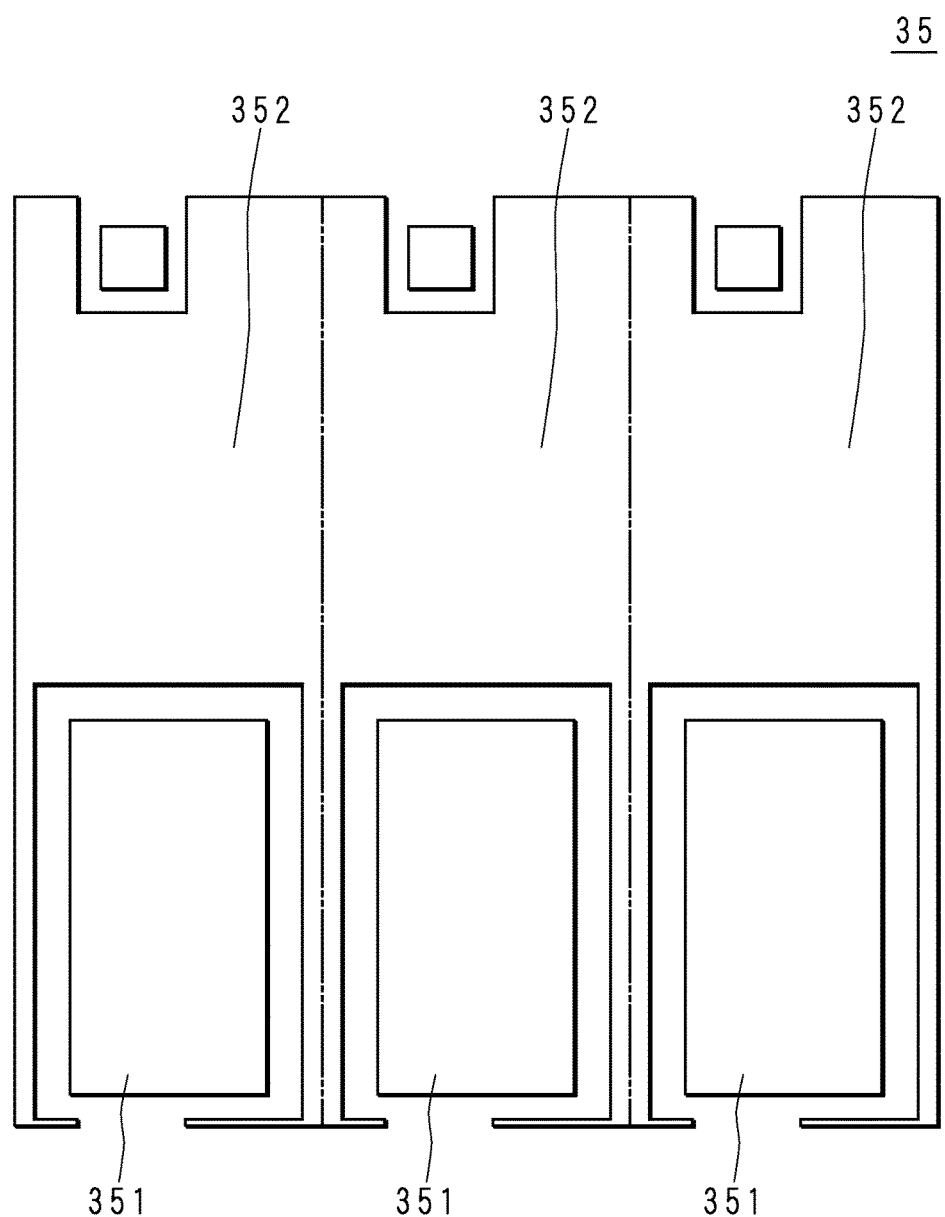
FIG. 9 is a schematic plan view of a metal plate layer.

FIG. 9 is a schematic plan view of the metal plate layer 35. The metal plate layer 35 includes a first metal plate 351 having a rectangular shape and a second metal plate 352 not connected to the first metal plate 351. One subpixel 99 includes one first metal plate 351. The second metal plates 352 of subpixels 99 are connected together.

The description of the structure of the display apparatus 10 will be continued with reference to FIGS. 4 to 9.

The light emitting part 17 will be described. The first transistor 371 controls a current supplied to the organic light emitting diode 97. The current flows from the first electrode 18 to the second electrode 19. In other words, holes from the first electrode 18 side and electrons from the second electrode 19 side enter the inside of the organic light emitting layer 47.

Inside the organic light emitting layer 47, when excitons generated according to recombination of holes and electrons are returned to a ground state, light is generated. In other words, the organic light emitting layer 47 emits light according to a current flowing between the first electrode 18 and the second electrode 19.

The second insulating layer 46 will be described. The second insulating layer 46 has two roles including a role of preventing a mixed color of the organic light emitting layer 47 and a role of eliminating an unnecessary light emitting area. The role of preventing a mixed color will be described. Inside one aperture 461 of the second insulating layer 46, the organic light emitting layer 47 of one color is positioned. While there are cases where the range of formation of the organic light emitting layer 47 deviates due to an error of a manufacturing apparatus or the like, the deviation remains in a range covered with the non-aperture 462, and another adjacent aperture 461 is not covered with the organic light emitting layer 47. In this way, since the non-aperture 462 is positioned in each boundary part between the colors, the second insulating layer 46 achieves the role of preventing a mixed color.

The role of eliminating an unnecessary light emitting area will be described. In a part in which the second insulating layer 46 is interposed between the first electrode 18 and the organic light emitting layer 47, the first electrode 18 and the organic light emitting layer 47 are insulated from each other by the second insulating layer 46, and thus a current does not flow. For this reason, the organic light emitting layer 47 does not emit light. Accordingly, the light emitting part 17 that actually emits light in the organic light emitting layer 47 is a part of the organic light emitting layer 47 that corresponds to the aperture 461. In this way, by disturbing the light emission of the organic light emitting layer 47 in the non-aperture 462, the second insulating layer 46 achieves the role of eliminating an unnecessary light emitting area.

As described above, the display apparatus 10 includes the second insulating layer 46 having the planar shape that includes the aperture 461 outputting the light emission of the organic light emitting diode 97 to the outside and the non-aperture 462 that is not open.

The formation of a capacitor using the metal plate layer 35 and the first electrode 18 will be described. The first metal plate 351 faces (opposes) the first electrode 18 through the first insulating layer 43. The first metal plate 351, the first insulating layer 43, and the first electrode 18 form the first capacitor 91 (see FIG. 3). The capacitance of the first capacitor 91 is determined based on an area in which the first metal plate 351 and the first electrode 18 face each other and a thickness and a dielectric constant of the first insulating layer 43.

Similarly, the second metal plate 352, the first insulating layer 43, and the first electrode 18 form the second capacitor 92 (see FIG. 3). The capacitance of the second capacitor 92 is determined based on an area in which the second metal plate 352 and the first electrode 18 face each other and a thickness and a dielectric constant of the first insulating layer 43. The first capacitor 91 and the second capacitor 92 are connected in series through the first electrode 18. As described above, the first electrode 18 is connected to the source drain 33 through the third conduction part 67. The third conduction part 67 is positioned below the non-aperture 462.

As described above, the first capacitor 91 includes the first electrode 18, the first insulating layer 43, and the first metal plate 351. In addition, the second capacitor 92 includes the first electrode 18, the first insulating layer 43, and the second metal plate 352. The first capacitor 91 and the second capacitor 92 are connected in series. A connection point between the first capacitor 91 and the second capacitor 92 is connected to the source electrode. The first electrode 18 is connected to the source electrode. The connection point the first electrode 18 and the source electrode is covered with the non-aperture 462.

The operations of the first capacitor 91 and the second capacitor 92 will be described. In a case where the organic light emitting diode 97 emits light, between the anode electrode and the cathode electrode of the organic light emitting diode 97, a drive current Ioled (see FIG. 3) flows. The drive current Ioled is equal to an output current IMD flowing between the source electrode of the drive transistor 98 and the drain electrode of the drive transistor 98. The output current IMD will be described later. The drive current Ioled can be acquired by Equation (1). A method of deriving Equation (1) will be described in Embodiment 2.

$$Ioled = IMD = \frac{1}{2}\beta\left[\frac{C2}{(C2+C1)}(Vdata \cdot Vref)\right]^2 \quad (1)$$

$$\beta = \mu Cox \frac{W}{L} \quad (2)$$

Here, Ioled (IMD) is a drive current flowing between the anode electrode and the cathode electrode of the organic light emitting diode 97.

β is a gain coefficient.

C1 is the capacitance of the first capacitor 91.

C2 is the capacitance of the second capacitor 92.

Vdata is a data voltage representing the emission luminance at the time of causing the organic light emitting diode 97 to emit light.

Vref is a reference voltage.

μ is carrier mobility.

Cox is unitary capacitance.

W is a channel width of the drive transistor 98.

L is a channel length of the drive transistor 98.

Based on Equation (1), the current Ioled flowing through the organic light emitting diode 97 is not influenced by characteristics (for example, a threshold voltage) of the drive transistor 98. Based on Equation (1), it can be understood that a variation in the drive current Ioled can be suppressed by decreasing a variation between the capacitance C1 of the first capacitor 91 and the capacitance C2 of the second capacitor 92. By suppressing a variation in the drive current Ioled, the luminance uniformity of the display apparatus 10 can be improved.

Variations in the thickness and the dielectric constant of the first insulating layer 43 inside each subpixel 99, for example, can be decreased by generating the first insulating layer 43 by using chemical vapor deposition (CVD). In addition, a variation in the area of the first metal plate 351 and a variation in the area of the second metal plate 352 inside each subpixel 99 can be decreased by simultaneously generating the first metal plate 351 and the second metal plate 352 by using a photolithography method. Details of the method of manufacturing the display apparatus 10 according to this embodiment will be described later.

By decreasing a variation in the area between the first metal plate 351 and the second metal plate 352 and a variation in the ratio between areas thereof inside each subpixel 99, a variation between the capacitance C1 of the first capacitor 91 and the capacitance C2 of the second capacitor 92 of each subpixel 99 can be decreased. The reason for this will be described below.

Figure 10:
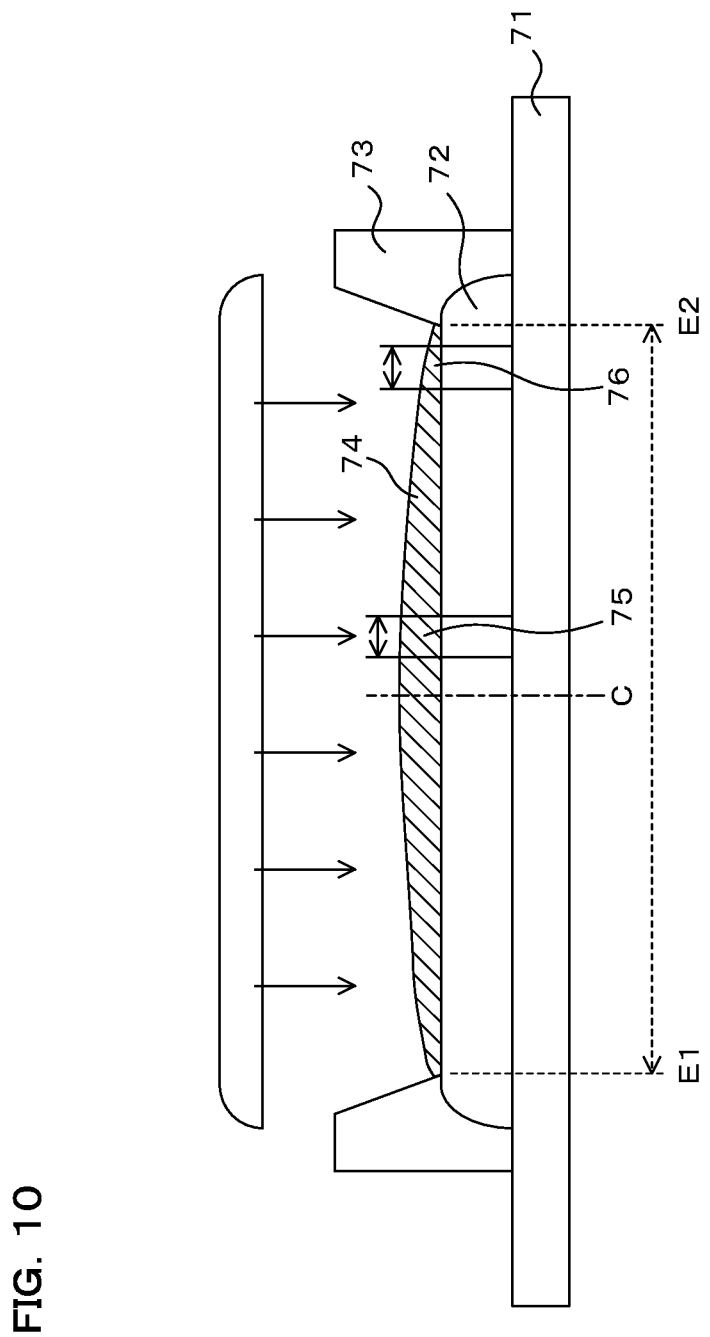
FIG. 10 is a schematic diagram that illustrates a method of generating an insulating film.

FIG. 10 is a schematic diagram that illustrates a method of generating an insulating film 74. The insulating film 74, for example, is used as the first insulating layer 43. A mounting stand 71 is a stand on which a substrate 72 is placed. A substrate fixing part 73 fixes the substrate 72 to the mounting stand 71. The substrate 72 is also called a mother board 72, and the substrate fixing part 73 is also called a substrate presser 73.

Hereinafter, a case will be described as an example in which the insulating film 74 having a uniform thickness is generated on the substrate 72 having a flat plate shape.

A manufacturing apparatus supplies a gas raw material and deposits the insulating film 74 on one face of the substrate 72. In FIG. 10, reference sign C represents the center of the insulating film 74. In addition, in FIG. 10, reference signs E1 and E2 represent the ends of the range of the formation of the insulating film 74. The substrate 72 is a flat plate of a size that can be divided into a plurality of first substrates 11 by dividing the substrate 72. The insulating film 74 disposed on the outer sides of the first end E1 and the second end E2 is not used. In description presented below, the insulating film 74 of a size corresponding to one first substrate 11 will be described as a unitary insulating film 75. This one first substrate 11, for example, is one display panel mounted in one display apparatus 10 (see FIG. 1). A unitary insulating film disposed on the second end E2 side will be described as a unitary insulating film 76.

Figure 11:
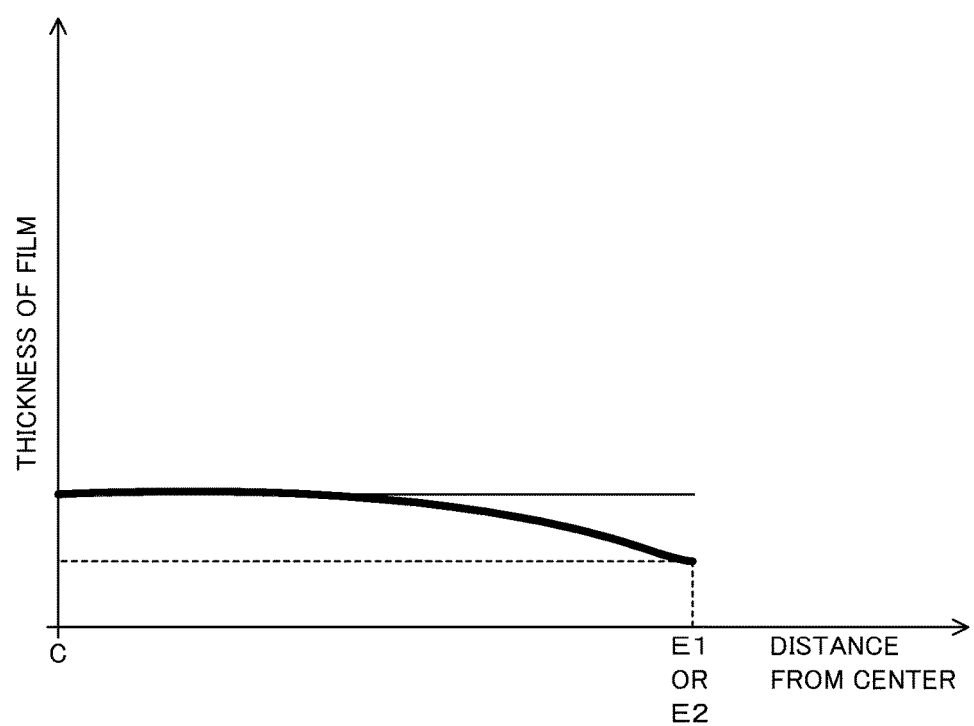
FIG. 11 is a graph that illustrates thickness unevenness of an insulating film.

FIG. 11 is a graph that illustrates thickness unevenness of the insulating film 74. The graph illustrated in FIG. 11 is an example. In FIG. 11, the horizontal axis represents the distance from the center C of the insulating film 74. In FIG. 11, the vertical axis represents the thickness of the insulating film 74. A thin solid line represents the thickness of an ideal insulating film 74. A thick curve represents the thickness of an insulating film 74 that is actually produced.

As illustrated using the thin solid line in FIG. 11, it is ideal for the insulating film 74 to have a same thickness from the center C to the first end E1 and the second end E2. However, actually, when the position approaches the first end E1 or the second end E2 from the center C, the insulating film 74 becomes thin.

In addition, the graph illustrated in FIG. 11 is a conceptual diagram that illustrates thickness unevenness of the insulating film 74. The shape of the graph illustrated in FIG. 11 is different depending on the model, the settings, and the like of the manufacturing apparatus. Generally, there are cases where the thickness of the insulating film 74 diverges from an ideal film thickness as the part thereof becomes far from the center C of the substrate 72. In other words, there are cases where the thickness of the insulating film 74 is different from the ideal film thickness although slightly.

Figure 12:
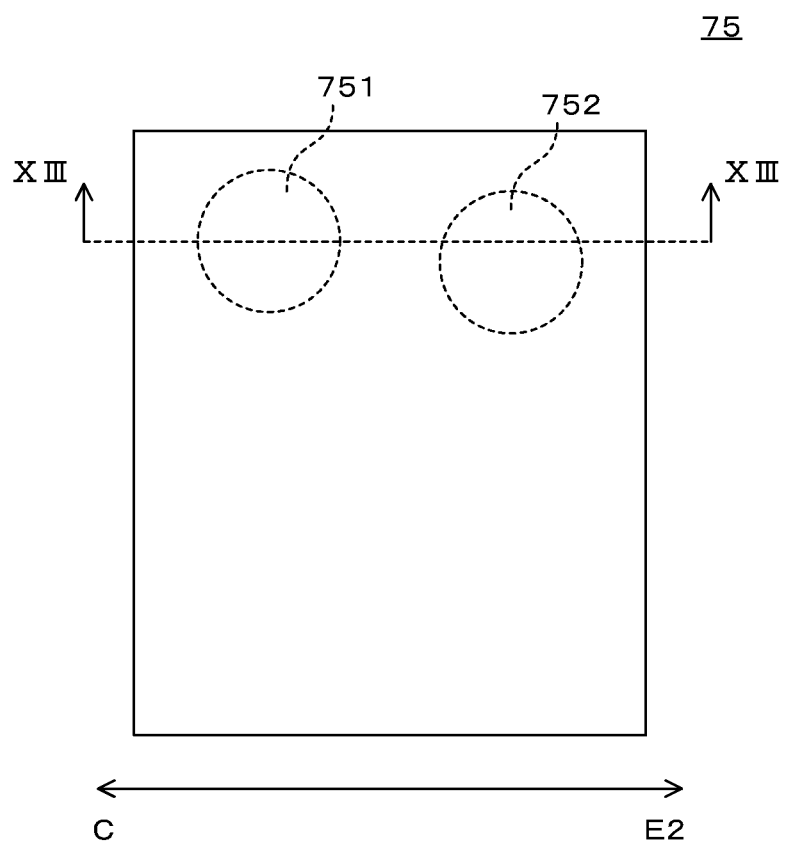
FIG. 12 is a plan view of a unitary insulating film.
Figure 13:
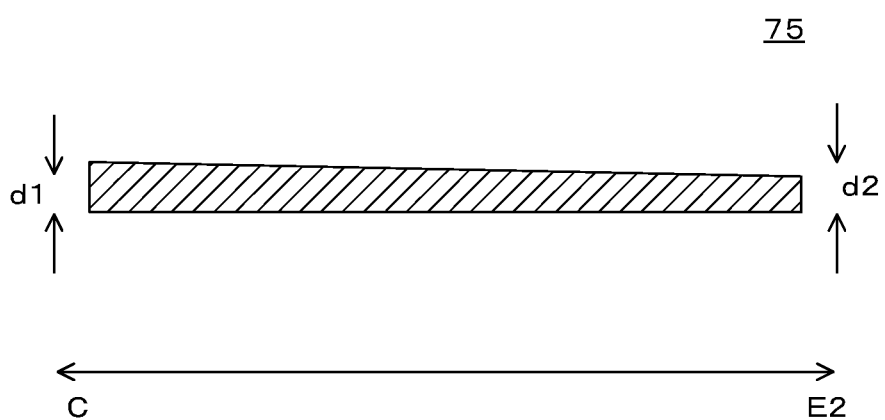
FIG. 13 is a cross-sectional view of a unitary insulating film.

FIG. 12 is a plan view of the unitary insulating film 75. FIG. 13 is a cross-sectional view of the unitary insulating film 75. In FIGS. 12 and 13, the left side represents the center C side, and the right side represents the second end E2 side.

A thickness of the unitary insulating film 75 of the first area 751 is assumed to be d1. In addition, the thickness of the unitary insulating film 75 of the second area 752 is assumed to be d2. A case will be described as an example in which the film thickness d1 is the ideal film thickness of the unitary insulating film 75. For the description, in FIG. 12 the first area 751 and the second area 752 are illustrated in an enlarged scale. The area of each of the first area 751 and the second area 752 is a pixel area of multiple subpixels 99 (for example, vertical 100 pixels×horizontal 100 pixels). Inside the first area 751 and inside the second area 752, the thickness of the unitary insulating film 75 is assumed to be constant.

A case will be described as an example in which the unitary insulating film 75 is used as the first insulating layer 43 (see FIG. 4). In a calculation equation (see Equation (1)) for calculating the drive current of one subpixel 99 disposed inside the first area 751, C2/(C2+C1) included in this calculation equation can be represented by Equation (3).

$$\frac{C2}{C2+C1} = \frac{\varepsilon \frac{A2}{d1}}{\varepsilon \frac{A2}{d1} + \varepsilon \frac{A1}{d1}} = \frac{A2}{A2+A1} \quad (3)$$

C1 is the capacitance of the first capacitor 91.

C2 is the capacitance of the second capacitor 92.

A1 is the area of the first metal plate 351.

A2 is the area of the second metal plate 352.

∈ is a dielectric constant of the unitary insulating film 75.

d1 is the thickness of the unitary insulating film 75 inside the first area 751.

As is apparent from Equation (3), the thickness d1 of the unitary insulating film 75 inside the first area 751 is cancelled, and C2/(C2+C1) is equal to the value of A2/(A2+A1).

On the other hand, in the calculation equation (see Equation (1)) for calculating the drive current of one subpixel 99 disposed inside the second area 752, C2/(C2+C1) included in this calculation equation can be represented by Equation (4).

$$\frac{C2}{C2+C1} = \frac{\varepsilon\frac{A2}{d2}}{\varepsilon\frac{A2}{d2}+\varepsilon\frac{A1}{d2}} = \frac{A2}{A2+A1} \quad (4)$$

Here, d2 is the thickness of the unitary insulating film 75 disposed inside the second area 752.

As is apparent from Equation (4), the thickness d2 of the unitary insulating film 75 disposed inside the second area 752 is cancelled, and C2/(C2+C1) has a same value as that of A2/(A2+A1).

As described above, in the second area 752, the thickness d2 of the unitary insulating film 75 is different from the ideal thickness d1. However, among the capacitance C1, the capacitance C2, the area A1, and the area A2, the same relational equation as that of the first area 751 is satisfied.

Accordingly, by decreasing a variation in the area A1 of the first metal plate 351 and the area A2 of the second metal plate 352 and a variation in the ratio between the areas, a variation in C2/(C2+C1) of each subpixel 99 can be decreased.

In other words, according to this embodiment, Equation (3) becomes Equation (4), and a variation in the film thickness can be cancelled. Then, by configuring the data voltage Vdata and the reference voltage Vref to be equal by precisely regulating the area A1 of the first metal plate 351 and the area A2 of the second metal plate 352, the drive current of each subpixel 99 of the first area 751 and the drive current of each subpixel 99 of the second area 752 become substantially to be equal. As a result, a variation in the emission luminance can be suppressed. For example, in a case where the emission luminance of each subpixel 99 of the first area 751 and the emission luminance of each subpixel 99 of the second area 752 are controlled so as to be equal, a variation in the emission luminance can be further suppressed, and accordingly, it is difficult for luminance unevenness to occur.

A comparative example will be described. In the comparative example, a capacitor corresponding to the first capacitor 91 illustrated in FIG. 3 is a first capacitor X, and a capacitor corresponding to the second capacitor 92 illustrated in FIG. 3 is a second capacitor Y. In the comparative example, a case will be assumed in which an insulating layer of the first capacitor X, and an insulating layer of the second capacitor Y are generated in mutually-different layers through different processes. In the comparative example, for example, the insulating layer of the first capacitor X is generated in a layer including TFTs such as drive TFTs, and the insulating layer of the second capacitor Y is generated in an OLED layer.

In addition, a case will be described as an example in which the materials of the insulating layer of the first capacitor X and the insulating layer of the second capacitor Y are the same, and the dielectric constants ε are the same.

The insulating layer of the first capacitor X, similar to the case illustrated in FIG. 13, is assumed to have an ideal film thickness d1 in the first area 751 and have a film thickness d2 different from the ideal film thickness d1 in the second area 752. A case will be described as an example in which the insulating layer of the second capacitor Y has the ideal film thickness d1 in the first area 751 and has a film thickness d2' different from the ideal film thickness d1 in the second area 752. Here, d2 and d2' are assumed to be different from each other.

In a subpixel disposed inside the first area 751 according to the comparative example, both the thicknesses of the insulating films forming the two capacitors are d1, and thus, the relation represented in Equation (3) is satisfied. Meanwhile, the capacitance C1 of the first capacitor X and the capacitance C2 of the second capacitor Y of a subpixel inside the second area 752 according to the comparative example can be represented using Equation (5).

$$\frac{C2}{C2+C1} = \frac{\varepsilon\frac{A2}{d2'}}{\varepsilon\frac{A2}{d2'}+\varepsilon\frac{A1}{d2}} = \frac{\frac{A2}{d2'}}{\frac{A2}{d2'}+\frac{A1}{d2}} \quad (5)$$

In this way, in the comparative example in which the insulating layer of the first capacitor X and the insulating layer of the second capacitor Y are generated through different processes, in order to control the value of C2/(C2+C1) of each subpixel by using the area A1 of the first metal plate 351 and the area A2 of the second metal plate 352 inside each subpixel 99, there is a difficulty that the thicknesses d2 and d2' are configured to be equal, in other words, a difficulty in manufacturing the insulating layer of the first capacitor X and the insulating layer of the second capacitor Y to have a same film thickness distribution.

In other words, in a case where Equation (3) and Equation (5) are not the same, even in a case where the data voltage Vdata and the reference voltage Vref are equal, a drive current of each subpixel of the first area 751 according to the comparative example and a drive current of each subpixel of the second area 752 according to the comparative example are different from each other. As a result, there are cases where the emission luminance varies even in a case where the emission luminance of each subpixel of the first area 751 according to the comparative example and the emission luminance of each subpixel of the second area 752 according to the comparative example are controlled so as to be the same.

In the description presented above, while the unitary insulating film 75 has been described, the same description is applied also to the other unitary insulating film (for example, the unitary insulating film 76).

To sum up, according to this embodiment, by decreasing a variation in the area and a variation in the area ratio between the first metal plate 351 and the second metal plate 352 inside each subpixel 99, a variation in the capacitance C1 of the first capacitor 91 and the capacitance C2 of the second capacitor 92 of each subpixel 99 can be decreased. In other words, according to this embodiment, also in a case where a variation in the film thickness of the insulating layer occurs, the variation in the film thickness can be cancelled. On the other hand, in the comparative example, the same effect is not acquired.

As above, according to the configuration of this embodiment, a variation in C2/(C2+C1) of each subpixel 99 can be decreased. For this reason, according to the configuration of this embodiment, a display apparatus 10 having decreased luminance unevenness can be provided.

The technical significance of this embodiment will be described.

The luminance unevenness of the display apparatus 10 may be suppressed, by controlling the drive current Ioled of the organic light emitting diode 97 precisely. As described above, the drive transistor 98 controls the drive current Ioled. However, a variation may easily occur in the characteristics of the drive transistor 98. For this reason, for example, also in a case where a plurality of subpixels 99 is caused to illuminate with the same luminance, a variation in the drive current Ioled among the subpixels 99 occurs. According to such a variation, luminance unevenness occurs.

In Japanese Patent Application Laid-Open No. 2014-163991, in order to prevent luminance unevenness due to characteristics of a drive transistor 98, particularly, variations in the threshold voltage, a pixel circuit including a plurality of capacitors is proposed. In this pixel circuit, in a case where there is a variation in the capacitance values thereof, contrarily, the variation causes luminance unevenness.

In a case where two capacitors are formed in mutually-different layers, a plurality of capacitors may be manufactured through different manufacturing processes.

The precision of capacitance of a case where two capacitors are formed in mutually-different layers will be described in more detail. A capacitor is a circuit component including three constituent elements of two conduction plates facing each other and an insulating body disposed therebetween. The characteristics of a capacitor are determined based on the area of parts of the two conduction plates that face each other, the thickness of the insulating body, and the dielectric constant of the insulating body.

The description will be continued with reference to FIG. 4. First, one capacitor formed inside a layer in which a TFT circuit is formed will be described. For example, the gate 32 and the semiconductor part 31 can be used as the two conduction plates to face each other. In such a case, the third insulating layer 42 achieves the role of the insulating body. A capacitor formed by an anode electrode and an intermediate metal used for capacitor formation, similar to this embodiment, can be formed by the first metal plate 351, the first insulating layer 43, and the first electrode 18.

For example, the insulating body of the first capacitor is the insulating layer X, and the insulating body of the second capacitor is the insulating layer Y. For example, due to a variation in the manufacturing process, a phenomenon in which the insulating layer X is formed to be thick, and the insulating layer Y is formed to be thin may occur. In a case such a phenomenon occurs, the first capacitor has low capacitance, and the second capacitor has high capacitance. Since changes in the two capacitors operate in opposite directions, a variation in the drive current Ioled increased. As a result, the luminance unevenness increases. In order to prevent such a phenomenon, the precision of each manufacturing process is set to a high level.

In addition, as described above using the comparative example, Equation (3) and Equation (5) do not become equal. For this reason, inside the display panel, in a case where the thickness d1 of the insulating film (insulating body) of the first area 751 and the thickness d2 of the insulating film of the second area 752 are different from each other, it is difficult to decrease a variation in C2/(C2+C1) of each subpixel 99.

For this reason, in a case where two capacitors are formed in mutually-different layers, it is difficult to suppress a variation in such capacitors, and the luminance unevenness still occurs.

On the other hand, in the display apparatus 10 according to the present disclosure, as described above using Equation (1), Equation (3), and Equation (4), also in a case where the thickness d1 of the insulating film (insulating body) 74 of the first area 751 and the thickness d2 of the insulating film 74 of the second area 752 are different from each other, a variation in the drive current Ioled flowing through the organic light emitting diode 97 of each subpixel 99 can be decreased. As a result, the luminance unevenness of the display apparatus 10 can be decreased.

In addition, in the display apparatus 10, an insulating layer forming capacitors is not arranged in the second layered body 62 in which the TFT circuit is formed. For this reason, since the first insulating layer 43 can be dedicatedly used as the insulating body of the capacitors, the voltage withstanding performance of the TFT and the like do not need to be considered. In other words, as the first insulating layer 43, in order to acquire desired capacitance, a layer of an optimal thickness and an optimal material can be used.

Accordingly, the first insulating layer 43 can be formed to be thinner than the third insulating layer 42 of the TFT circuit. For example, the relation between the capacitance of the first capacitor 91 and the second capacitor 92 and the parasitic capacitance of the TFT circuit can be configured as represented in Expression (6).

$$C1, C2 \gg \text{parasitic capacitance} \quad (6)$$

Here, C1 is the capacitance of the first capacitor 91.

C2 is the capacitance of the second capacitor 92.

The parasitic capacitance, for example, is capacitance between terminals of the gate and the source or the gate and the drain of the drive transistor 98 or the switch transistor 96.

By setting the capacitance C1 of the first capacitor 91 and the capacitance C2 of the second capacitor 92 to satisfy Expression (6), luminance unevenness occurring due to the influence of parasitic capacitance can be suppressed.

In addition, according to the display apparatus 10 of the present disclosure, various effects to be described below can be further acquired.

In a case where the first metal plate 351 is formed too small, in other words, in a case where the capacitance C1 is configured too low, the influence of the parasitic capacitance of the TFT circuit becomes remarkable. In addition, during the emission period of the organic light emitting diode 97, there is concern that an inter gate-source (GS) voltage of the drive transistor 98 decreases due to a leak current. In a case where the inter-GS voltage of the drive transistor 98 decreases, the drive current Ioled decreases, and the luminance of the organic light emitting diode 97 is lowered. Accordingly, the first metal plate 351 is configured to have an area of some degree or more.

In other words, by securing capacitance C1, a decrease in the inter-GS voltage of the drive transistor 98 is prevented, whereby a decrease in the luminance of the organic light emitting diode 97 can be prevented.

In addition, on the basis of the securing of the area in the first metal plate 351, the second metal plate 352 is preferably formed to be large as possibly as can. In other words, on the basis of the securing of capacitance C1, the capacitance C2 is preferably configured to be high as possibly as can. In this way, a voltage applied to the drive transistor 98 at the time of inputting data from the input line Vinput can be lowered. For this reason, a loss of a data voltage input from the input line Vinput can be suppressed.

In addition, by using the first electrode 18 of the organic light emitting diode 97 as the terminals of the first capacitor 91 and the second capacitor 92, a dedicated line connecting the first capacitor 91 and the second capacitor 92 in series becomes unnecessary.

In addition, since a capacitor is not arranged in the second laminated body 62 in which the TFT circuit is formed, the area of the TFT circuit can be decreased. As a result, the subpixel 99 can be formed more compactly, realizing a display apparatus 10 having high resolution.

Figure 14:
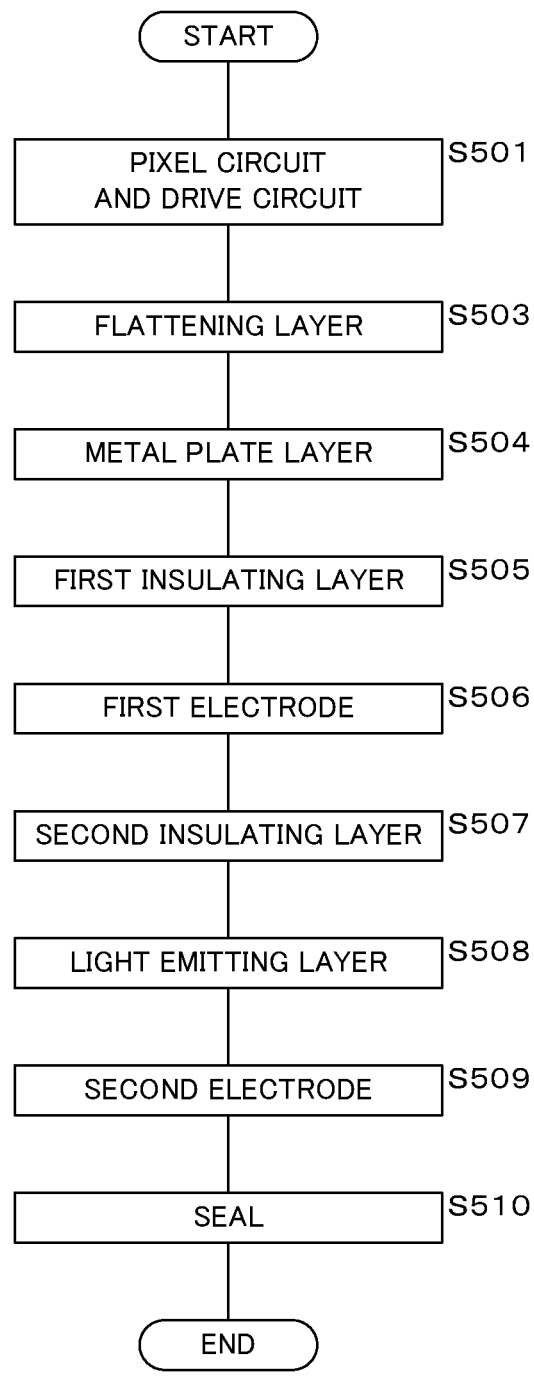
FIG. 14 is a flowchart that illustrates the manufacturing flow of a display panel.

FIG. 14 is a flowchart that illustrates the manufacturing flow of a display panel. FIGS. 15 to 33 are schematic diagrams that illustrate the manufacturing process of the display panel. An overview of a method of manufacturing the display panel used for the display apparatus 10 according to this embodiment will be described with reference to FIGS. 14 to 33. Here, manufacturing devices including a deposition device, a sputtering device, a coating device such as a slit coater, an exposure device, a developing device, an etching device, a sealing device, a cutting device, and a conveyance device connecting such devices used for manufacturing the display panel are not illustrated in the drawings. Such devices are operated according to a predetermined program.

In the description presented below, one subpixel 99 will be described as an example in the schematic cross-sectional view. The apparatus manufacturing the display apparatus 10 forms a pixel circuit and a drive circuit 20 by using a semiconductor process on the front side of a first substrate 11 that is a transparent substrate such as a glass substrate (step S501).

Figure 15:
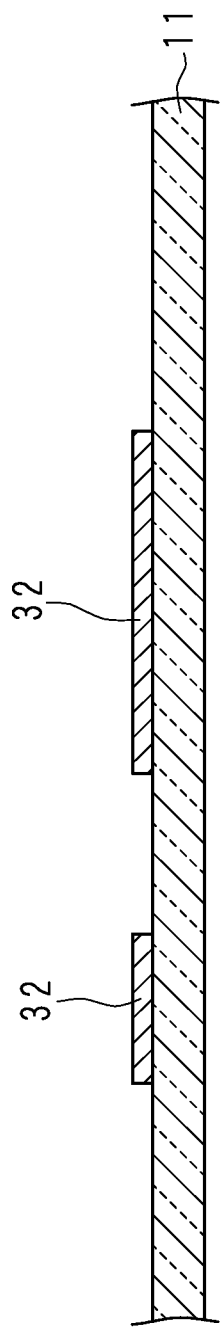
FIG. 15 is a schematic diagram that illustrates the manufacturing process of a display panel.

An overview of the process of step S501 will be described. First, description will be presented with reference to FIG. 15. FIG. 15 is a schematic cross-sectional view of the display apparatus 10 that is in the middle of the manufacturing process. The manufacturing apparatus forms a gate 32 of a predetermined shape by using a sputtering method, a photolithographic method, and the like on one face of the first substrate 11.

Figure 16:
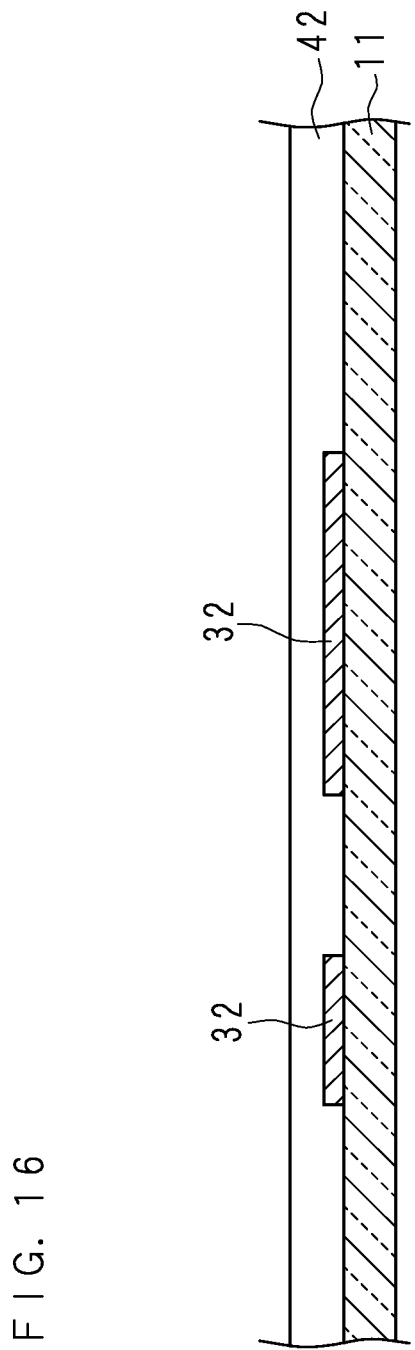
FIG. 16 is a schematic diagram that illustrates the manufacturing process of the display panel.

As illustrated in the cross-sectional view of FIG. 16, the manufacturing apparatus forms a third insulating layer 42 of a uniform thickness by using a CVD method or the like.

Figure 17:
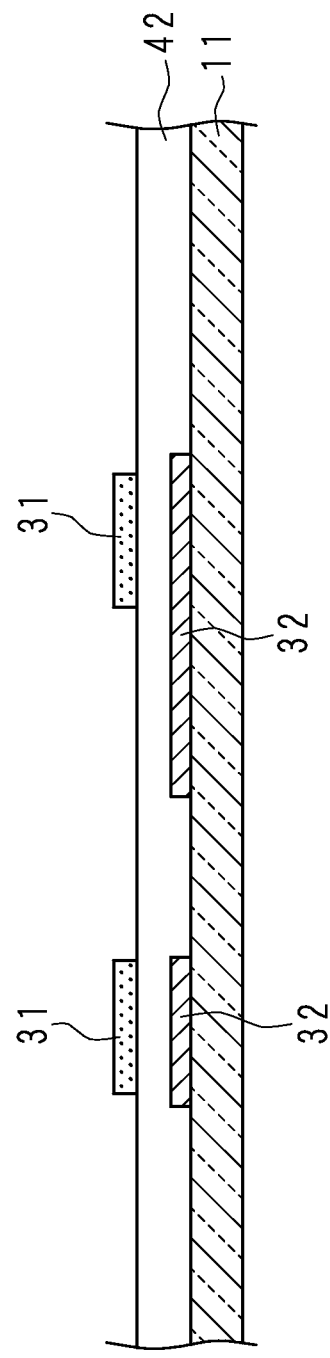
FIG. 17 is a schematic diagram that illustrates the manufacturing process of the display panel.

As illustrated in the cross-sectional view of FIG. 17, the manufacturing apparatus forms a semiconductor part 31 of a predetermined shape by using a sputtering method, a photolithographic method, or the like.

Figure 18:
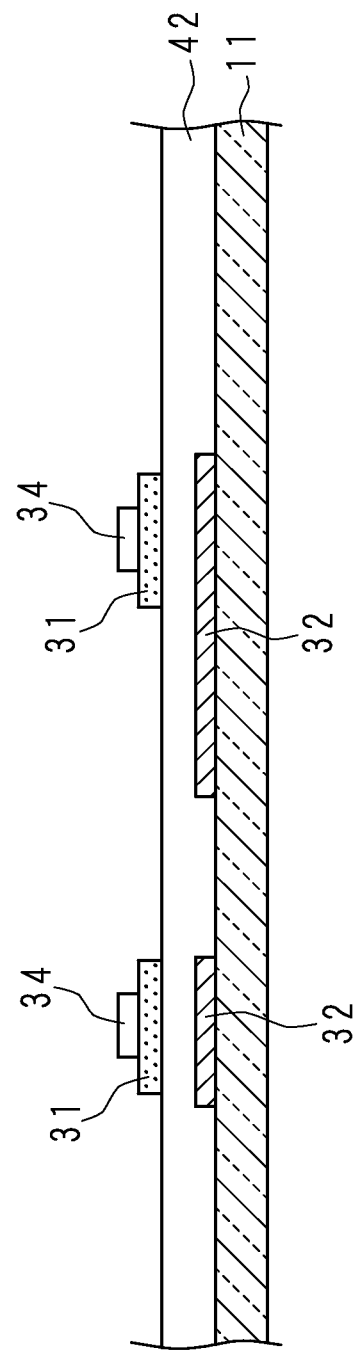
FIG. 18 is a schematic diagram that illustrates the manufacturing process of the display panel.

As illustrated in the cross-sectional view of FIG. 18, the manufacturing apparatus forms an etching stop part 34 of a predetermined shape by using a CVD method, a photolithographic method, or the like.

Figure 19:
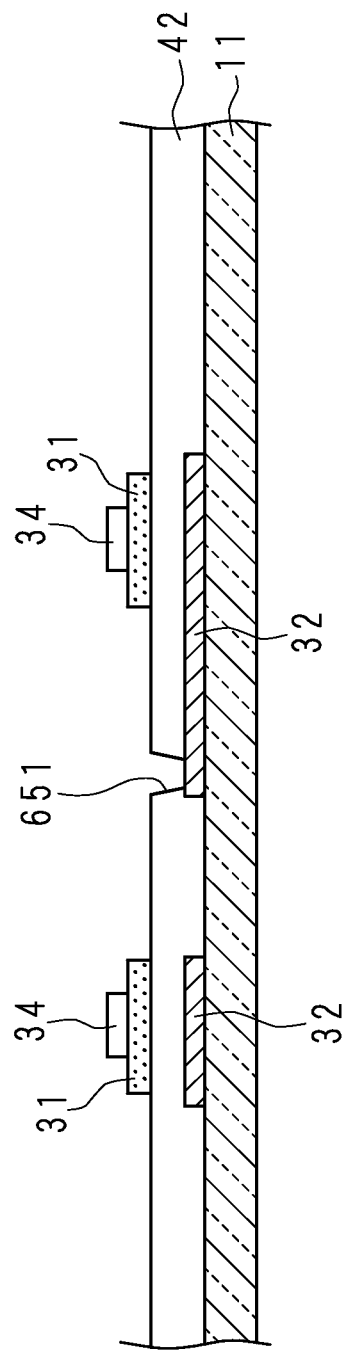
FIG. 19 is a schematic diagram that illustrates the manufacturing process of the display panel.

As illustrated in the cross-sectional view of FIG. 19, the manufacturing apparatus forms a first contact hole 651 from the front face of the third insulating layer 42 up to the gate 32 by using a dry etching method or the like.

Figure 20:
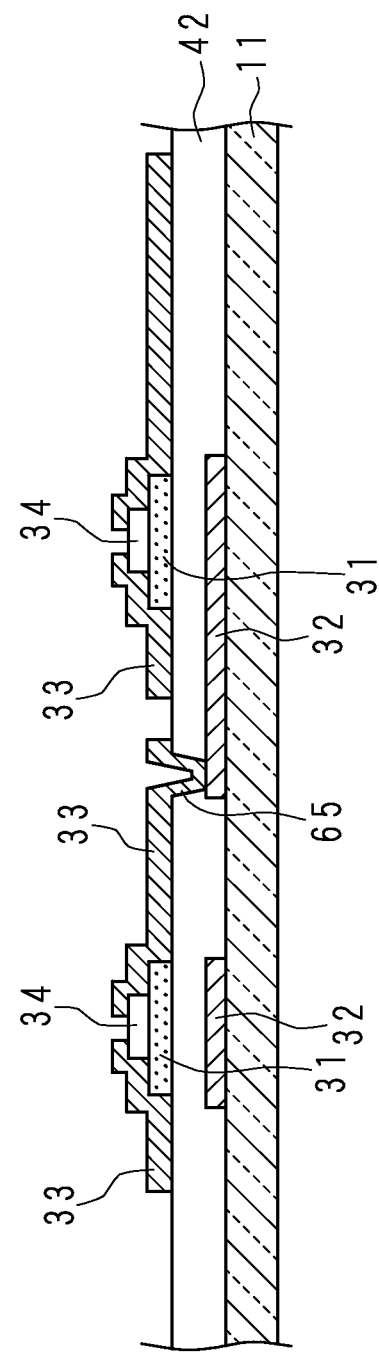
FIG. 20 is a schematic diagram that illustrates the manufacturing process of the display panel.

As illustrated in the cross-sectional view of FIG. 20, the manufacturing apparatus forms a source drain 33 of a predetermined shape by using a sputtering method, a photolithographic method, or the like. As described above, the material of the source drain 33 is a conductor. The conductor that is the material of the source drain 33 forms a first conduction part 65 that covers also the inner face of the first contact hole 651 and connects the source drain 33 and the gate 32.

Figure 21:
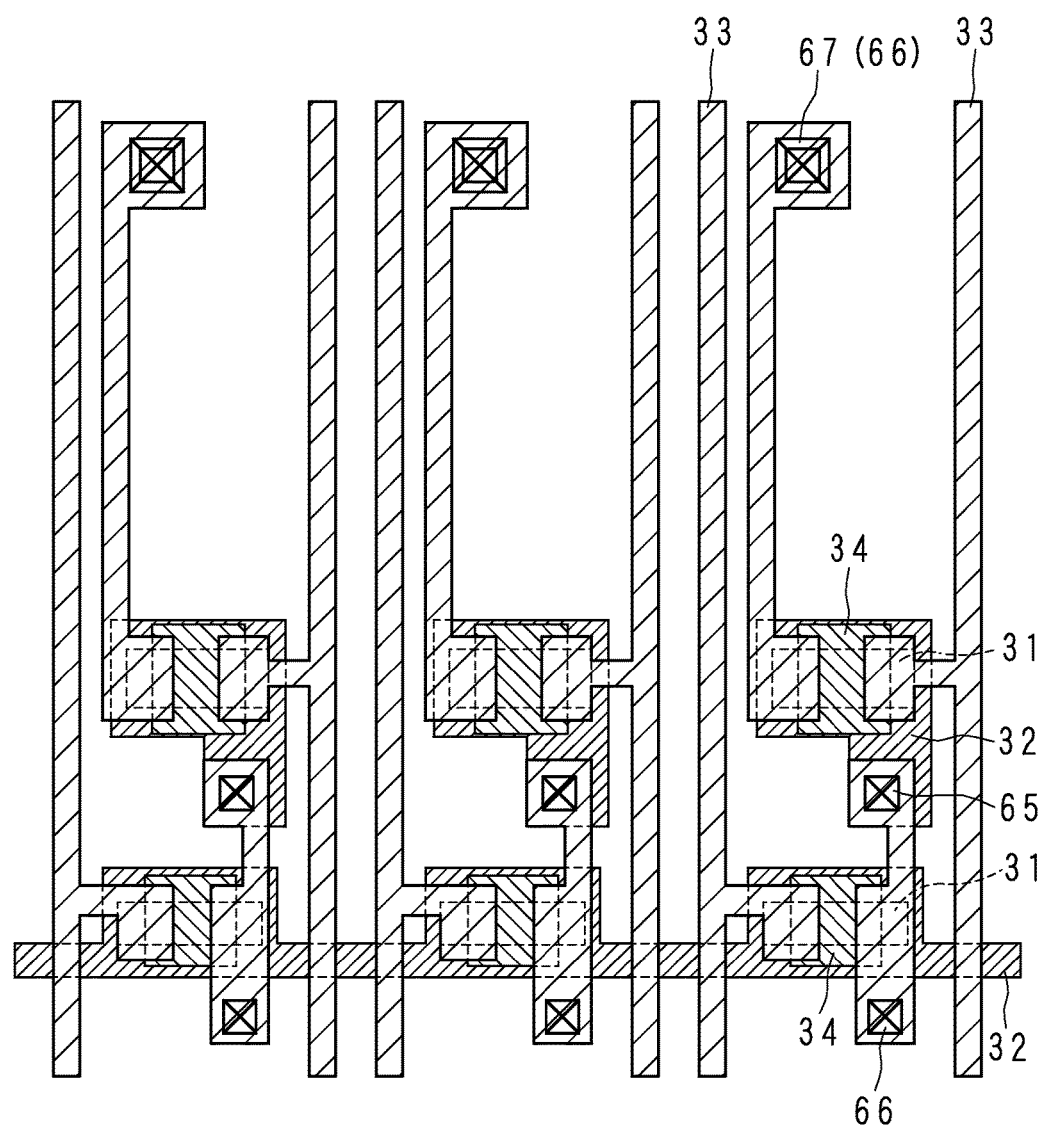
FIG. 21 is a schematic diagram that illustrates the manufacturing process of the display panel.

FIG. 21 is a schematic plan view of the display apparatus 10 that in the stage illustrated in FIG. 20. FIG. 21 illustrates the same part as that illustrated in FIG. 5. In FIG. 21, a second conduction part 66 and a third conduction part 67 generated in the subsequent process are also illustrated.

A gate 32, a semiconductor part 31, an etching stop part 34, and a source drain 33 are formed using the process described with reference to FIGS. 15 to 20. The gate 32 includes an "L" part and a rectangular part. The rectangular part is continuous in a band-shaped part extending in the horizontal direction. The semiconductor part 31 has a rectangular shape that is long in the horizontal direction. The semiconductor part 31 overlaps the gate 32. The etching stop part 34 has a rectangular shape. The etching stop part 34 covers a center part of the semiconductor part 31 in the horizontal direction. The source drain 33 has a shape in which rectangular parts covering both ends of the semiconductor part 31 in the horizontal direction are connected using a band-shaped part.

Figure 22:
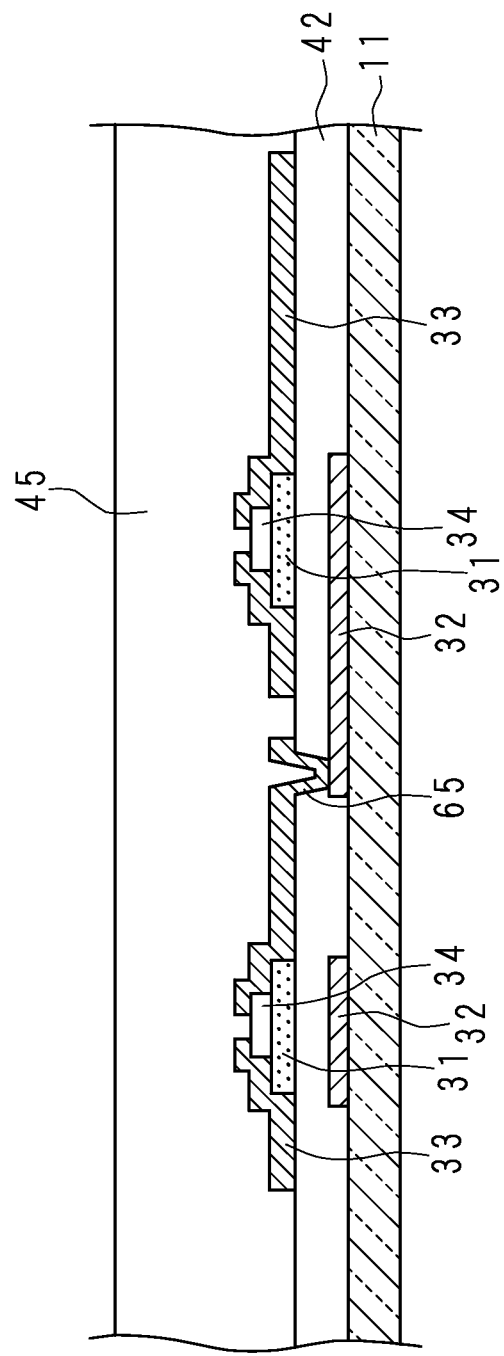
FIG. 22 is a schematic diagram that illustrates the manufacturing process of the display panel.

As illustrated in the cross-sectional view of FIG. 22, the manufacturing apparatus forms an inorganic insulating layer of a uniform thickness, which is not illustrated in the drawing, by using a CVD method or the like. The coating device generates a planarization layer 45 by using a slit coat method or the like (step S503).

Figure 23:
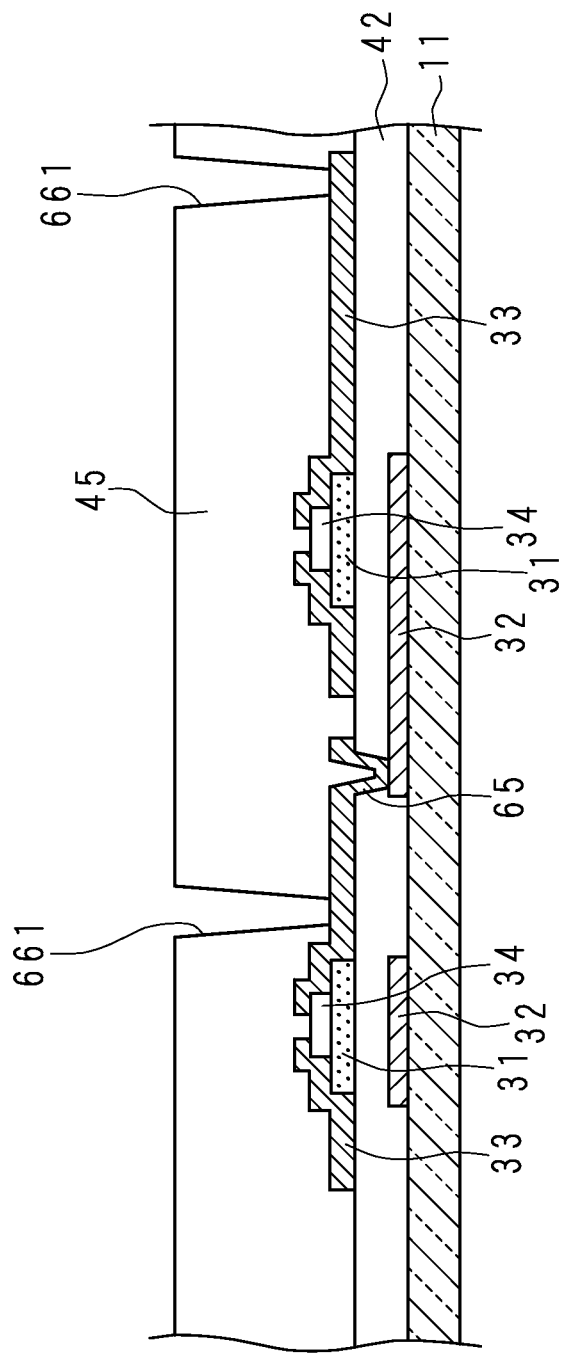
FIG. 23 is a schematic diagram that illustrates the manufacturing process of the display panel.

As illustrated in the cross-sectional view of FIG. 23, the manufacturing apparatus forms a second contact hole 661 that passes through the front face of the planarization layer 45 to the source drain 33 by using a dry etching method or the like.

Figure 24:
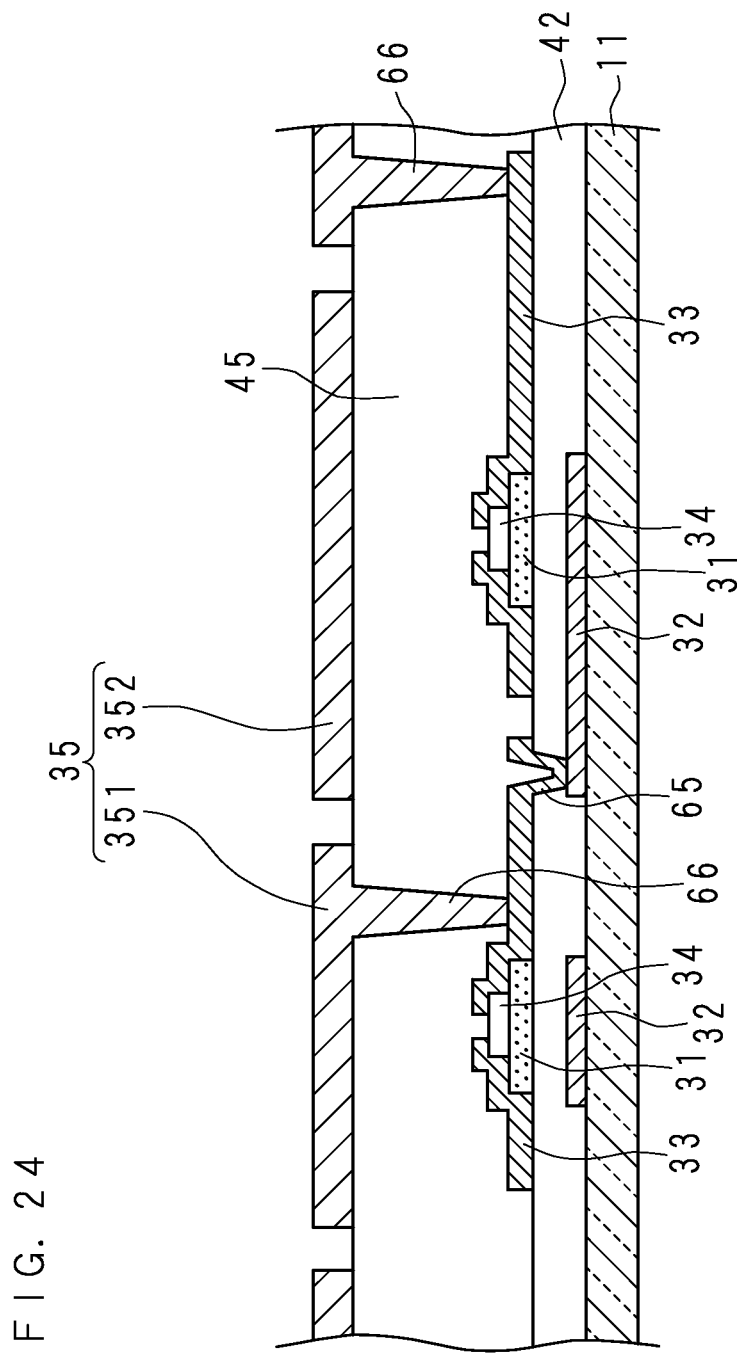
FIG. 24 is a schematic diagram that illustrates the manufacturing process of the display panel.
Figure 25:
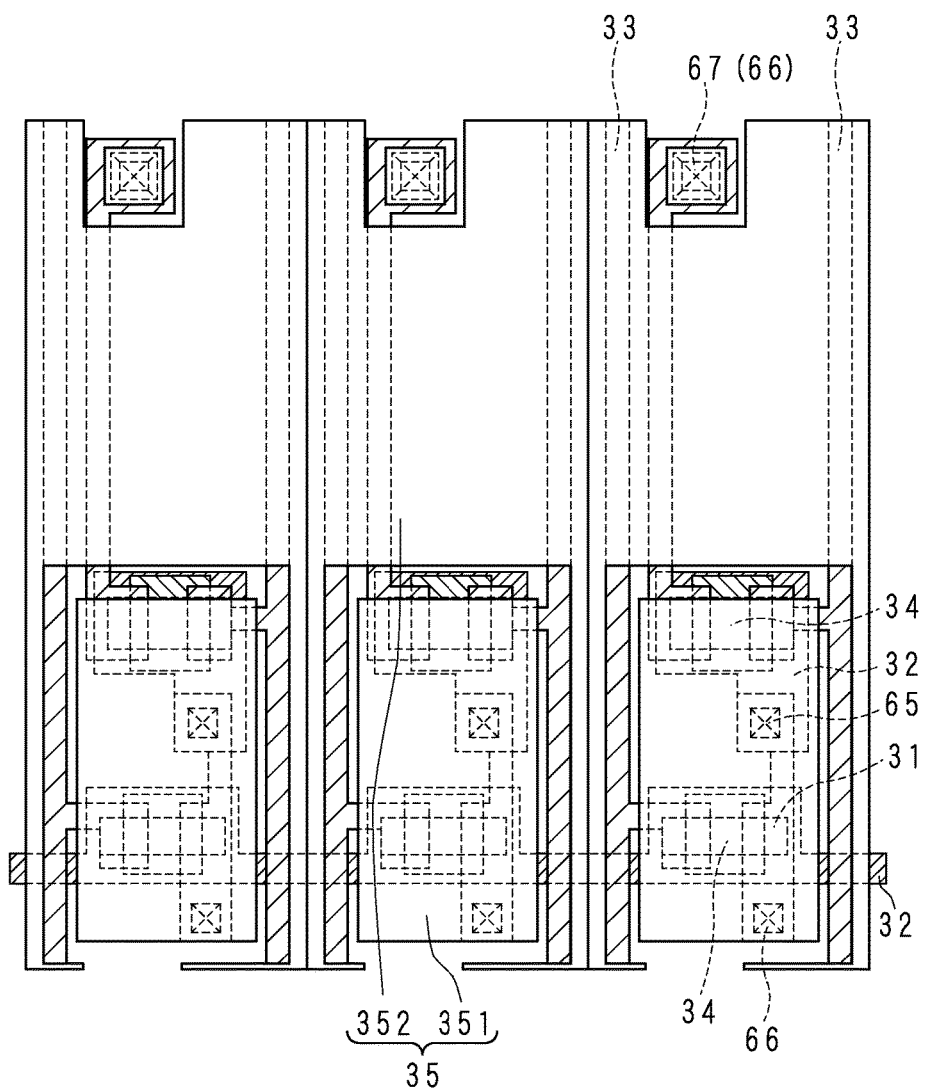
FIG. 25 is a schematic diagram that illustrates the manufacturing process of the display panel.

As illustrated in the cross-sectional view of FIG. 24, the manufacturing apparatus forms a metal plate layer 35 of a predetermined shape by using a sputtering method, a photolithographic method, and the like (step S504). FIG. 25 is a schematic plan view of the display apparatus 10 that is in the stage illustrated in FIG. 24. FIG. 25 illustrates the same part as that illustrated in FIG. 5. The metal plate layer 35 includes a first metal plate 351 and a second metal plate 352. As described above, the metal plate layer 35 is a conductor.

The inside of the second contact hole 661 illustrated in FIG. 23 is filled with the same conductor as the metal plate layer 35, whereby a second conduction part 66 connecting the metal plate layer 35 and the source drain 33 is formed. In this embodiment, the manufacturing apparatus employs a manufacturing condition for configuring the upper face of the second conduction part 66 to be a flat face.

Figure 26:
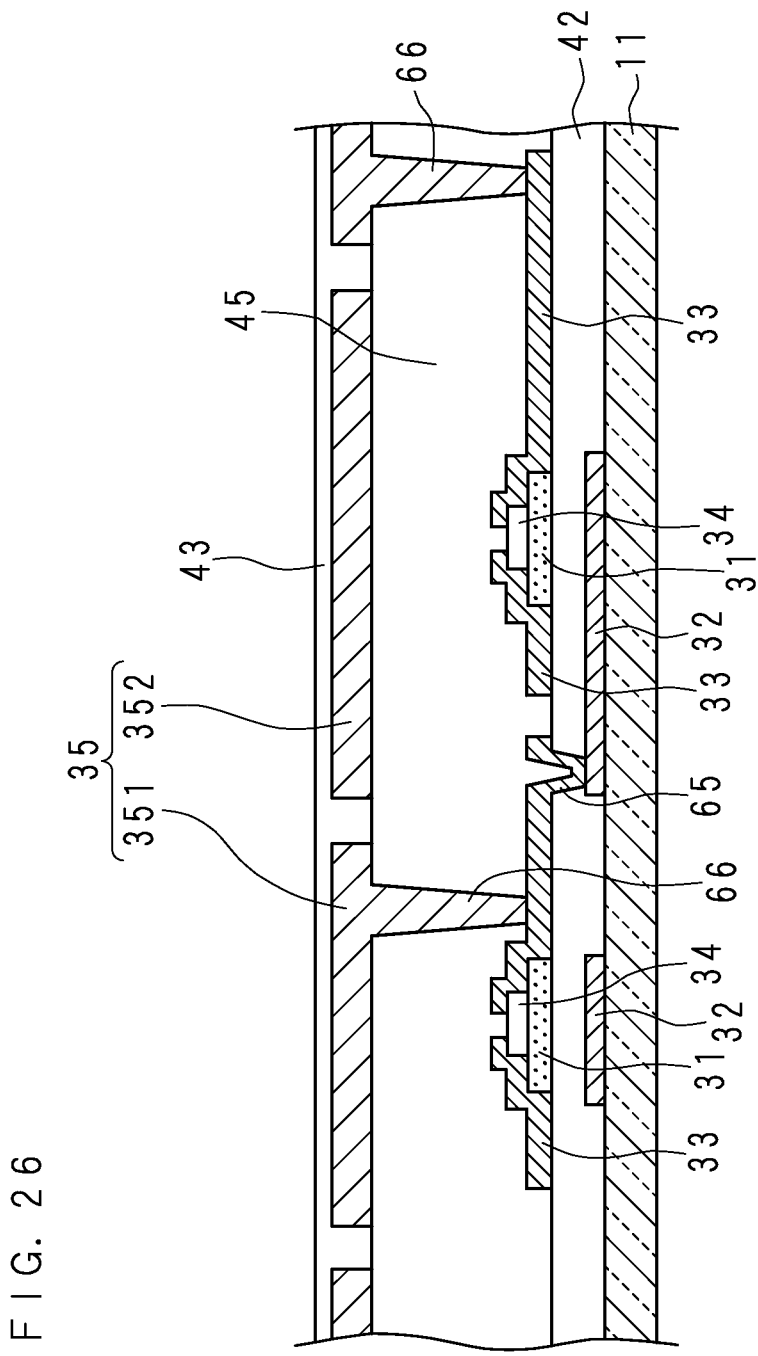
FIG. 26 is a schematic diagram that illustrates the manufacturing process of the display panel.

As illustrated in the cross-sectional view of FIG. 26, the manufacturing apparatus forms a first insulating layer 43 by using a CVD method or the like (step S505). In this embodiment, the manufacturing apparatus employs a manufacturing condition for configuring the upper face of the first insulating layer 43 including also a part between the first metal plate 351 and the second metal plate 352 to be a flat face.

Figure 27:
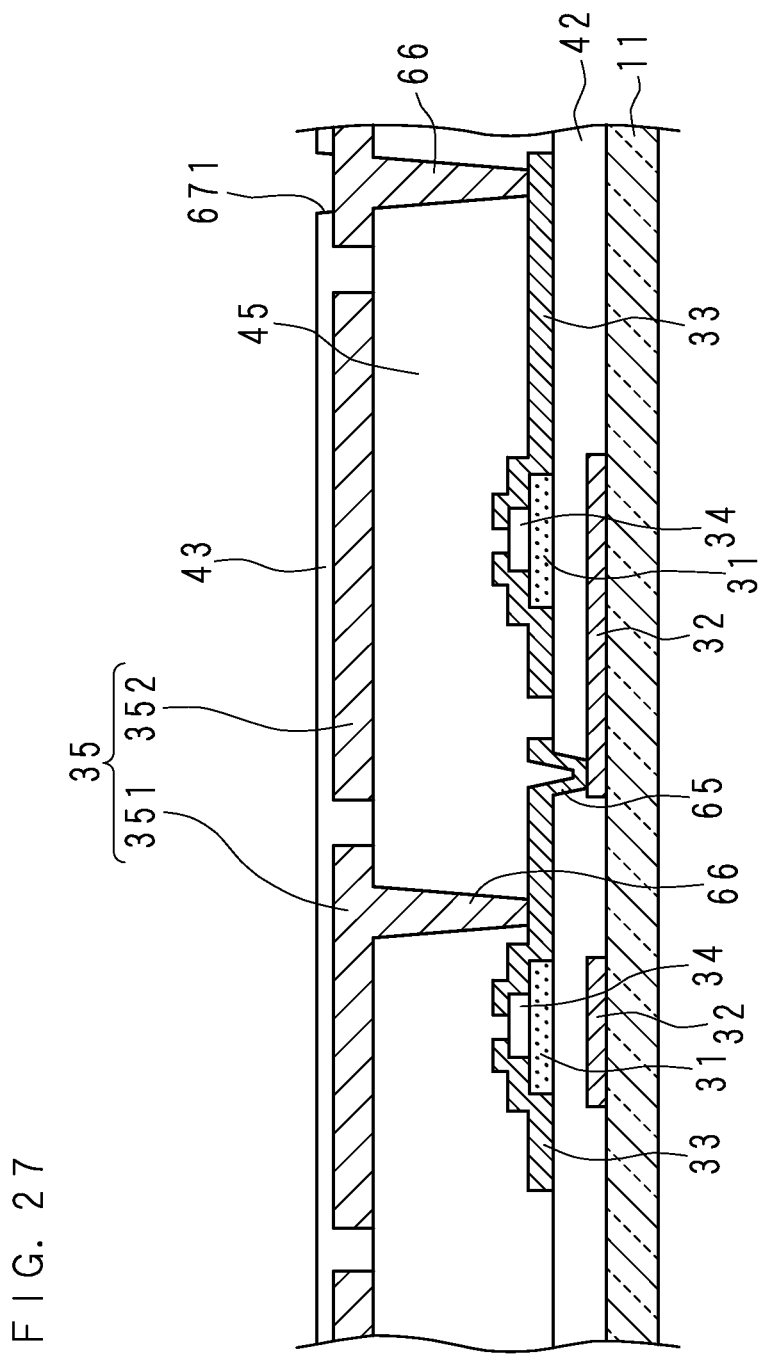
FIG. 27 is a schematic diagram that illustrates the manufacturing process of the display panel.

As illustrated in the cross-sectional view of FIG. 27, the manufacturing apparatus forms a third contact hole 671 that passes through the front face of the first insulating layer 43 to a part disposed above the second conduction part 66 disposed on the right side by using a dry etching method or the like.

Figure 28:
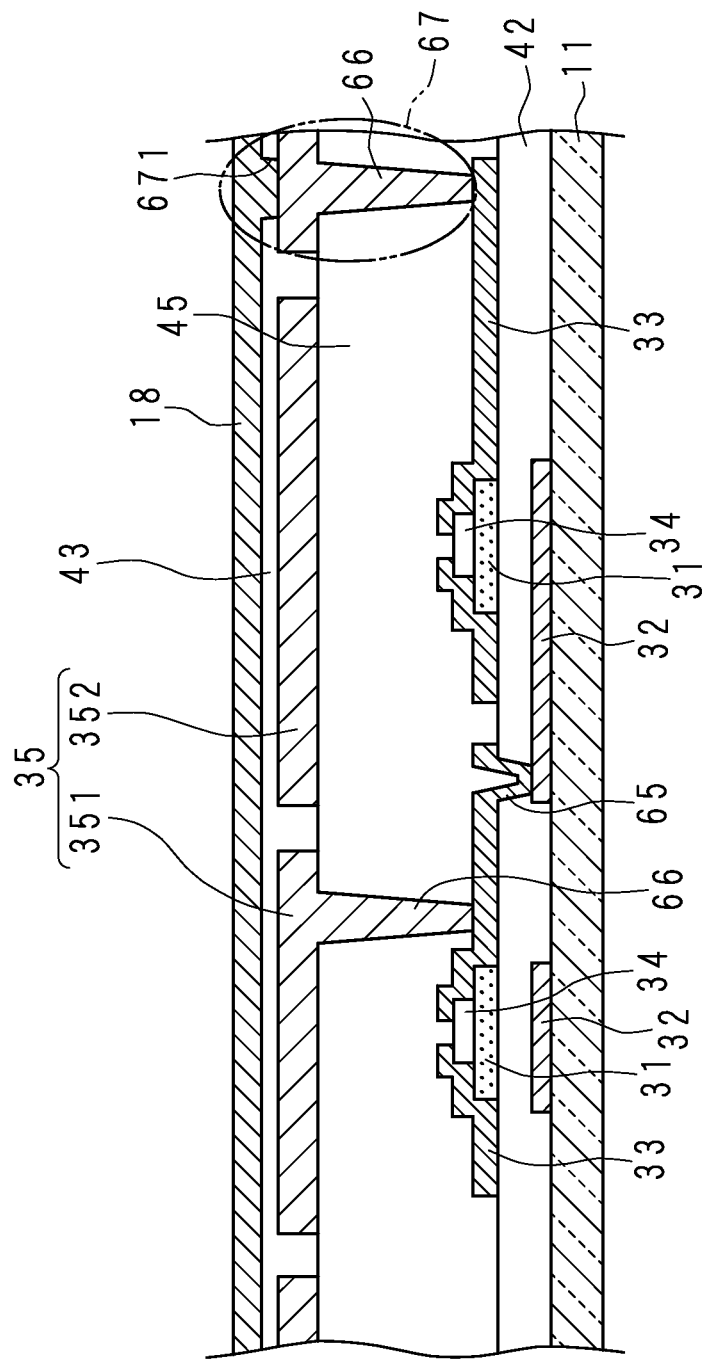
FIG. 28 is a schematic diagram that illustrates the manufacturing process of the display panel.
Figure 29:
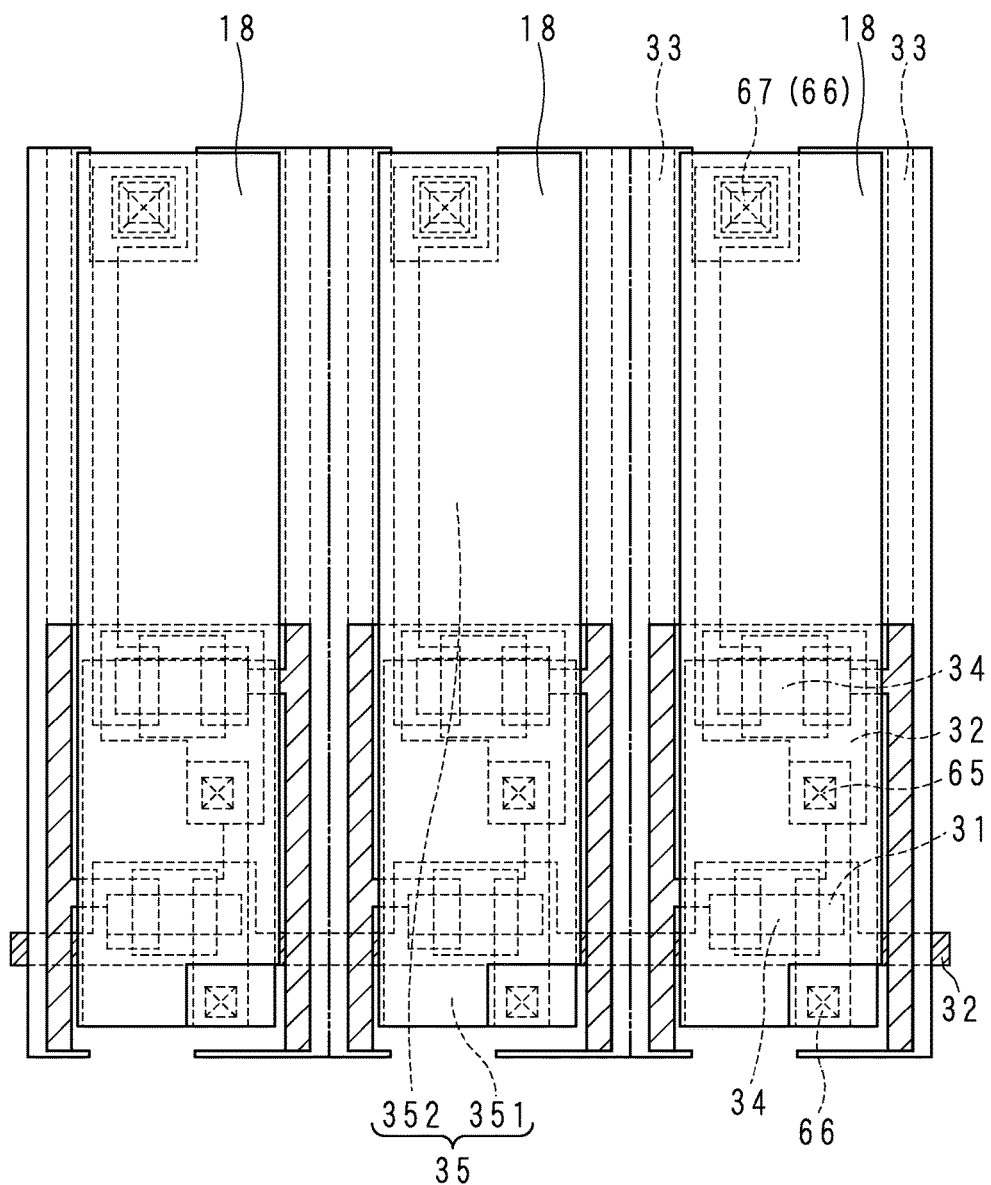
FIG. 29 is a schematic diagram that illustrates the manufacturing process of the display panel.

As illustrated in the cross-sectional view of FIG. 28, the manufacturing apparatus forms a first electrode 18 of a predetermined shape by using a sputtering method, a photolithographic method, and the like (step S506). FIG. 29 is a schematic plan view of the display apparatus 10 that is in the stage illustrated in FIG. 28. FIG. 29 illustrates the same part as that illustrated in FIG. 5. The material of the first electrode 18 is a conductor.

The inside of the third contact hole 671 illustrated in FIG. 27 is filled with a conductor. The conductor filling up the inside of the third contact hole 671 forms a third conduction part 67 that is connected to the second conduction part 66 disposed on the lower side and connects the first electrode 18 and the source drain 33. In this embodiment, the manufacturing apparatus employs a manufacturing condition for configuring the upper face of the third conduction part 67 to be a flat face.

Figure 30:
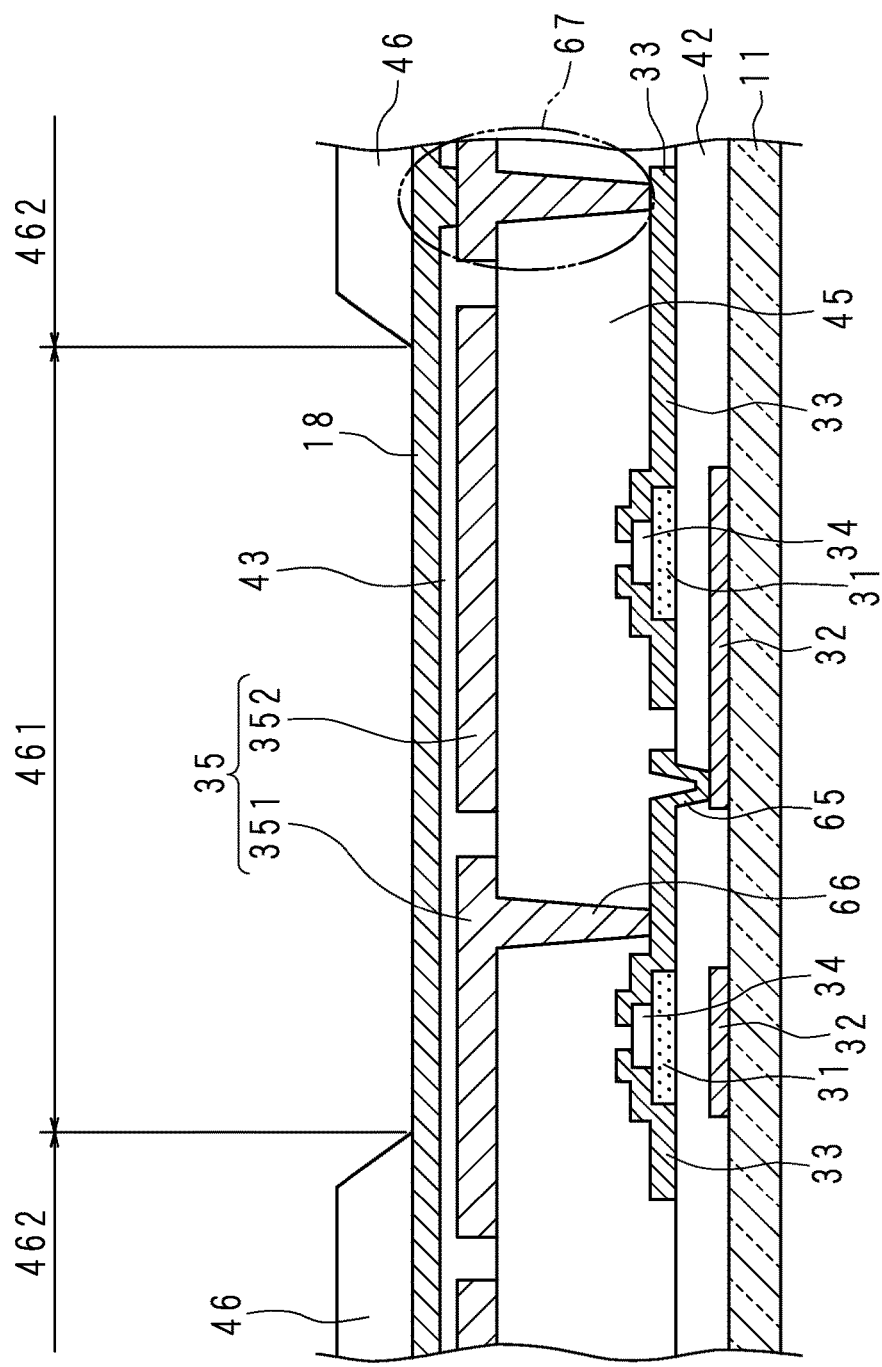
FIG. 30 is a schematic diagram that illustrates the manufacturing process of the display panel.
Figure 31:
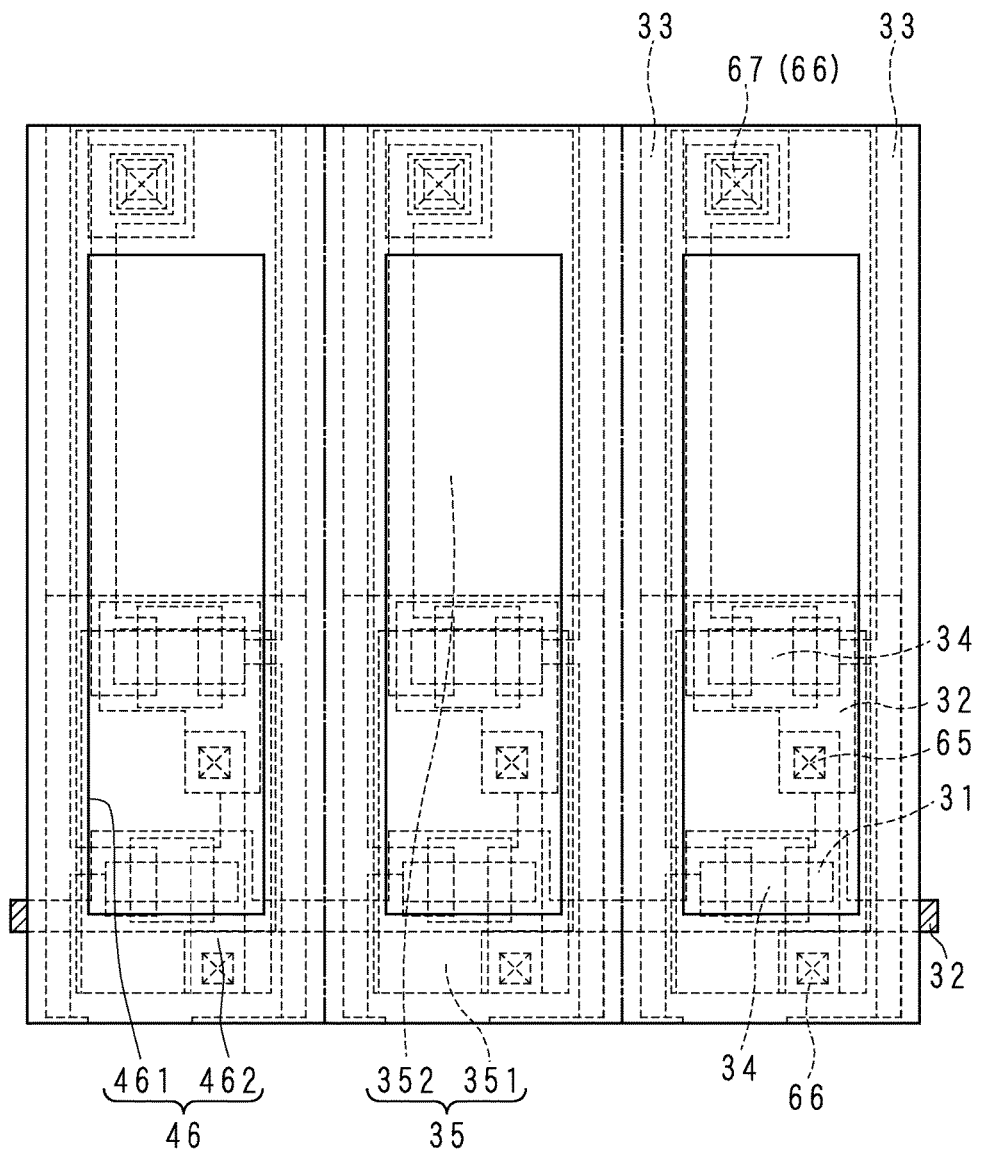
FIG. 31 is a schematic diagram that illustrates the manufacturing process of the display panel.

The description will be continued using FIGS. 30, 31, and the flowchart illustrated in FIG. 14. FIG. 30 is a schematic diagram of the display apparatus 10 that is in the middle of the manufacturing process.

As illustrated in the cross-sectional view of FIG. 30, the manufacturing apparatus forms a second insulating layer 46 of a predetermined shape by using a CVD method, a dry etching method, and the like (step S507). FIG. 31 is a schematic plan view of the display apparatus 10 that is in the stage illustrated in FIG. 30. FIG. 31 illustrates the same part as that illustrated in FIG. 5. As described above, the second insulating layer 46 includes an aperture 461 and a non-aperture 462. The aperture 461 covers the center part of the first electrode 18. The non-aperture 462 covers a boundary part between subpixels 99 and the edge of the first electrode 18.

Figure 32:
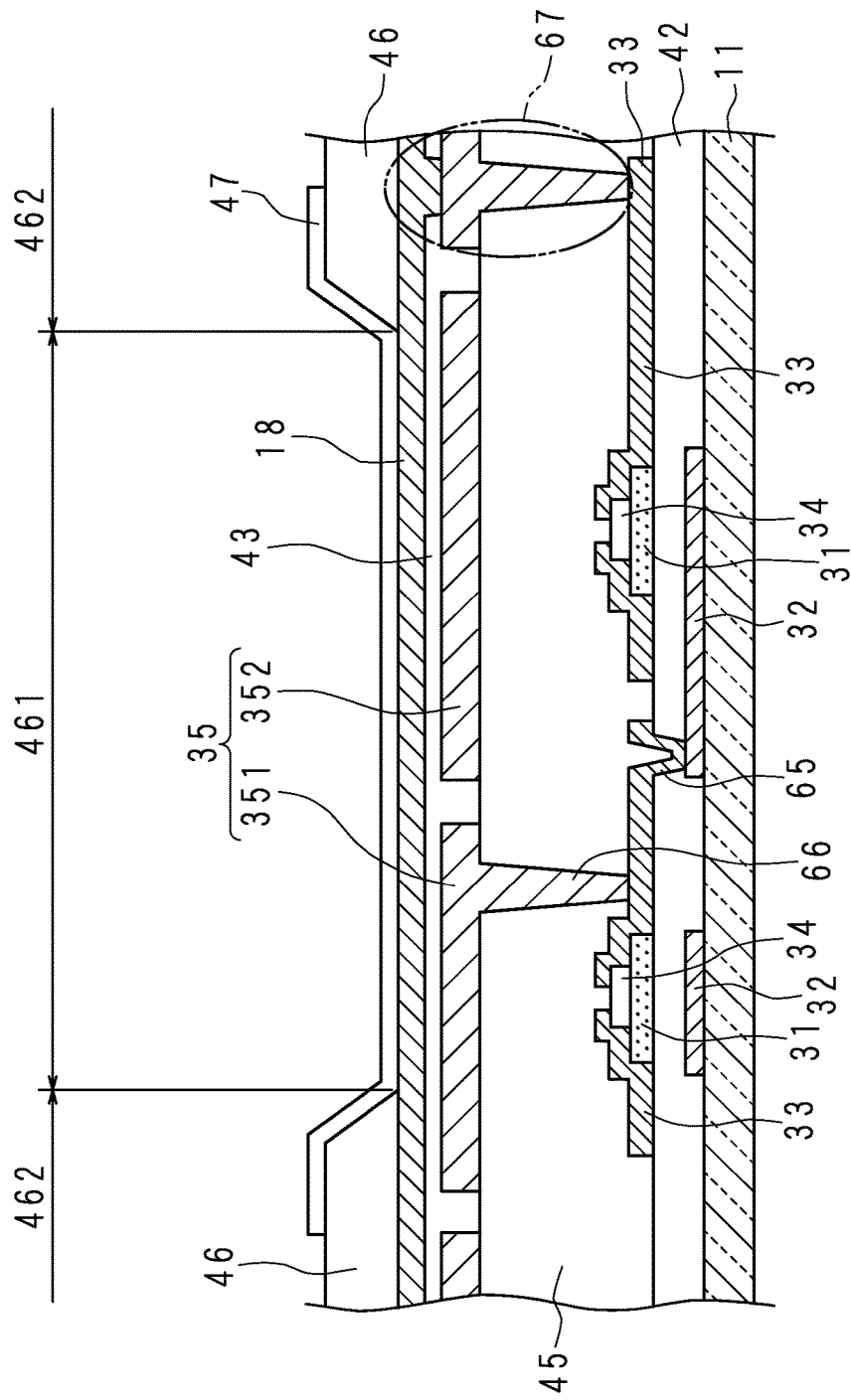
FIG. 32 is a schematic diagram that illustrates the manufacturing process of the display panel.

As illustrated in the cross-sectional view of FIG. 32, the manufacturing apparatus forms an organic light emitting layer 47 using a vapor deposition method or a coating method (step S508). The organic light emitting layer 47 covers the aperture 461.

Figure 33:
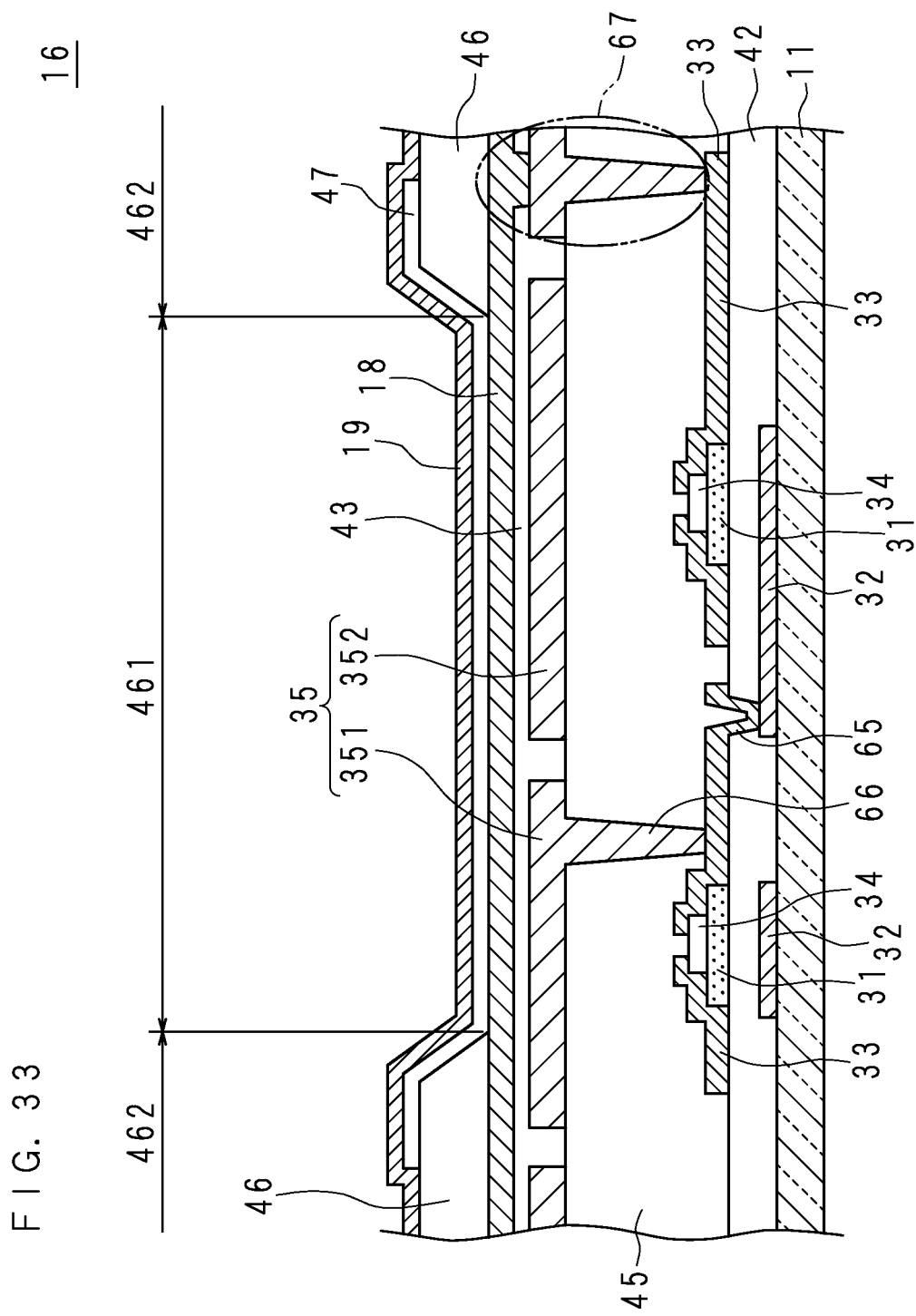
FIG. 33 is a schematic diagram that illustrates the manufacturing process of the display panel.

As illustrated in the cross-sectional view of FIG. 33, the manufacturing apparatus forms a second electrode 19 by using a vapor deposition method or a sputtering method (step S509).

As described above, the manufacturing apparatus arranges the transistor 37 including a source electrode, a drain electrode, and a gate electrode on one face of the first substrate 11. The manufacturing apparatus arranges the third insulating layer 42 covering the transistor 37 that is disposed on the upper side of the transistor 37. The manufacturing apparatus arranges the first metal plate 351 connected to the gate electrode through the first conduction part 65 passing through the third insulating layer 42 and the second metal plate 352 insulated from the first metal plate 351 in a same layer disposed on the upper side of the third insulating layer 42. The manufacturing apparatus arranges the first insulating layer 43 on the upper side of the layer of the first metal plate 351 and the second metal plate 352. The manufacturing apparatus arranges the first electrode 18 connected to the source electrode through the second conduction part 66 passing through the first insulating layer 43 and the third insulating layer 42 on the upper side of the first insulating layer 43. The manufacturing apparatus arranges the organic light emitting layer 47 on the upper side of the first electrode 18. The manufacturing apparatus arranges the second electrode 19 on the upper side of the organic light emitting layer 47.

Figure 34:
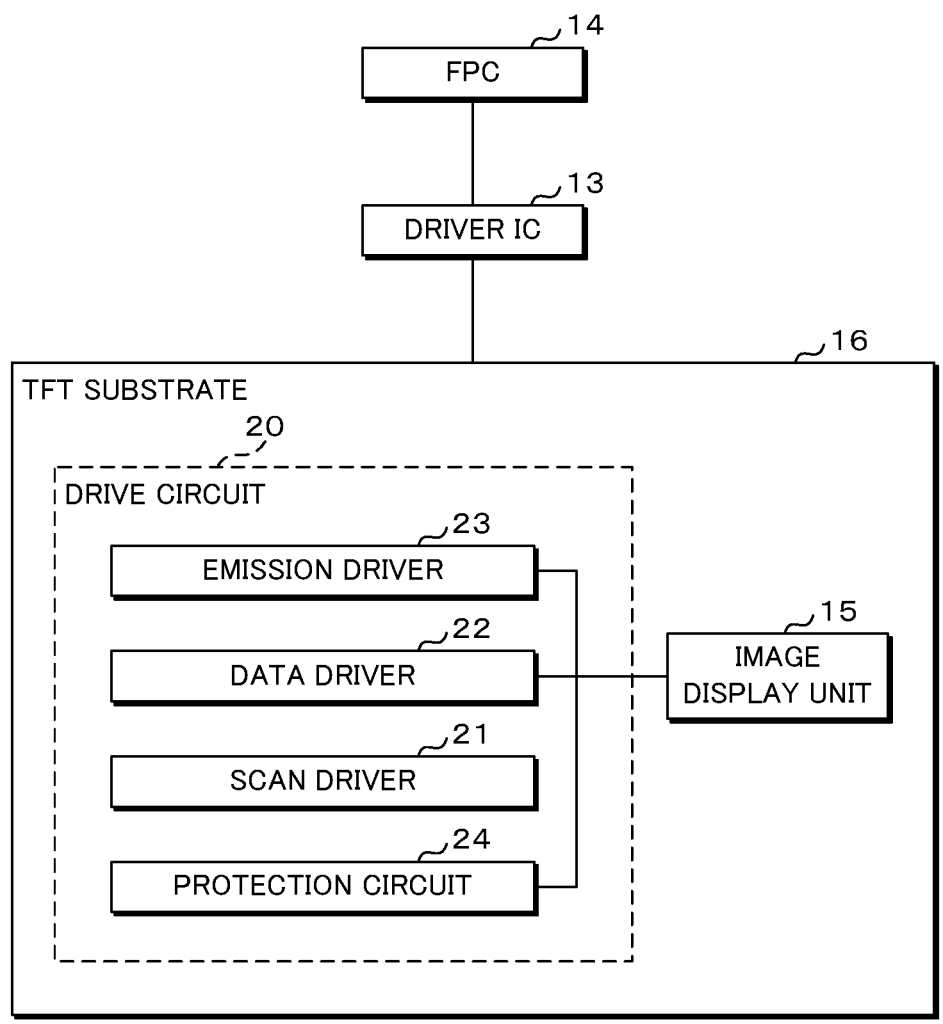
FIG. 34 is a diagram that illustrates the hardware configuration of a display apparatus.

FIG. 34 is a hardware configuration diagram of the display apparatus 10. The display apparatus 10 includes an FPC 14, a driver IC 13, and a display substrate 16. The display substrate 16 includes a drive circuit 20 and an image display unit 15. The drive circuit 20, for example, includes a scan driver 21, a data driver 22, an emission driver 23, and a protection circuit 24.

The driver IC 13 processes an image signal acquired through the FPC 14 and outputs the processed image signal to the drive circuit 20 of the display substrate 16. The drive circuit 20 controls the image display unit 15.

The emission driver 23 and the scan driver 21 control the timing of light emission of the organic light emitting diode 97 (see FIG. 3) of each subpixel 99. The image display unit 15 displays an image according to the control.

A voltage according to the image signal is input from the data driver 22 to the input line Vinput. In a case where the scan driver 21 selects a scan line, in other words, in a case where the switch transistor 96 is in a conductive state, a voltage according to the voltage input from the input line Vinput is applied to the gate electrode of the drive transistor 98 through the switch transistor 96.

In accordance with a voltage Vgs between the gate electrode and the source electrode of the drive transistor 98, an output current IMD flows between the source electrode and the drain electrode of the drive transistor 98. A drive current Ioled that is equal to the output current IMD flows between the anode electrode and the cathode electrode of the organic light emitting diode 97. The organic light emitting diode 97 emits light with luminance according to the drive current Ioled. In other words, the organic light emitting diode 97 emits light with luminance according to the image signal.

The pixel circuit illustrated in FIG. 3 is an example. The pixel circuit may employ a configuration further combining more TFTs and capacitors. For example, the pixel circuit may include a second switch transistor between the anode electrode of the organic light emitting diode 97 and a control signal line. In addition, the pixel circuit may include a third switch transistor between the drive transistor 98 and the high-power supply line ELVDD. The operations of the first capacitor 91 and the second capacitor 92 will be described using Embodiment 2.

The shapes of the semiconductor part 31, the gate 32, the source drain 33, the first metal plate 351, the second metal plate 352, the first electrode 18, and the like described above are examples, and are illustrated using schematic diagrams that are simplified for the description. In addition, the manufacturing process and the manufacturing apparatus used in each process are examples as well.

In this embodiment, the structure, the operation, and the manufacturing method of the display apparatus 10 have been described by using the display apparatus 10 using an OLED panel of a top emission type emitting light onto a face disposed on the second substrate 12 side as an example. An OLED panel of a bottom emission type emitting light onto the first substrate 11 side may be used for the display apparatus 10.

In this embodiment, a case has been described as an example in which the transistor 37 is a TFT of an oxide TFT bottom gate type. The transistor 37 may be a TFT using amorphous silicon, polysilicon, or the like. In addition, the transistor 37 may be a TFT of a top gate type.

In this embodiment, a case has been described as an example in which the drive transistor 98 is an N-type transistor. In such a case, the first electrode 18 is the anode electrode of the organic light emitting diode 97. The second electrode 19 is the cathode electrode of the organic light emitting diode 97. As described above, the drive transistor 98 is an N-type transistor, the first electrode 18 is the anode electrode, and the second electrode 19 is the cathode electrode.

Embodiment 2

This embodiment relates to a display apparatus 10 configuring the fixed electric potential line VFIX (see FIG. 3) connected to the second capacitor 92 to be common to a low-electric potential line ELVSS. Description of parts common to Embodiment 1 will not be presented.

Figure 35:
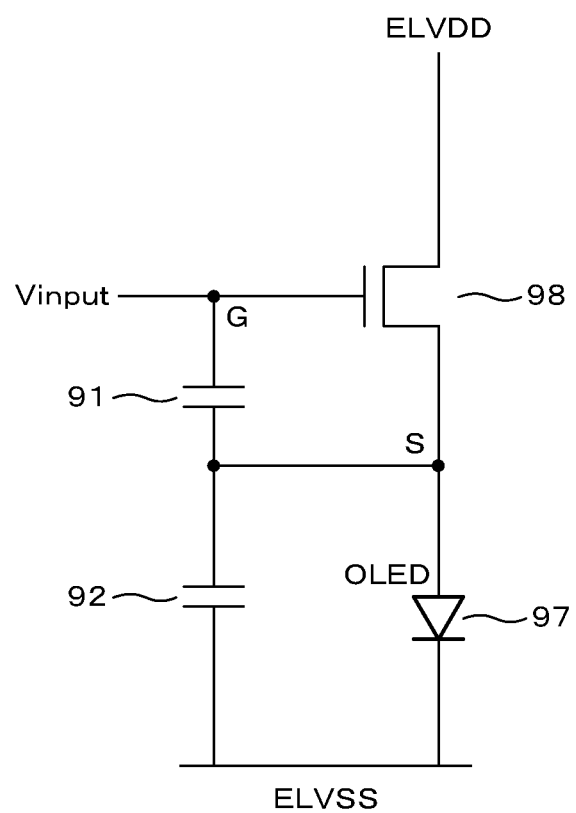
FIG. 35 is an equivalent circuit diagram that illustrates a circuit driving an organic light emitting diode, according to Embodiment 2.

FIG. 35 is an equivalent circuit diagram that illustrates a circuit driving an organic light emitting diode 97, according to Embodiment 2. The circuit illustrated in FIG. 35 is a part of a pixel circuit included in a subpixel 99. In FIG. 35, the switch transistor 96 (see FIG. 3) is not illustrated.

The circuit illustrated in FIG. 35 includes an organic light emitting diode 97, a first capacitor 91, the second capacitor 92, and the drive transistor 98. The high-power source line ELVDD, the low-power source line ELVSS, and the input line Vinput are connected to the circuit illustrated in FIG. 35. The input line Vinput is connected to the data driver 22. The voltage of the input line Vinput is alternately changed to one of the reference voltage Vref and the data voltage Vdata that is a voltage representing the emission luminance at the time of causing the organic light emitting diode 97 to emit light.

The input line Vinput is connected to the gate electrode of the drive transistor 98 and the first terminal of the first capacitor 91. The high-power source line ELVDD is connected to the drain electrode of the drive transistor 98. The low-power source line ELVSS is connected to the cathode electrode of the organic light emitting diode 97 and the first terminal of the second capacitor 92. The low-power source line ELVSS is an example of a first voltage line. A source electrode of the drive transistor 98 is connected to the second terminal of the first capacitor 91, the second terminal of the second capacitor 92, and the anode electrode of the organic light emitting diode 97.

The organic light emitting diode 97 emits light based on a signal input from the input line Vinput.

According to this embodiment, since the fixed electric potential line VFIX and the low-power source line ELVSS can be configured to be common, the display apparatus 10 in which the layout of the pixel circuit can be easily configured can be provided.

In this embodiment, the second capacitor 92 can be formed by using the first electrode 18, the first insulating layer 43, and the second metal plate 352. In such a case, the second metal plate 352 is connected to the low-source line ELVSS. Accordingly, the second metal plate 352 is connected to the cathode electrode of the organic light emitting diode 97. The second electrode 19, for example, is the cathode electrode of the organic light emitting diode 97. As described above, the second metal plate 352 is connected to the second electrode 19.

Figure 36:
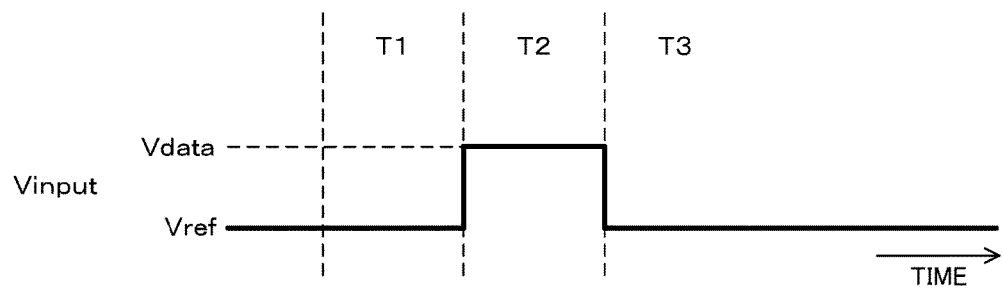
FIG. 36 is a timing diagram that illustrates an input voltage Vinput according to Embodiment 2.

FIG. 36 is a timing diagram that illustrates an input voltage Vinput according to Embodiment 2. In FIG. 36, the horizontal axis is the time. In FIG. 36, the vertical axis is the voltage of the input voltage Vinput. During a threshold compensation period T1, the input voltage Vinput is the reference voltage Vref. During a data voltage writing period T2, the input voltage Vinput is the data voltage Vdata. The data voltage Vdata is a voltage that represents the emission luminance of the organic light emitting diode 97.

The operation of the subpixel 99 and a method of deriving Equation (1) will be described with reference to FIGS. 35 and 36.

In description presented below, a part at which the gate electrode of the drive transistor 98, the first terminal of the first capacitor 91, and the input line Vinput are connected will be described as a point G. In addition, a part at which the source electrode of the drive transistor 98 and a part between the first capacitor 91 and the second capacitor 92, and the anode electrode of the organic light emitting diode 97 are connected will be referred to as a point S. The electric potential of the point S will be represented as VS, and the electric potential of the point G will be represented as VG.

The threshold compensation period T1 will be described. During the threshold compensation period T1, the reference voltage Vref is input to the input line Vinput. A current flows from the high-power source line ELVDD to the point S through the drive transistor 98. The electric potential and the electric charge of the point S converge in a state satisfying Equation (7) to Equation (9).

$$VG = Vref \tag{7}$$

$$VS = VG - Vth \tag{8}$$
$$= Vref - Vth$$

$$Q1 = (VS - VG) \times C1 + (VS - ELVSS) \times C2 \tag{9}$$
$$= -Vth \times C1 + (Vref - Vth - ELVSS) \times C2$$

Here, VG is the electric potential of the point G.
Vref is the reference voltage.
VS is the electric potential of the point S.
Vth is the threshold voltage of the drive transistor 98.
Q1 is electric charge of the point S at the time of convergence.
C1 is the capacitance of the first capacitor 91.
C2 is the capacitance of the second capacitor 92.
ELVSS is the electric potential of the cathode electrode of the organic light emitting diode 97.

The data voltage writing period T2 will be described. During the data voltage writing period, the data voltage Vdata is input to the input line Vinput. In other words, VG=Vdata. The electric potential VS is electric potential acquired by dividing (Vdata−ELVSS) by using the first capacitor 91 and the second capacitor 92 connected in series.

The electric charge of the point S is in a state satisfying Equation (10). Each equation and each symbol described above represent the same meanings, and thus, description thereof will not be presented.

$$Q2 = (VS - VG) \times C1 + (VS - ELVSS) \times C2 \tag{10}$$
$$= (VS - Vdata) \times C1 + (VS - ELVSS) \times C2$$

Q2 is the electric charge of the point S during the data voltage writing period T2.
Vdata is a data voltage input from the input line Vinput during the data voltage writing period T2.

According to the principle of conservation of charge, during the threshold compensation period T1 and the data voltage writing period T2, the electric charge of the point S does not change. In other words, Q1=Q2 is satisfied. Based on Equation (9) and Equation (10), Equation (11) is satisfied.

$$-Vth \times C1 + (Vref - Vth - ELVSS) \times C2 = (VS - Vdata) \times C1 + (VS - ELVSS) \times C2 \tag{11}$$

Thus, Equation (12) and Equation (13) are satisfied.

$$VS = C1/(C1 + C2) \times Vdata + C2/(C1 + C2) \times Vref - Vth \tag{12}$$

$$VGS = VG - VS \tag{13}$$
$$= C2/(C1 + C2) \times (Vdata - Vref) + Vth$$

VGS is an electric potential difference between the point G and the point S, in other words, inter-GS electric potential of the drive transistor 98.

A light emission period T3 will be described. During the light emission period T3, according to a function of the first capacitor 91 storing electric charge, the inter-GS electric potential VGS of the drive transistor 98 stores a state represented by Equation (13). Here, the electric potential VGS is electric potential according to the luminance of the organic light emitting diode 97. In other words, the first capacitor 91 stores at least electric charge according to the luminance of the organic light emitting diode 97.

An output current IMD flowing between the source electrode and the drain electrode of the drive transistor 98 flows through the organic light emitting diode 97 as it is. At this time, the drive transistor 98 is operated in a saturation region. Here, the output current IMD and the drive current Ioled of the organic light emitting diode 97 are equal, and Equation (14) is satisfied.

$$Ioled = IMD \qquad (14)$$
$$= \frac{1}{2}\beta(VGS - Vth)^2$$
$$= \frac{1}{2}\beta\left[\frac{C2}{(C1+C2)}(Vdata - Vref) + Vth - Vth\right]^2$$
$$= \frac{1}{2}\beta\left[\frac{C2}{(C2+C1)}(Vdata - Vref)\right]^2$$

Accordingly, Equation (1) described above is satisfied.

Embodiment 3

This embodiment relates to a display apparatus 10 configuring the fixed electric potential line VFIX (see FIG. 3) connected to the second capacitor 92 to be common to the high-power source line ELVDD. Description of parts common to Embodiment 2 will not be presented.

Figure 37:
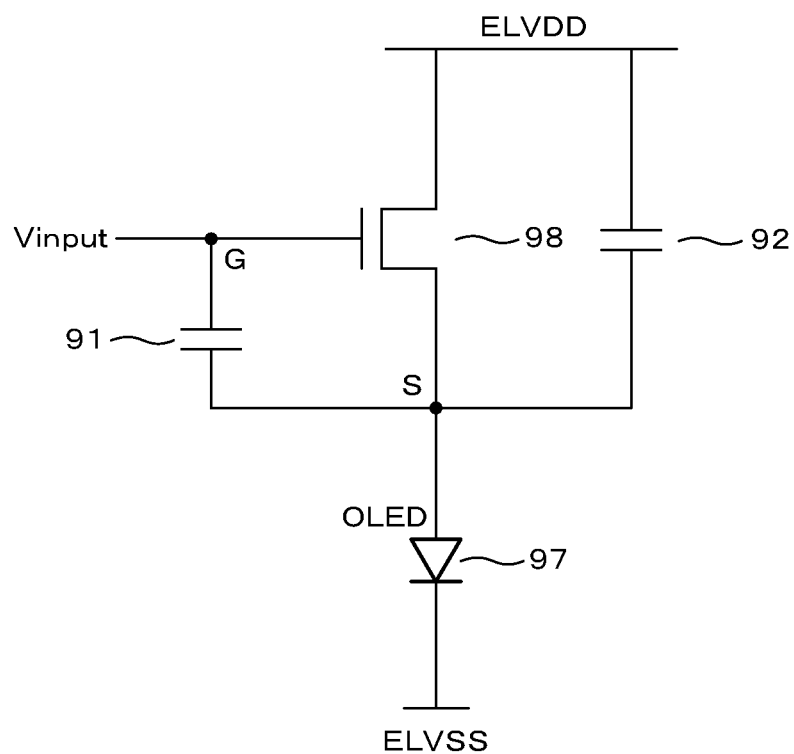
FIG. 37 is an equivalent circuit diagram that illustrates a circuit driving an organic light emitting diode, according to Embodiment 3.

FIG. 37 is an equivalent circuit diagram that illustrates a circuit driving one organic light emitting diode 97, according to Embodiment 3. The circuit illustrated in FIG. 37 is a part of a pixel circuit included in a subpixel 99.

The circuit illustrated in FIG. 37 includes an organic light emitting diode 97, the first capacitor 91, the second capacitor 92, and the drive transistor 98. The high-power source line ELVDD, the low-power source line ELVSS, and the input line Vinput are connected to the circuit illustrated in FIG. 37. The input line Vinput is connected to a data driver 22. The voltage of the input line Vinput is alternately changed to one of the reference voltage Vref and the data voltage Vdata that is a voltage representing the emission luminance at the time of causing the organic light emitting diode 97 to emit light.

The input line Vinput is connected to the gate electrode of the drive transistor 98 and the first terminal of the first capacitor 91. The high-power source line ELVDD is connected to the drain electrode of the drive transistor 98 and a first terminal of the second capacitor 92. The low-power source line ELVSS is connected to a cathode electrode of the organic light emitting diode 97. The low-power source line ELVSS is an example of a first voltage line. The source electrode of the drive transistor 98 is connected to the second terminal of the first capacitor 91, the second terminal of the second capacitor 92, and the anode electrode of the organic light emitting diode 97.

The organic light emitting diode 97 emits light based on a signal input from the input line Vinput.

Also in this embodiment, the second capacitor 92 includes the first electrode 18, the first insulating layer 43, and the second metal plate 352. The second metal plate 352 is connected to the high-power source line ELVDD. The high-power source line ELVDD is connected to the drain electrode of the drive transistor 98. As described above, the second metal plate 352 is connected to the drain electrode of the drive transistor 98.

According to this embodiment, since the fixed electric potential line VFIX and the high-power source line ELVDD can be configured to be common, a display apparatus 10 in which the layout of the pixel circuit can be easily configured can be provided.

Embodiment 4

This embodiment relates to a display apparatus 10 using a P-type transistor as the drive transistor 98. Description of parts common to Embodiment 2 will not be presented.

Figure 38:
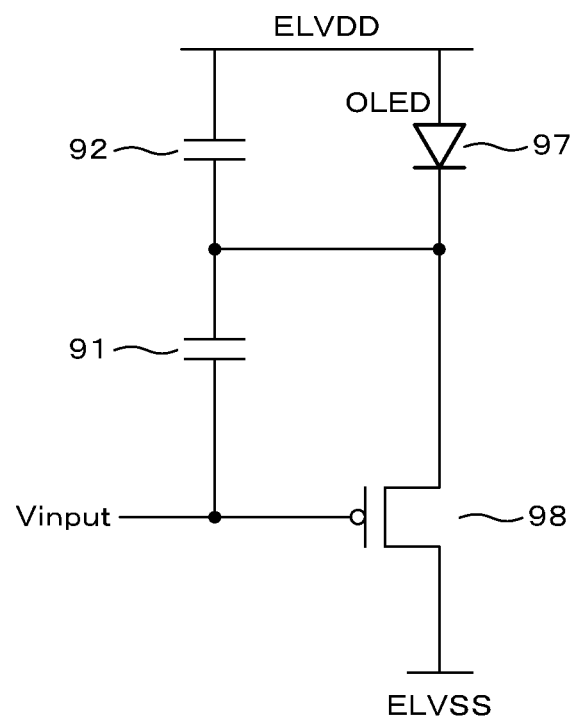
FIG. 38 is an equivalent circuit diagram that illustrates a circuit driving an organic light emitting diode, according to Embodiment 4.

FIG. 38 is an equivalent circuit diagram that illustrates a circuit driving an organic light emitting diode 97, according to Embodiment 4. The circuit illustrated in FIG. 38 is a part of a pixel circuit included in the subpixel 99.

The circuit illustrated in FIG. 38 includes the organic light emitting diode 97, the first capacitor 91, the second capacitor 92, and the drive transistor 98. The high-power source line ELVDD, the low-power source line ELVSS, and the input line Vinput are connected to the circuit illustrated in FIG. 38. The input line Vinput is connected to the data driver 22. The voltage of the input line Vinput is alternately changed to one of the reference voltage Vref and the data voltage Vdata that is a voltage representing the emission luminance at the time of driving the organic light emitting diode 97.

The input line Vinput is connected to the gate electrode of the drive transistor 98 and the first terminal of the first capacitor 91. The high-power source line ELVDD is connected to the anode electrode of the organic light emitting diode 97 and the first terminal of the second capacitor 92. The low-power source line ELVSS is connected to the drain electrode of the drive transistor 98. The source electrode of the drive transistor 98 is connected to the second terminal of the first capacitor 91, a second terminal of the second capacitor 92, and the cathode electrode of the organic light emitting diode 97. The organic light emitting diode 97 emits light based on a signal input from the input line Vinput.

According to this embodiment, the display apparatus 10 using the P-type semiconductor in the pixel circuit can be provided.

As described above, the drive transistor 98 according to this embodiment is the P-type transistor. In such a case, the first electrode 18 is the cathode electrode of the organic light emitting diode 97. The second electrode 19 is the anode electrode of the organic light emitting diode 97.

Embodiment 5

In a case where a dent, a space, or a hole is present in a certain layer (hereinafter, referred to as a layer A), when another layer (hereinafter, referred to as a layer B) is formed on the layer A, the layer B is formed along the dent, the space, or the hole.

For example, there is a space between the first metal plate 351 and the second metal plate 352 (see FIGS. 4, 24, and the like). If a layer is further formed on a part of this space, there are cases where the layer is formed along the space. In the case of the example described above, there are cases where a part of the first insulating layer 43 or the first electrode 18, which is positioned above this space, is dented. According to the dent of the first electrode 18, the flatness of the first electrode 18 disappears. If the organic light emitting layer 47 is formed on the part of which the flatness disappears, and this part is used as the aperture 461 (also referred to as a light emission area), there are cases where the image quality is degraded. Thus, in this embodiment, a configuration in which the part is covered with the non-aperture 462 will be described. Description of parts common to Embodiment 1 will not be presented.

Figure 39:
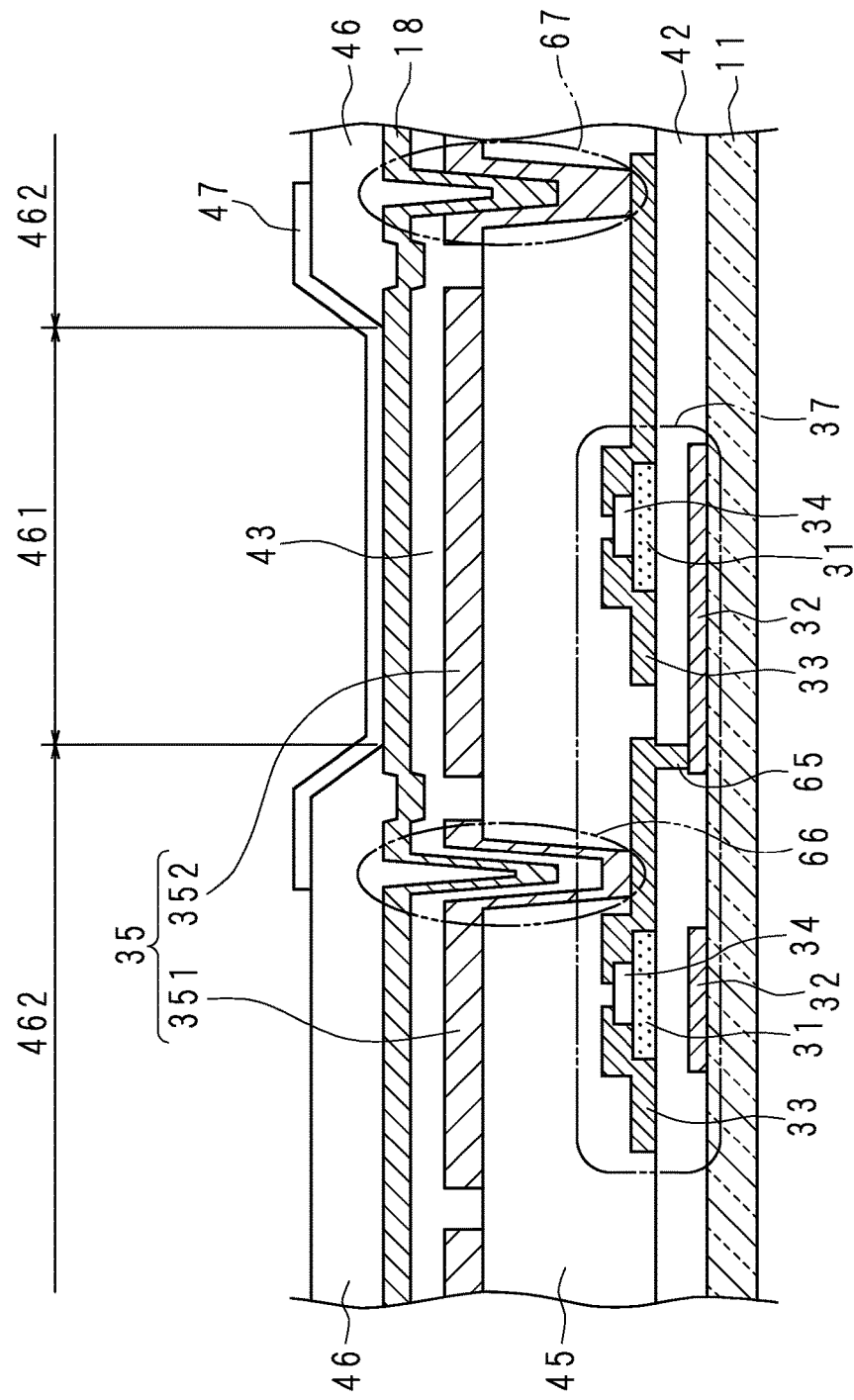
FIG. 39 is a schematic cross-sectional view of an example of non-limiting display apparatus according to Embodiment 5.

FIG. 39 is a schematic cross-sectional view of an example of non-limiting display apparatus 10 according to Embodiment 5. FIG. 39 illustrates a part corresponding to one organic light emitting diode 97 in an enlarged scale. In FIG. 39, the second substrate 12, the space 27, and the second electrode 19 are not illustrated. In FIG. 39, a part of the first insulating layer 43 and a part of the first electrode 18, which are positioned in an upper layer of a part of a space between the first metal plate 351 and the second metal plate 352, are dented.

According to such a dent, the flatness of the first electrode 18 disappears. There are cases where the image quality is degraded if the part of which the flatness disappears is used as a light emission area. Thus, in this embodiment, a part of such a dent is configured not to be used as a light emission area.

More specifically, the aperture 461 of the second insulating layer 46 is positioned only on the upper side of the second metal plate 352. In other words, the upper side of the first metal plate 351 is positioned on the lower side of the non-aperture 462 of the second insulating layer 46. The first metal plate 351 is connected to the source drain 33 in the second conduction part 66 positioned on the lower side of the non-aperture 462. The source drain 33 is connected to the gate 32 through the first conduction part 65.

Accordingly, the first metal plate 351 is connected to the gate electrode through the second conduction part 66, the source drain 33, and the first conduction part 65. As described above, the first metal plate 351 is connected to the gate electrode. The contact hole of the first metal plate 351 and the gate electrode is covered with the non-aperture 462.

In the second conduction part 66 and the third conduction part 67, the material of the first insulating layer 43, the material of the first electrode 18, and the material of the second insulating layer 46 overlap each other in a layered pattern on the inner side of the material of the metal plate layer 35. The reason for this is, as described above, in a case where a certain dent or the like is present, the upper layer is formed according to such a dent.

Figure 40:
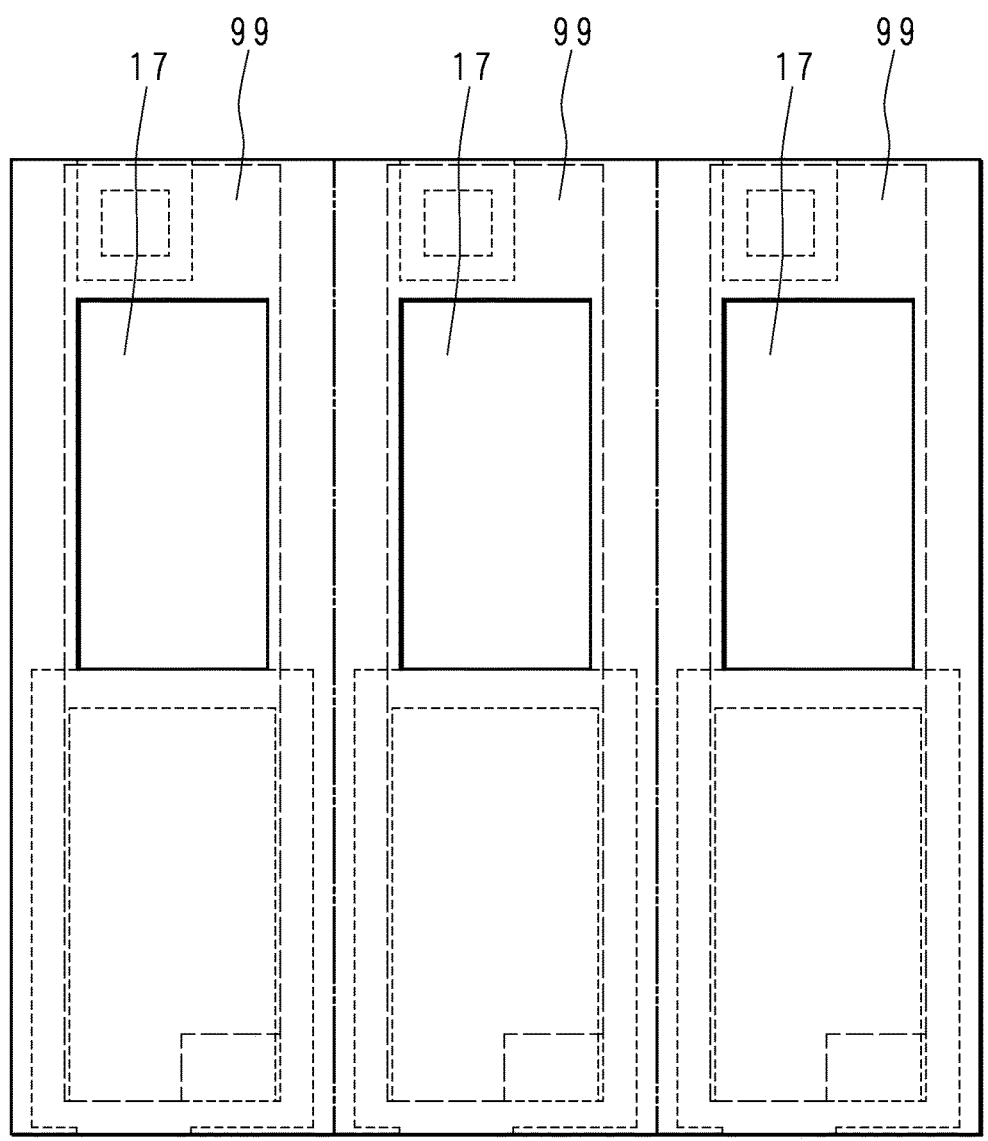
FIG. 40 is a schematic plan view of a pixel according to Embodiment 5.

FIG. 40 is a schematic plan view of the pixel 90 according to Embodiment 5. FIG. 40 illustrates the same range as that illustrated in FIG. 5. The light emitting part 17 is positioned on the upper side of the subpixel 99.

Figure 41:
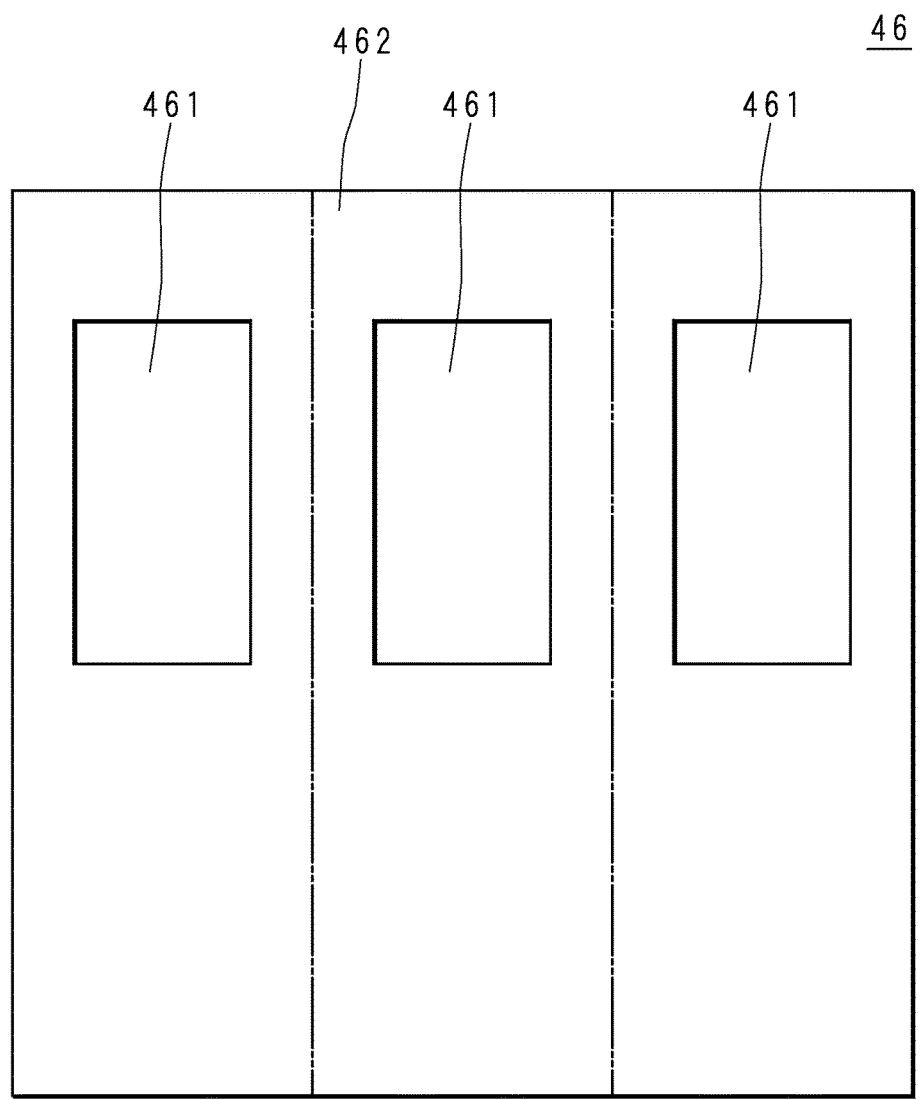
FIG. 41 is a schematic plan view of a second insulating layer according to Embodiment 5.

FIG. 41 is a schematic plan view of the second insulating layer 46 according to Embodiment 5. The second insulating layer 46 includes the aperture 461 and the non-aperture 462. The aperture 461 has a rectangular shape. The aperture 461 according to this embodiment is about a half part of the upper side of the aperture 461 (see FIG. 6) according to Embodiment 1. As described above, the positions and the shapes of the aperture 461 and the light emitting part 17 match each other.

As described above, in the display apparatus 10 according to this embodiment, the whole area of the aperture 461 faces the second metal plate 352 across the first electrode 18.

In this embodiment, the whole light emitting part 17 is positioned on the upper side of the second metal plate 352. In other words, on the lower side of the light emitting part 17, the space between the first metal plate 351 and the second metal plate 352 is not positioned. In addition, on the lower side of the light emitting part 17, the second conduction part 66 is not positioned as well. Accordingly, each layer such as the first electrode 18 of the light emitting part 17 and the organic light emitting layer 47 store a flat state.

As described above, the display apparatus 10 includes the second insulating layer 46 of a planar shape including the aperture 461 outputting light emission of the organic light emitting diode 97 to the outside and the non-aperture 462 that is not open. The second insulating layer 46 is disposed on a layer different from a layer in which the first metal plate 351 and the second metal plate 352 are disposed. The non-aperture 462 covers the space between the first metal plate 351 and the second metal plate 352.

According to this embodiment, the display apparatus 10 in which the luminance of the light emitting part 17 inside one organic light emitting diode 97 is uniform can be provided. Accordingly, the display apparatus 10 improving luminance uniformity can be provided.

In this embodiment, the first insulating layer 43 inside the light emitting part 17 is flat, and thus, an effect of preventing an occurrence of a short circuit between the first electrode 18 and the second electrode 19 can be realized as well.

The manufacturing flow of the display apparatus 10 according to this embodiment is the same as the manufacturing flow of the display apparatus 10 according to Embodiment 1 described with reference to FIG. 14. FIGS. 42 to 48 are schematic diagrams that illustrate a process of manufacturing a display panel according to Embodiment 5. An overview of a method of manufacturing the display panel used in the display apparatus 10 according to this embodiment will be described with reference to FIGS. 14 and 42 to 48.

Up to Step S503, the process is the same as that according to Embodiment 1, and thus, description thereof will not be presented.

Figure 42:
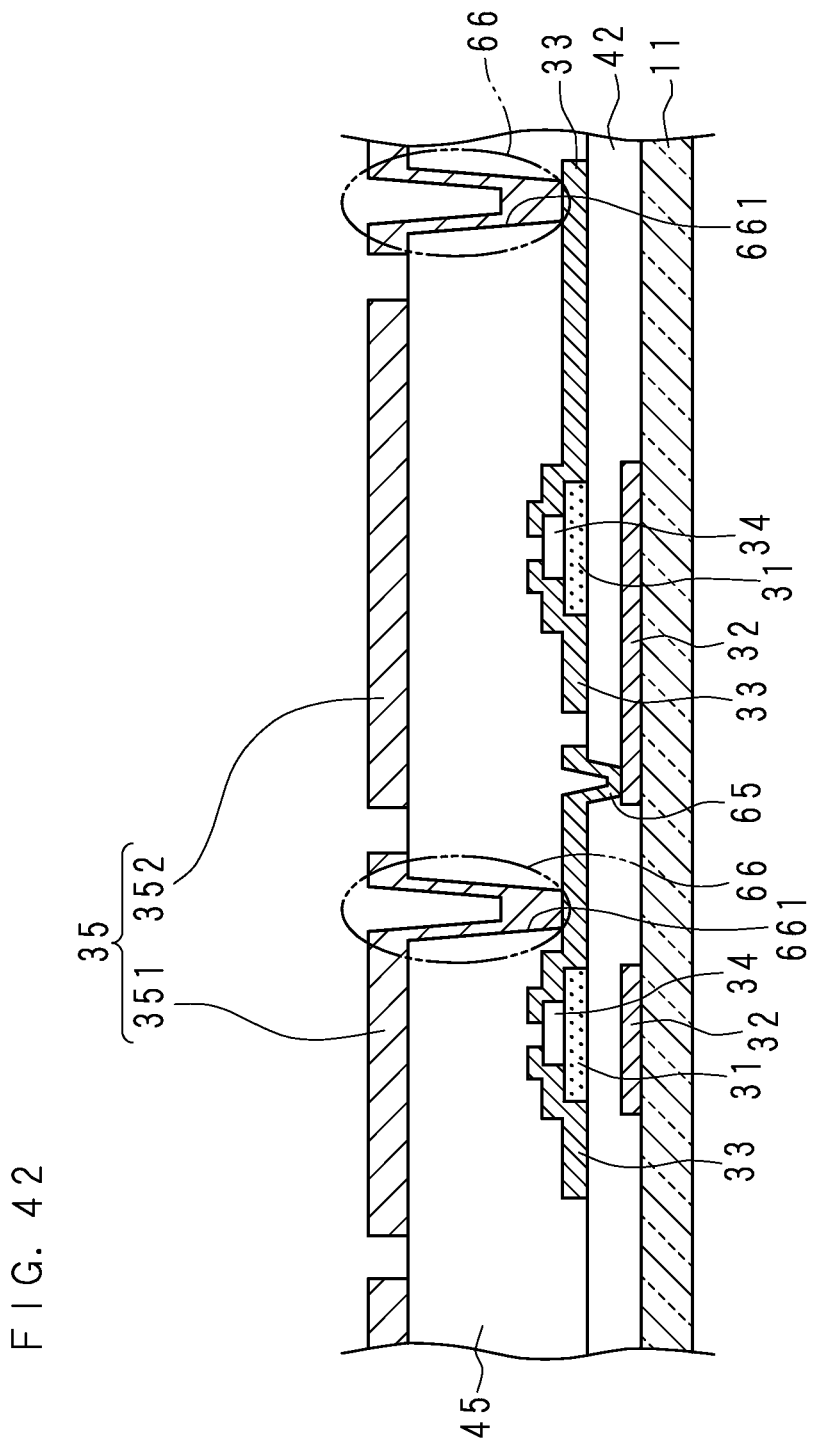
FIG. 42 is a schematic diagram that illustrates the manufacturing process of a display panel according to Embodiment 5.

As illustrated in the cross-sectional view of FIG. 42, the manufacturing apparatus forms a metal plate layer 35 of a predetermined shape by using a sputtering method, a photolithographic method, and the like (step S504). The metal plate layer 35 includes the first metal plate 351 and the second metal plate 352. As described above, the metal plate layer 35 is a conductor.

In this embodiment, as described above, a case is illustrated as an example in which if a certain dent or the like is present, a layer is formed according to such a dent or the like. Accordingly, a layer of a conductor is formed on the inner face of the second contact hole 661. The layer of the conductor forms the second conduction part 66 that connects the metal plate layer 35 and the source drain 33. In a center part of the second conduction part 66, a hole remains.

Figure 43:
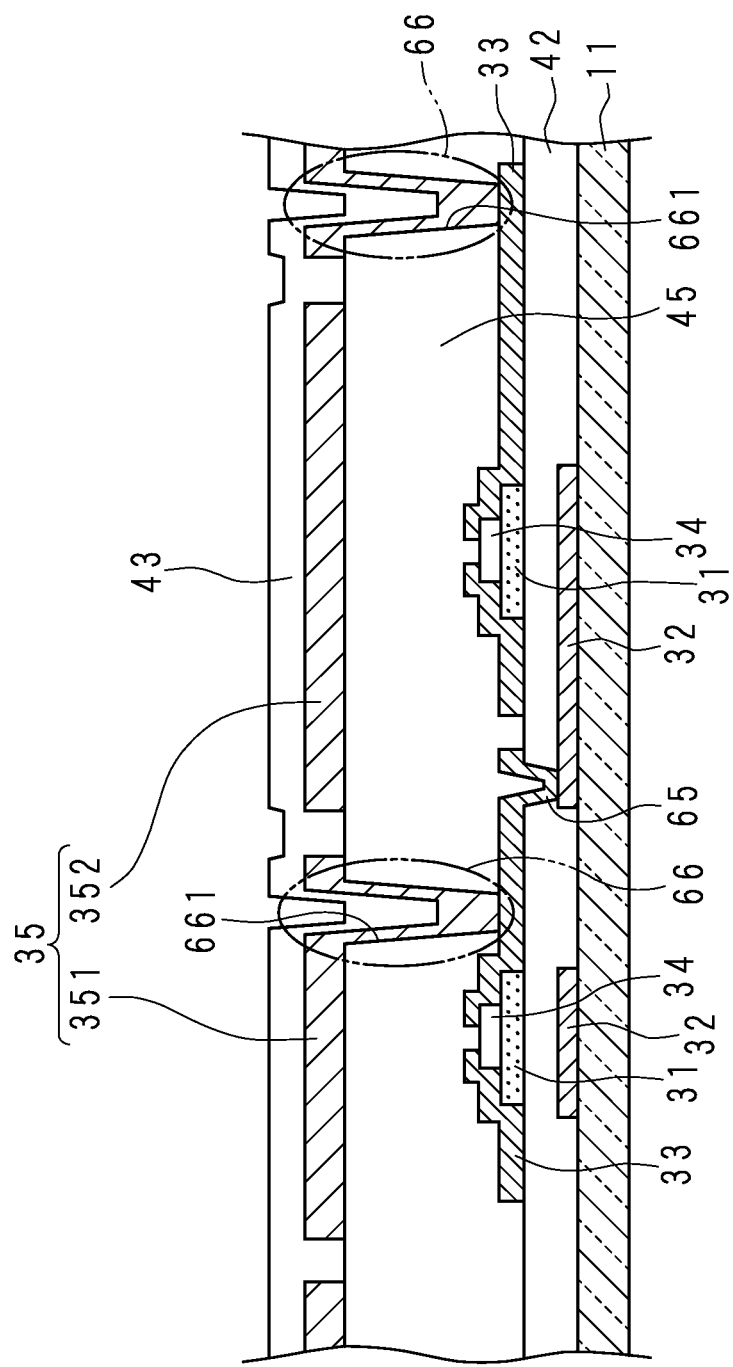
FIG. 43 is a schematic diagram that illustrates the manufacturing process of the display panel according to Embodiment 5.

As illustrated in the cross-sectional view of FIG. 43, the manufacturing apparatus forms the first insulating layer 43 by using a CVD method or the like (step S505).

In this embodiment, a layer of a conductor is formed on the inner face of a hole disposed in the center part of the second conduction part 66. In the center part of the second conduction part 66, a hole that is shallower than the hole illustrated in FIG. 43 remains. In addition, between the first metal plate 351 and the second metal plate 352, a dent of a groove shape is generated in the first insulating layer 43.

Figure 44:
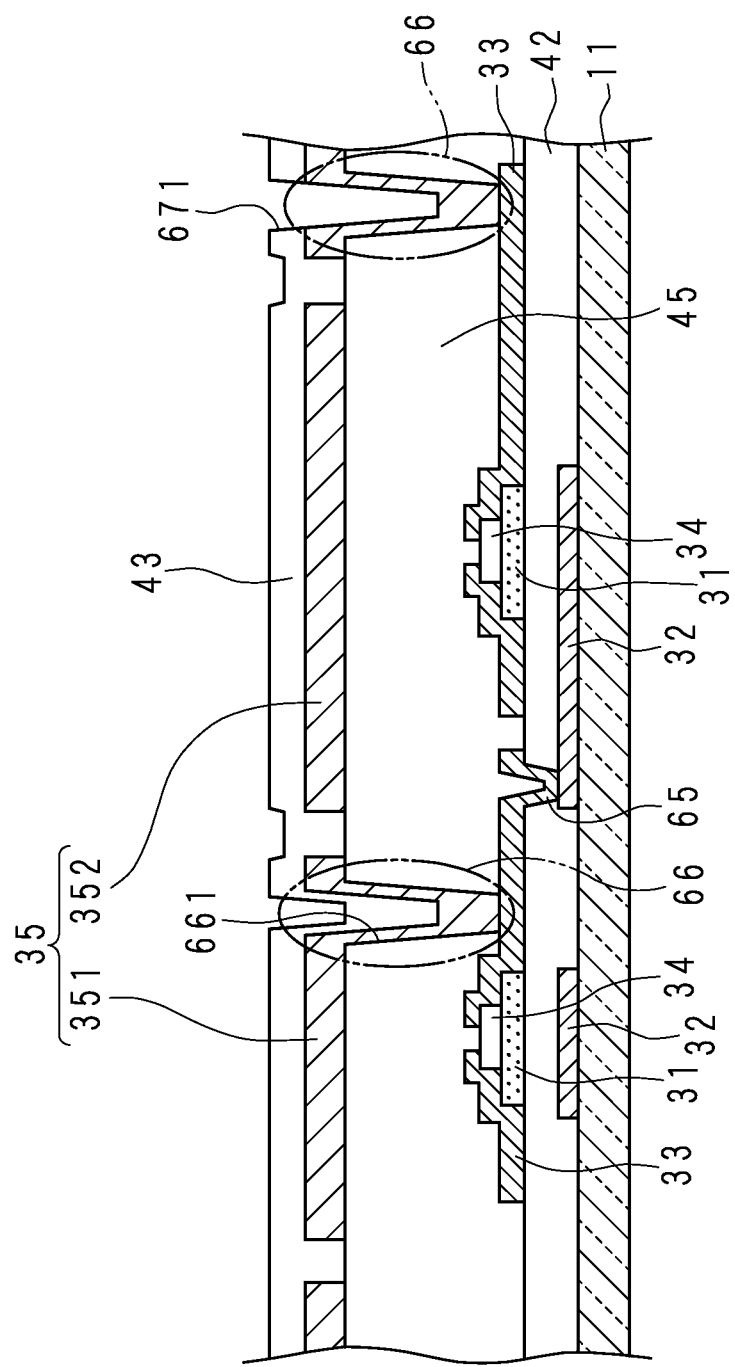
FIG. 44 is a schematic diagram that illustrates the manufacturing process of the display panel according to Embodiment 5.

As illustrated in the cross-sectional view of FIG. 44, the manufacturing apparatus forms the third contact hole 671 that passes through the front face of the first insulating layer 43 to a part disposed above the second conduction part 66 disposed on the right side by using a dry etching method or the like. On the inner face of the third contact hole 671, a conductor that is the material of the metal plate layer 35 is exposed.

Figure 45:
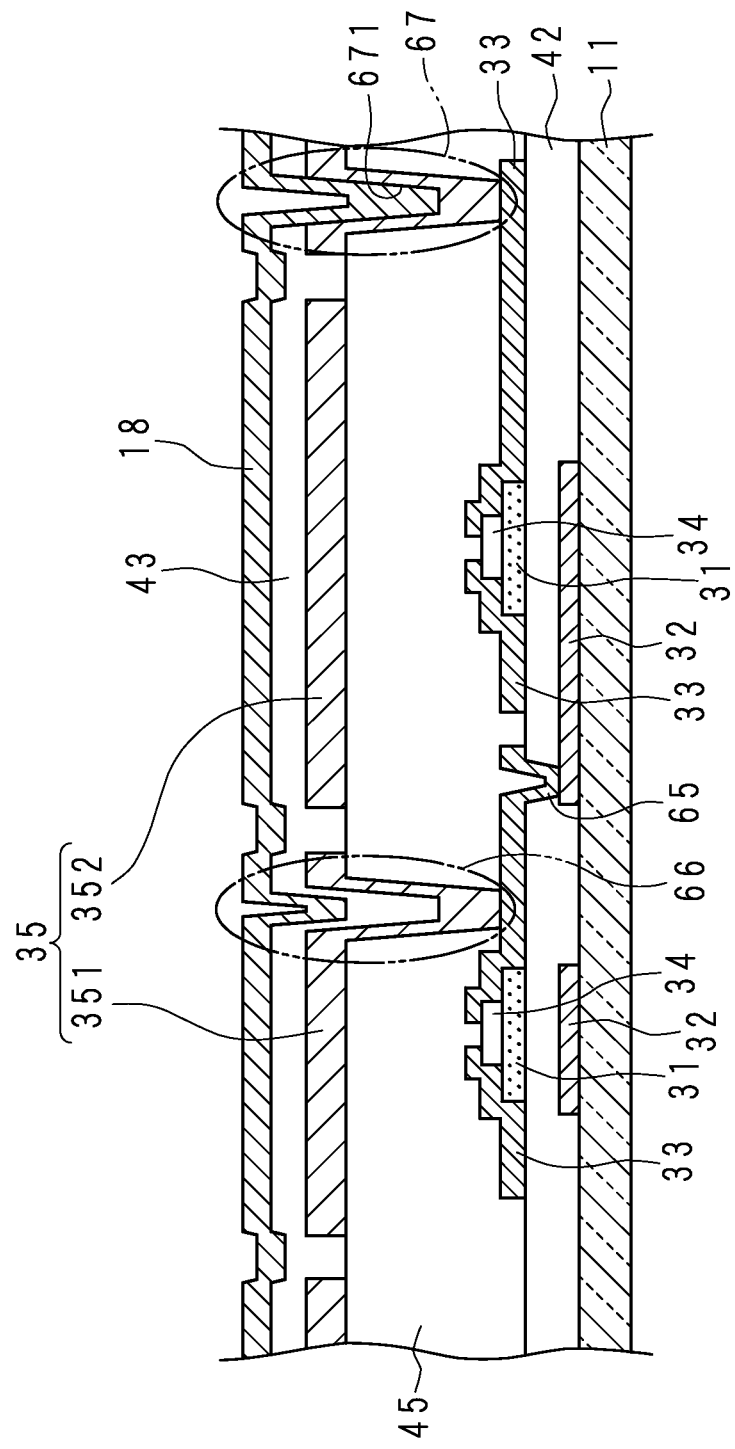
FIG. 45 is a schematic diagram that illustrates the manufacturing process of the display panel according to Embodiment 5.

As illustrated in the cross-sectional view of FIG. 45, the manufacturing apparatus forms the first electrode 18 of a predetermined shape by using a sputtering method, a photolithographic method, and the like (step S506).

In this embodiment, a layer of a conductor is formed on the inner face of the hole formed in the center part of the third contact hole 671. The layer of the conductor forms the third conduction part 67 that is connected to the second conduction part 66 disposed on the lower side and connects the first electrode 18 and the source drain 33.

Figure 46:
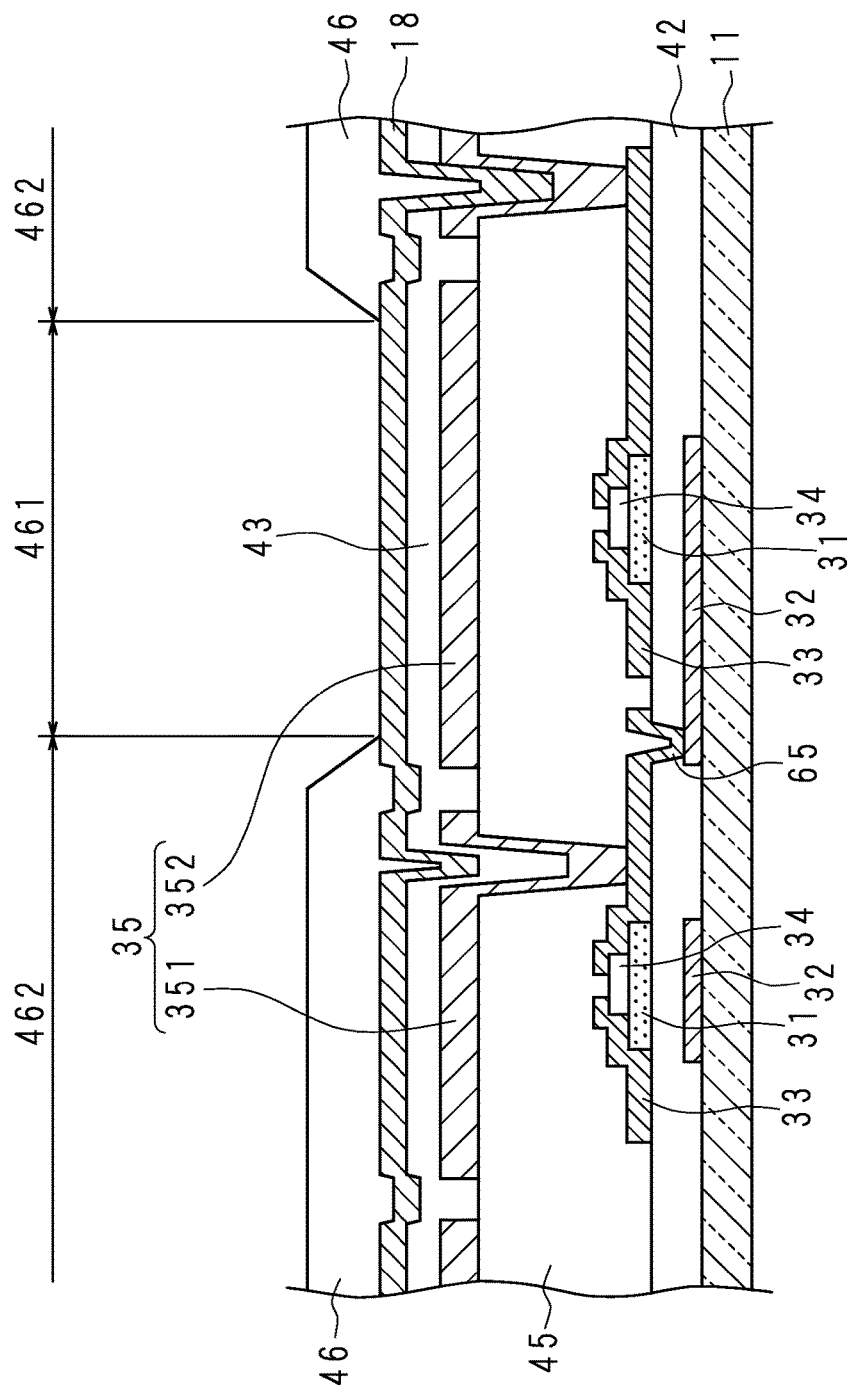
FIG. 46 is a schematic diagram that illustrates the manufacturing process of the display panel according to Embodiment 5.
Figure 47:
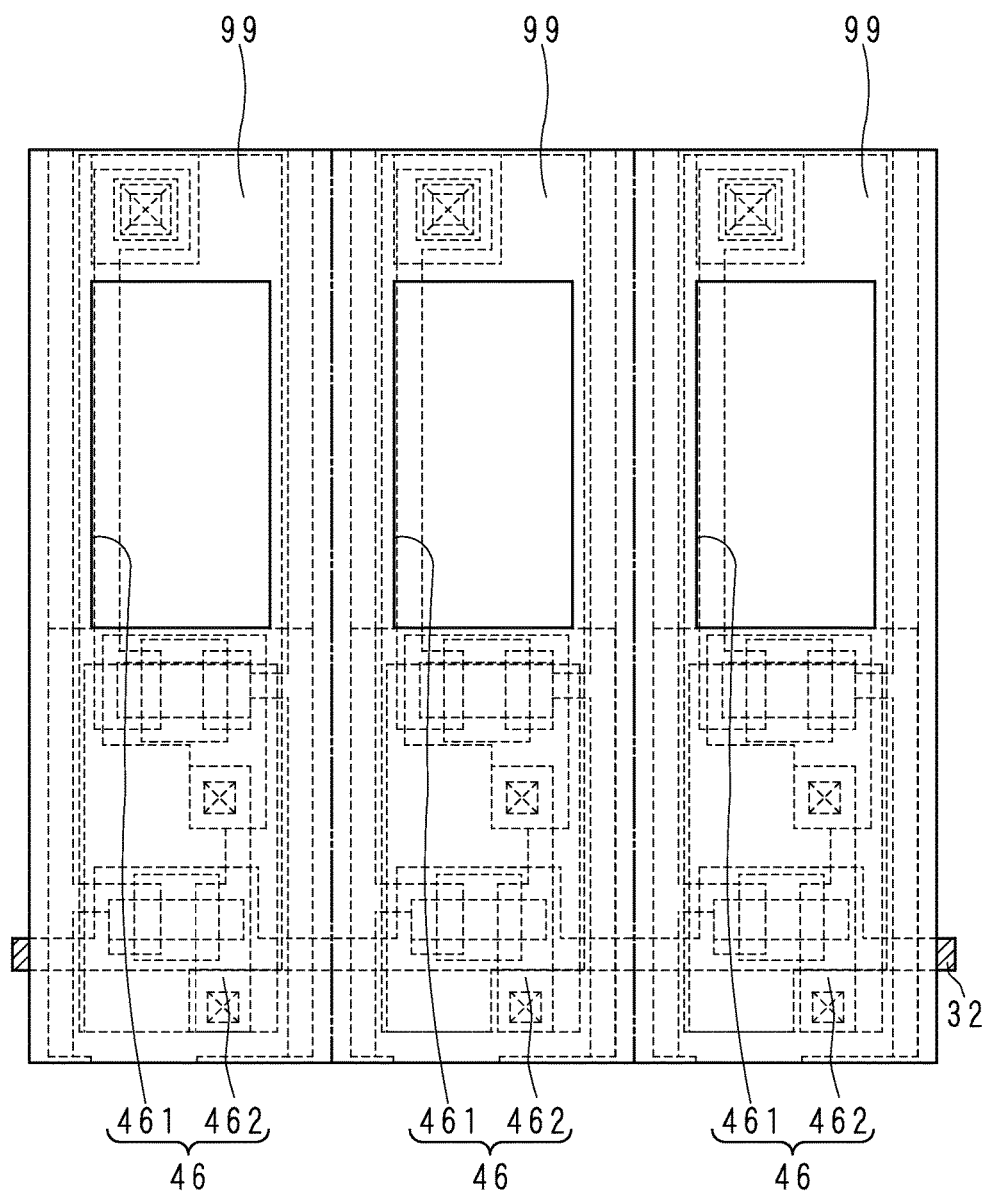
FIG. 47 is a schematic diagram that illustrates the manufacturing process of the display panel according to Embodiment 5.

As illustrated in the cross-sectional view of FIG. 46, the manufacturing apparatus forms the second insulating layer 46 of a predetermined shape by using a CVD method, a dry etching method, and the like (step S507). FIG. 47 is a schematic plan view of the display apparatus 10 that is in the stage illustrated in FIG. 46. FIG. 47 illustrates the same part as that illustrated in FIG. 5. As described above, the second insulating layer 46 includes the aperture 461 and the non-aperture 462. The aperture 461 covers about an upper half of the center part disposed on the upper side of the first electrode 18. The non-aperture 462 covers the boundary part between subpixels 99, an about lower half of the first electrode 18, and the edge of the first electrode 18.

Figure 48:
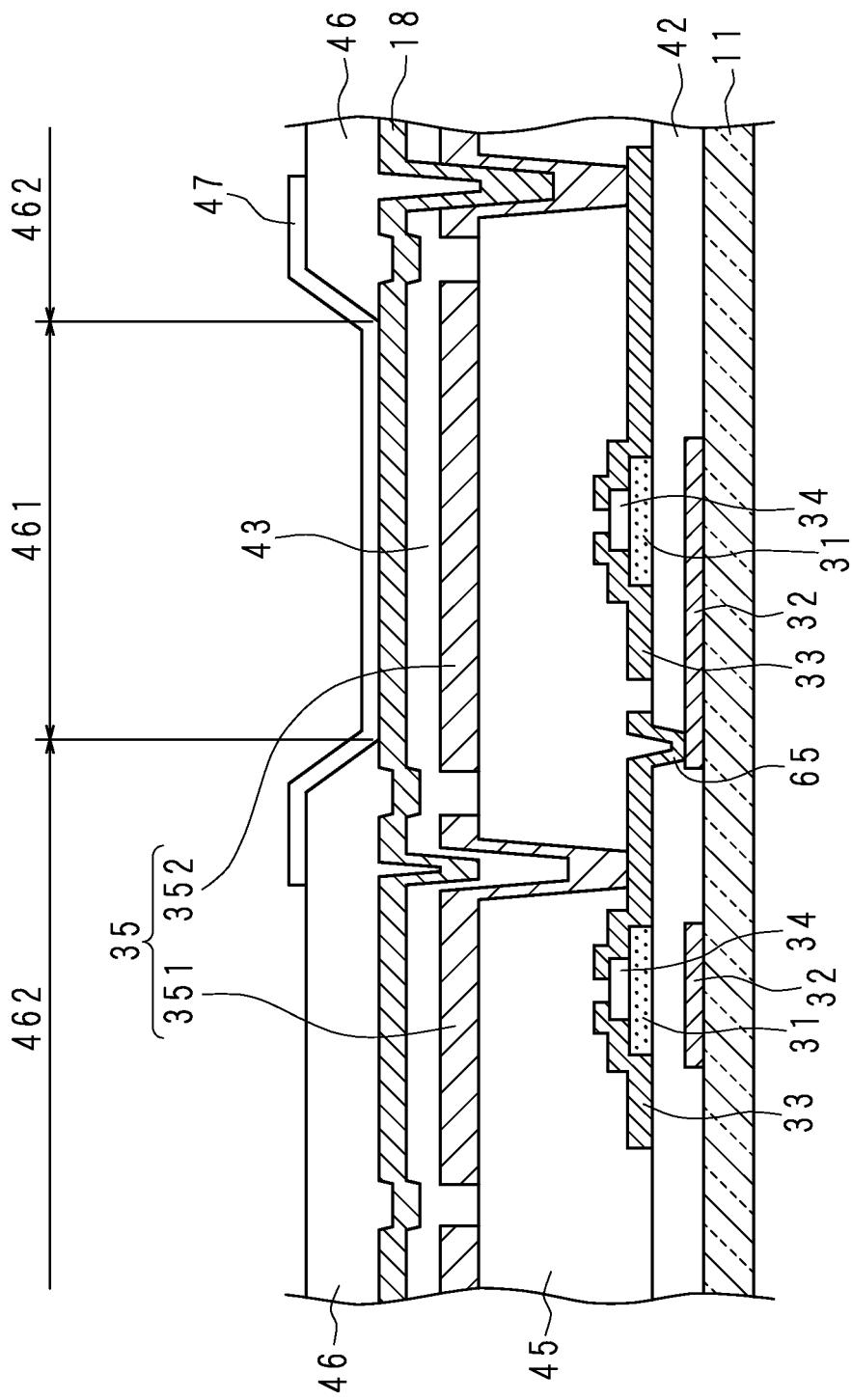
FIG. 48 is a schematic diagram that illustrates the manufacturing process of the display panel according to Embodiment 5.

As illustrated in the cross-sectional view of FIG. 48, the manufacturing apparatus forms the organic light emitting layer 47 using a vapor deposition method or a coating method (step S508). The organic light emitting layer 47 covers the aperture 461.

Step S509 and subsequent steps are similar to those of the manufacturing process described in Embodiment 1, and thus, description thereof will not be presented.

As described above, in this embodiment, a case has been described as an example in which, on a dented part, a layer in a state in which the upper face is dented is formed. According to this embodiment, even in such a case, the luminance uniformity of the display apparatus 10 can be improved.

Embodiment 6

This embodiment relates to a display apparatus 10 in which the whole area of the aperture 461 faces the first metal plate 351. Here, description of parts that are common to Embodiment 5 will not be presented.

Figure 49:
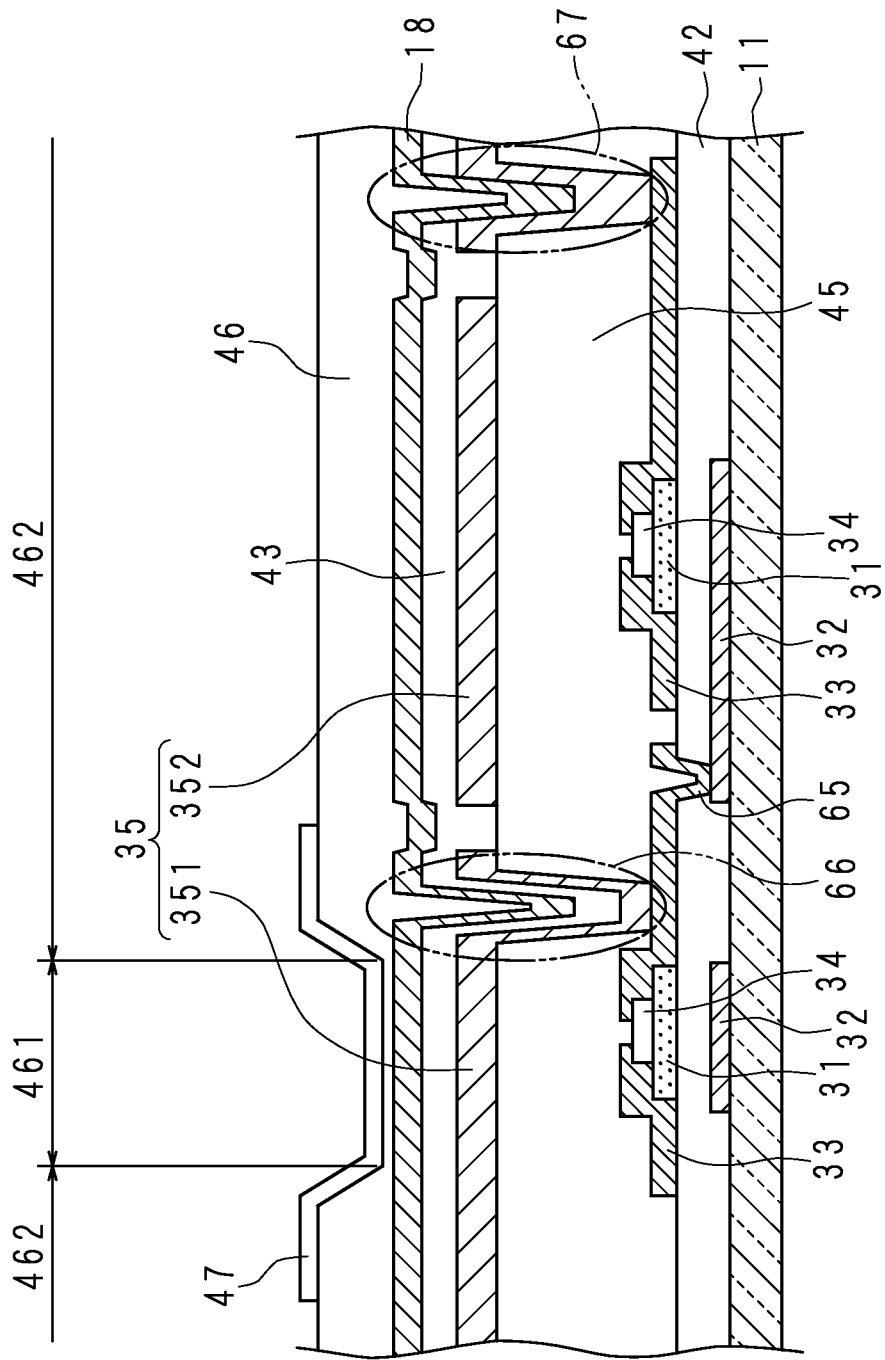
FIG. 49 is a schematic cross-sectional view of an example of non-limiting display apparatus according to Embodiment 6.

FIG. 49 is a schematic cross-sectional view of an example of non-limiting display apparatus 10 according to Embodiment 6. FIG. 49 illustrates a part corresponding to one organic light emitting diode 97 in an enlarged scale. In FIG. 49, the second substrate 12, the space 27, and the second electrode 19 are not illustrated.

The aperture 461 of the second insulating layer 46 is positioned only on the upper side of the first metal plate 351. In other words, the upper side of the second metal plate 352 is positioned on the lower side of the non-aperture 462 of the second insulating layer 46.

Figure 50:
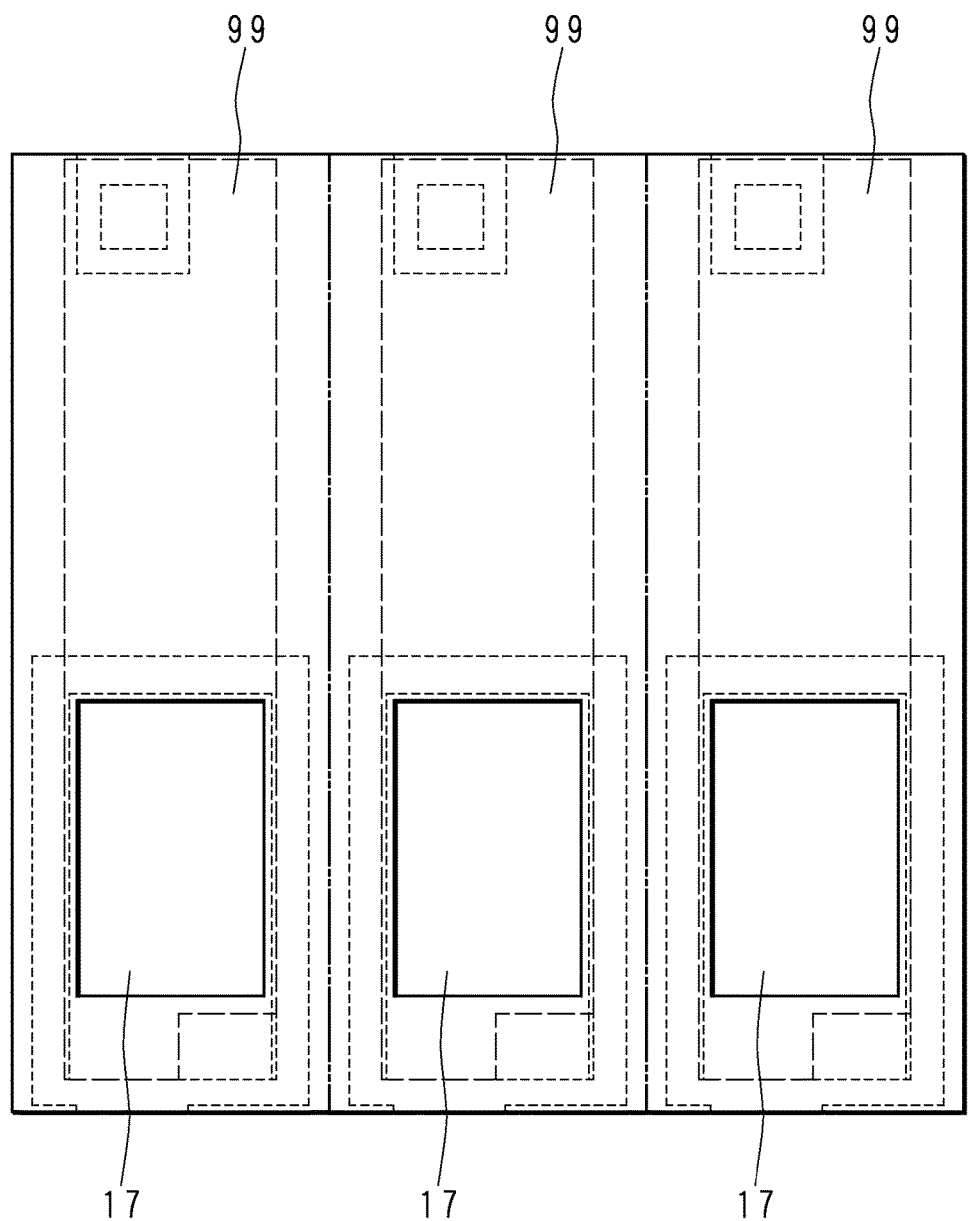
FIG. 50 is a schematic plan view of a pixel according to Embodiment 6.

FIG. 50 is a schematic plan view of the pixel 90 according to Embodiment 6. FIG. 50 illustrates the same range as that illustrated in FIG. 5. The light emitting part 17 is positioned on the lower side of the subpixel 99.

As described above, in the display apparatus 10 according to this embodiment, the whole area of the aperture 461 faces the first metal plate 351 across the first electrode 18.

In this embodiment, the whole light emitting part 17 is positioned on the upper side of the first metal plate 351. In other words, on the lower side of the light emitting part 17, the space between the first metal plate 351 and the second metal plate 352 is not positioned. In addition, on the lower side of the light emitting part 17, the second conduction part 66 is not positioned as well. Accordingly, each layer such as the first electrode 18 of the light emitting part 17 and the organic light emitting layer 47 store a flat state.

According to this embodiment, the display apparatus 10 in which the luminance of the light emitting part 17 inside one organic light emitting diode 97 is uniform can be provided. Accordingly, the display apparatus 10 improving the luminance uniformity can be provided.

In this embodiment, the first insulating layer 43 inside the light emitting part 17 is flat, and thus, an effect of preventing an occurrence of a short circuit between the first electrode 18 and the second electrode 19 can be realized as well.

Embodiment 7

This embodiment relates to a display apparatus 10 in which the aperture 461 includes an area facing the first metal plate 351 and an area facing the second metal plate 352. Here, description of parts that are common to Embodiment 5 will not be presented.

Figure 51:
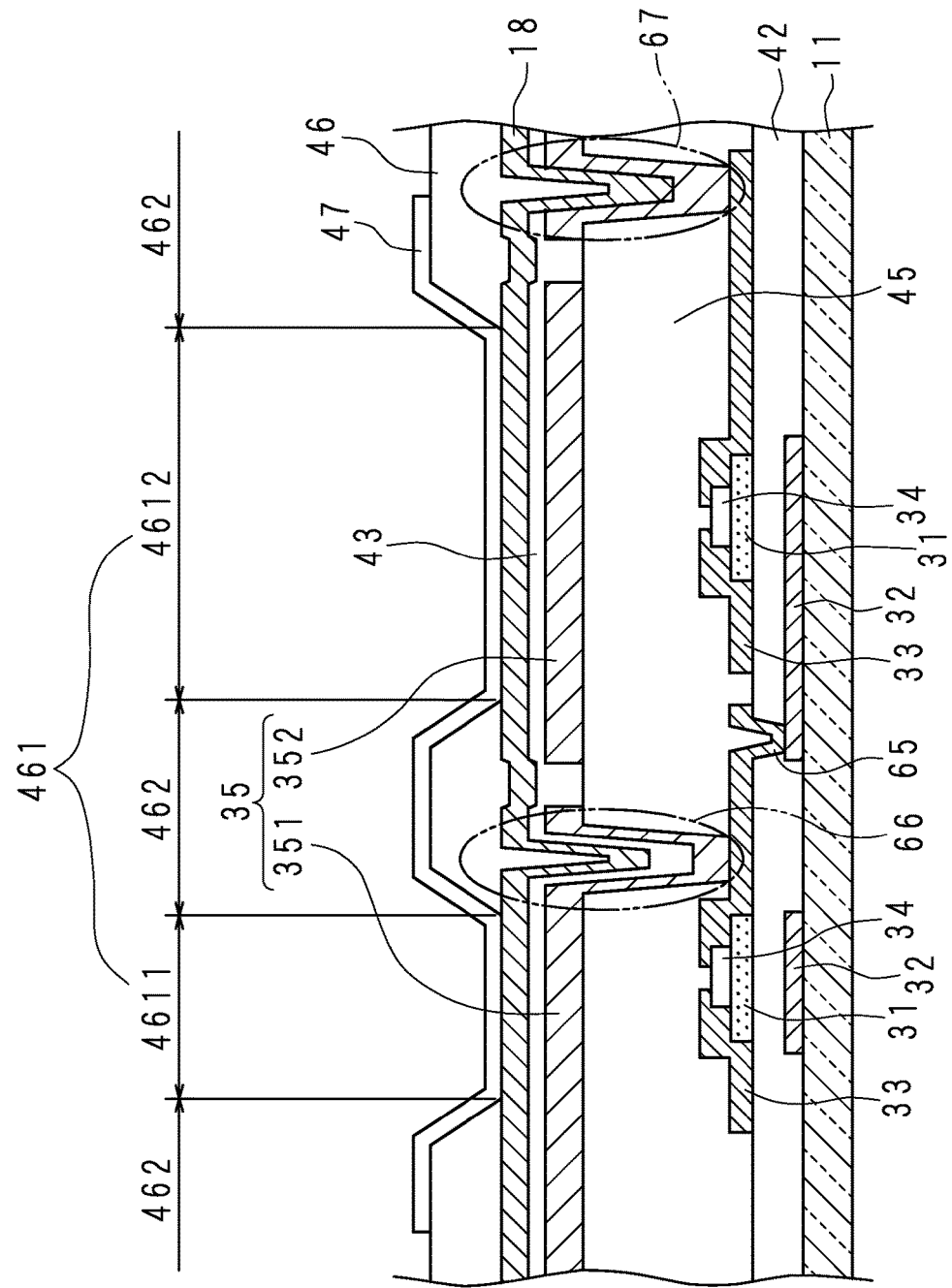
FIG. 51 is a schematic cross-sectional view of an example of non-limiting display apparatus according to Embodiment 7.

FIG. 51 is a schematic cross-sectional view of an example of non-limiting display apparatus 10 according to Embodiment 7. FIG. 51 illustrates a part corresponding to one organic light emitting diode 97 in an enlarged scale. In FIG. 51, the second substrate 12, the space 27, and the second electrode 19 are not illustrated.

The aperture 461 of the second insulating layer 46 includes a first aperture 4611 and a second aperture 4612. The first aperture 4611 is positioned only on the upper side of the first metal plate 351. The second aperture 4612 is positioned only on the upper side of the second metal plate 352. The organic light emitting layer 47 covers both the first aperture 4611 and the second aperture 4612.

Figure 52:
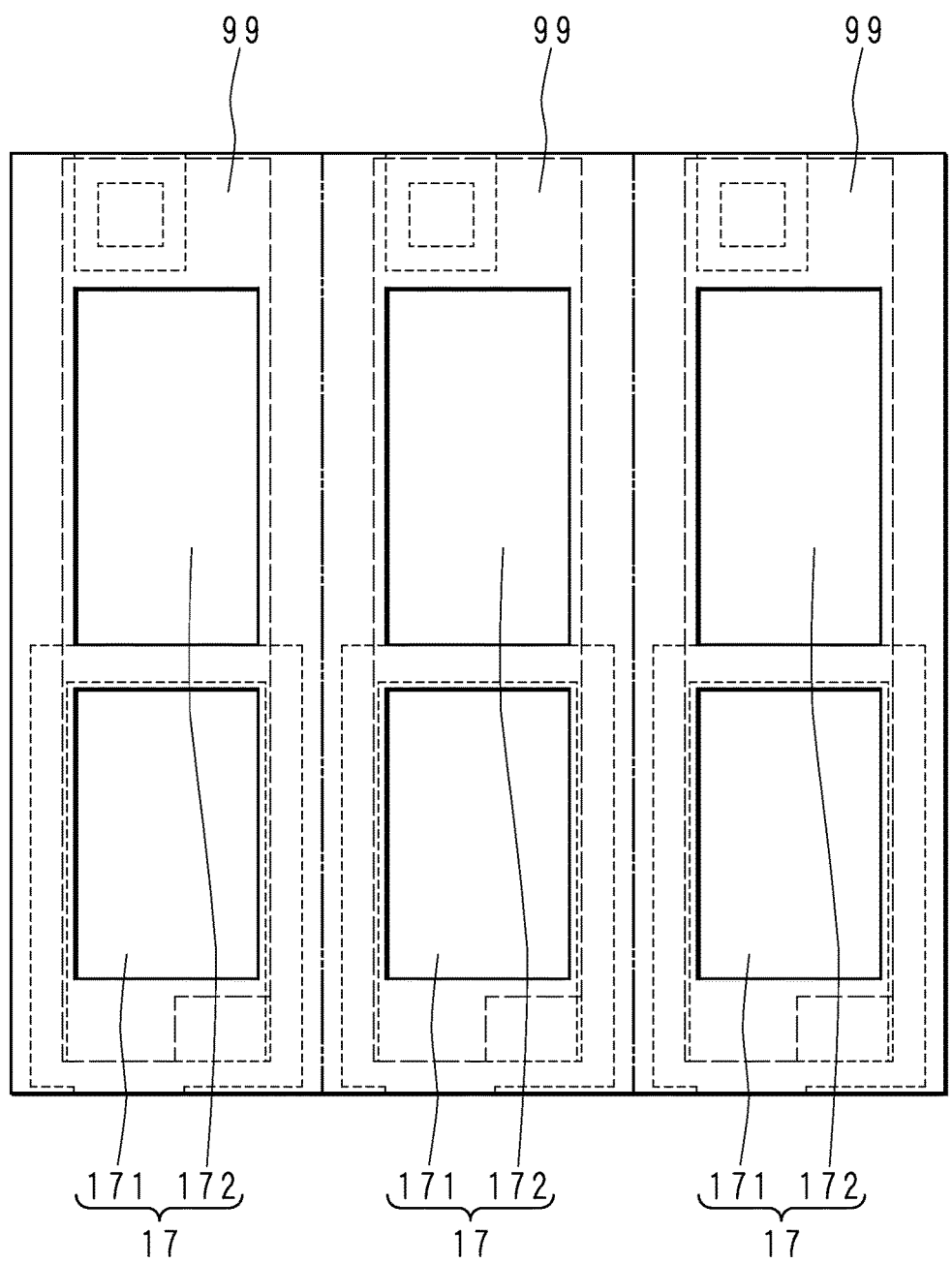
FIG. 52 is a schematic plan view of a pixel according to Embodiment 7.

FIG. 52 is a schematic plan view of the pixel 90 according to Embodiment 7. FIG. 52 illustrates the same range as that illustrated in FIG. 5. One subpixel 99 includes one first light emitting part 171 and one second light emitting part 172. The first light emitting part 171 is positioned on the upper side of the subpixel 99. The second light emitting part 172 is positioned on the lower side of the subpixel 99.

The first aperture 4611 is an example of a first area of the aperture 461 according to this embodiment. The second aperture 4612 is an example of a second area of the aperture 461 according to this embodiment. The first aperture 4611 and the second aperture 4612 do not overlap each other.

As described above, the aperture 461 according to this embodiment includes the first area and the second area not overlapping each other. In the display apparatus 10 according to this embodiment, the first area faces the first metal plate 351 across the first electrode 18, and the second area faces the second metal plate 352 across the first electrode 18.

In this embodiment, the whole light emitting part 17 is positioned on the upper side of the first metal plate 351 or the second metal plate 352. In other words, on the lower side of the light emitting part 17, the space between the first metal plate 351 and the second metal plate 352 is not positioned. In addition, on the lower side of the light emitting part 17, the second conduction part 66 is not positioned as well. Accordingly, each layer such as the organic light emitting layer 47 and the first electrode 18 of the light emitting part 17 store a flat state.

In addition, the area of the light emitting part 17 according to this embodiment occupies a higher ratio with respect to the area of the subpixel 99 than that of the light emitting part 17 according to Embodiment 5 or 6. Accordingly, the subpixel 99 having high emission luminance can be realized.

According to this embodiment, the display apparatus 10, in which the luminance of the light emitting part 17 inside one organic light emitting diode 97 is uniform, having high emission luminance can be provided. Accordingly, the display apparatus 10 displaying a bright image having the improved luminance uniformity can be provided.

In this embodiment, the first insulating layer 43 inside the light emitting part 17 is flat, and thus, an effect of preventing an occurrence of a short circuit between the first electrode 18 and the second electrode 19 can be realized as well.

Embodiment 8

Figure 53:
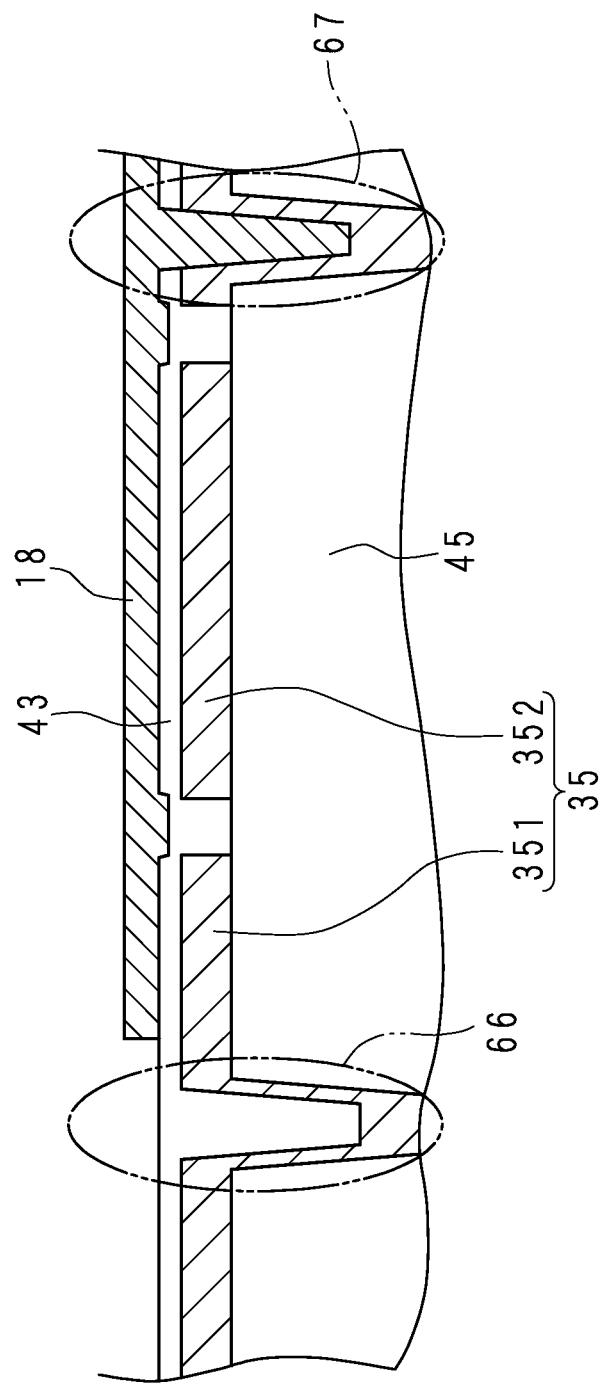
FIG. 53 is a schematic cross-sectional view of an example of non-limiting display apparatus according to Embodiment 8.
Figure 54:
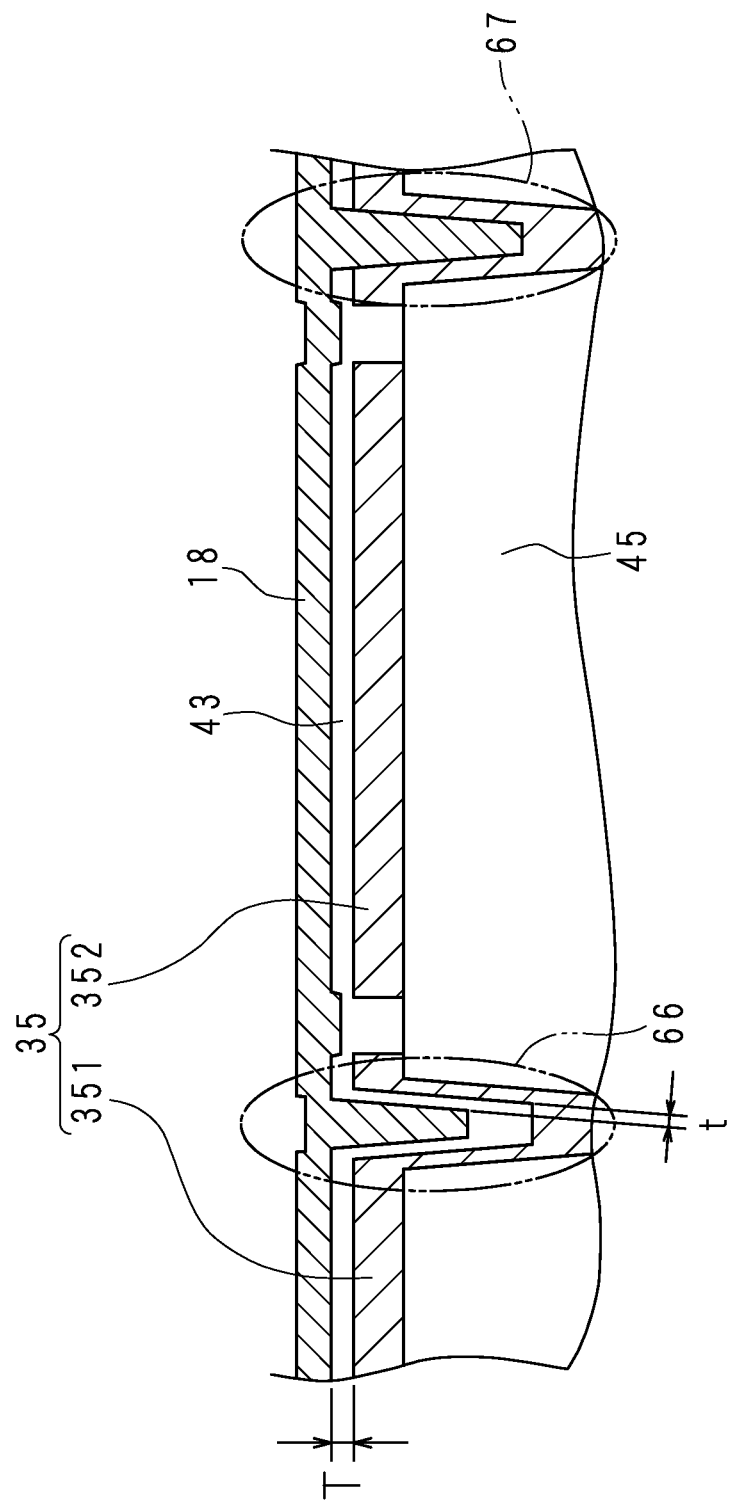
FIG. 54 is a schematic cross-sectional view of a display apparatus of a comparative example of Embodiment 8.

This embodiment relates to a display apparatus 10 in which the second conduction part 66 is disposed on the outer side of the first electrode 18. Here, description of parts that are common to Embodiment 1 will not be presented. FIG. 53 is a schematic cross-sectional view of an example of non-limiting display apparatus 10 according to Embodiment 8. FIG. 54 is a schematic cross-sectional view of the display apparatus 10 of a comparative example of Embodiment 8. FIGS. 53 and 54 are diagrams that illustrate a part of one organic light emitting diode 97 near a metal plate layer 35 in an enlarged scale.

In the comparative example illustrated in FIG. 54, the first electrode 18 extends to the upper side of the second conduction part 66. Inside the second conduction part 66 of the comparative example, a distance between the metal plate layer 35 and the first electrode 18, in other words, the thickness t of the first insulating layer 43 is smaller than the thickness T of the original first insulating layer 43.

In this embodiment, as illustrated in FIG. 53, the second conduction part 66 is disposed on the outer side of the first electrode 18. In other words, the first electrode 18 does not cover the upper side of the second conduction part 66. Accordingly, a short circuit between the metal plate layer 35 and the first electrode 18 can be prevented.

Here, the second conduction part 66 connects the metal plate layer 35 and the source drain 33 (see FIG. 4). The second conduction part 66 illustrated on the left side in FIG. 53, for example, is connected to a source electrode that is a part of the source drain 33.

As described above, the first metal plate 351 is connected to the source electrode. The contact hole of the first metal plate 351 and the source electrode is not covered with the first electrode 18.

Embodiment 9

This embodiment relates to a display apparatus 10 using five transistors and configuring the fixed electric potential line VFIX (see FIG. 3) connected to the second capacitor 92 to be common to the low-electric potential line ELVSS. Description of parts common to Embodiment 1 will not be presented.

Figure 55:
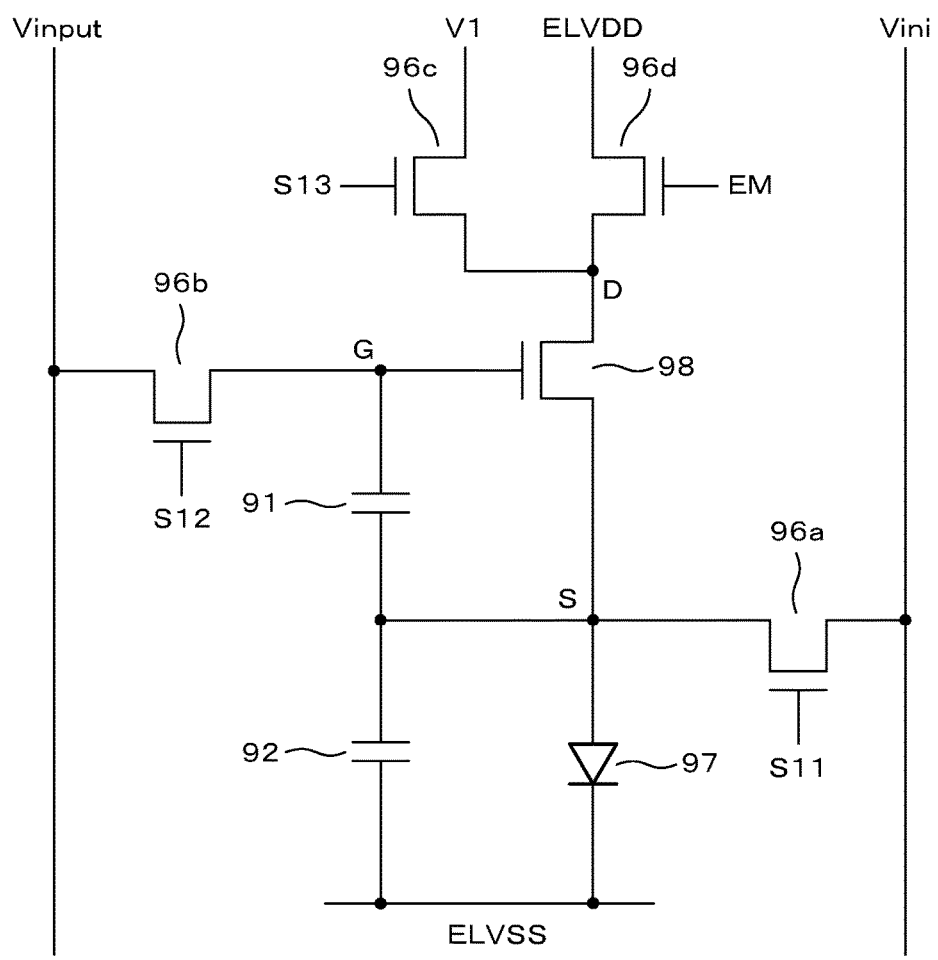
FIG. 55 is an equivalent circuit diagram that illustrates a circuit driving an organic light emitting diode, according to Embodiment 9.

FIG. 55 is an equivalent circuit diagram that illustrates a circuit driving an organic light emitting diode 97, according to Embodiment 9. The circuit illustrated in FIG. 55 is a part of a pixel circuit included in the subpixel 99.

The circuit illustrated in FIG. 55 includes an organic light emitting diode 97, the first capacitor 91, the second capacitor 92, switch transistors 96a, 96b, 96c, and 96d, and the drive transistor 98. The high-power source line ELVDD, the low-power source line ELVSS, the input line Vinput, an initialization power source line Vini, and a setting power source line V1 are connected to the circuit illustrated in FIG. 55. The drive transistor 98 and the switch transistors 96a, 96b, 96c, and 96d according to this embodiment are N-type TFTs.

The initialization power source line Vini is connected to a drain electrode of the switch transistor 96a. A switch line S11 is connected to a gate electrode of the switch transistor 96a. The voltage (an example of a second voltage) of the initialization power source line Vini is a voltage less than a sum of a voltage Vth-oled (the threshold voltage of an organic light emitting diode 97) corresponding to an emission threshold of the organic light emitting diode 97 and the voltage of the low-power source line ELVSS (in other words, Vini−ELVSS<Vth−oled). Accordingly, during an initialization period, useless light emission of the organic light emitting diode 97 can be prevented.

The input line Vinput is connected to the data driver 22. The input line Vinput is connected to a drain electrode of the switch transistor 96b. A switch line S12 is connected to a gate electrode of the switch transistor 96b. The voltage of the input line Vinput is alternately changed to one of a reference voltage Vref that is an example of a third voltage and a data voltage Vdata that is a voltage representing the emission luminance at the time of driving the organic light emitting diode 97. Here, the reference voltage Vref is a voltage having a value larger than a sum of the threshold voltage Vth of the drive transistor 98 and the voltage of the initialization power source line Vini (in other words, Vref>Vth+Vini). Accordingly, the circuit proceeds to a Vth compensation period T1 in the state that the drive transistor 98 is in ON state.

The high-power source line ELVDD is connected to a drain electrode of the switch transistor 96d. A gate electrode of the switch transistor 96d is connected to a switch line EM. The switch line EM is connected to an emission driver 23. A signal is input to the gate electrode of the switch transistor 96d from the emission driver 23 through the switch line EM. According to this signal, the light emission time of the organic light emitting diode 97 is controlled. The drain electrode of the drive transistor 98 is connected to a source electrode of the switch transistor 96c and a source electrode of the switch transistor 96d.

The setting power source line V1 is connected to a drain electrode of the switch transistor 96c. A gate electrode of the switch transistor 96c is connected to the switch line S13. The voltage (an example of a fourth voltage) of the setting power source line V1 is a voltage of equal to or more than a voltage acquired by subtracting the threshold voltage Vth of the drive transistor 98 from the reference voltage Vref (in other words, V1≥Vref−Vth).

The low-power source line ELVSS is connected to the cathode electrode of the organic light emitting diode 97 and the first terminal of the second capacitor 92.

A source electrode of the switch transistor 96b is connected to the first terminal of the first capacitor 91 and the gate electrode of the drive transistor 98. The first terminal of the first capacitor 91 is connected to the gate electrode of the drive transistor 98. The source electrode of the drive transistor 98 is connected to the second terminal of the first capacitor 91, the second terminal of the second capacitor 92, a source electrode of the switch transistor 96a, and an anode electrode of the organic light emitting diode 97.

The organic light emitting diode 97 emits light based on signals input from switch lines S11, S12, and S13, and EM and the input line Vinput.

The operations of the switch transistors 96a, 96b, 96c, and 96d and the drive transistor 98 will be described in detail. Here, in description presented below, a part at which the gate electrode of the drive transistor 98, the first terminal of the first capacitor 91, and the source electrode of the switch transistor 96b are connected will be referred to as a point G. In addition, a part at which the source electrode of the drive transistor 98, a part between the first capacitor 91 and the second capacitor 92, the anode electrode of the organic light emitting diode 97, and a source electrode of the switch transistor 96a are connected will be referred to as a point S. Furthermore, a part at which the drain electrode of the drive transistor 98, the source electrode of the switch transistor 96c, and the source electrode of the switch transistor 96d are connected will be referred to as a point D. The electric potential of the point S will be represented as VS, the electric potential of the point G will be represented as VG, and the electric potential of the point D will be represented as VD.

Figure 56:
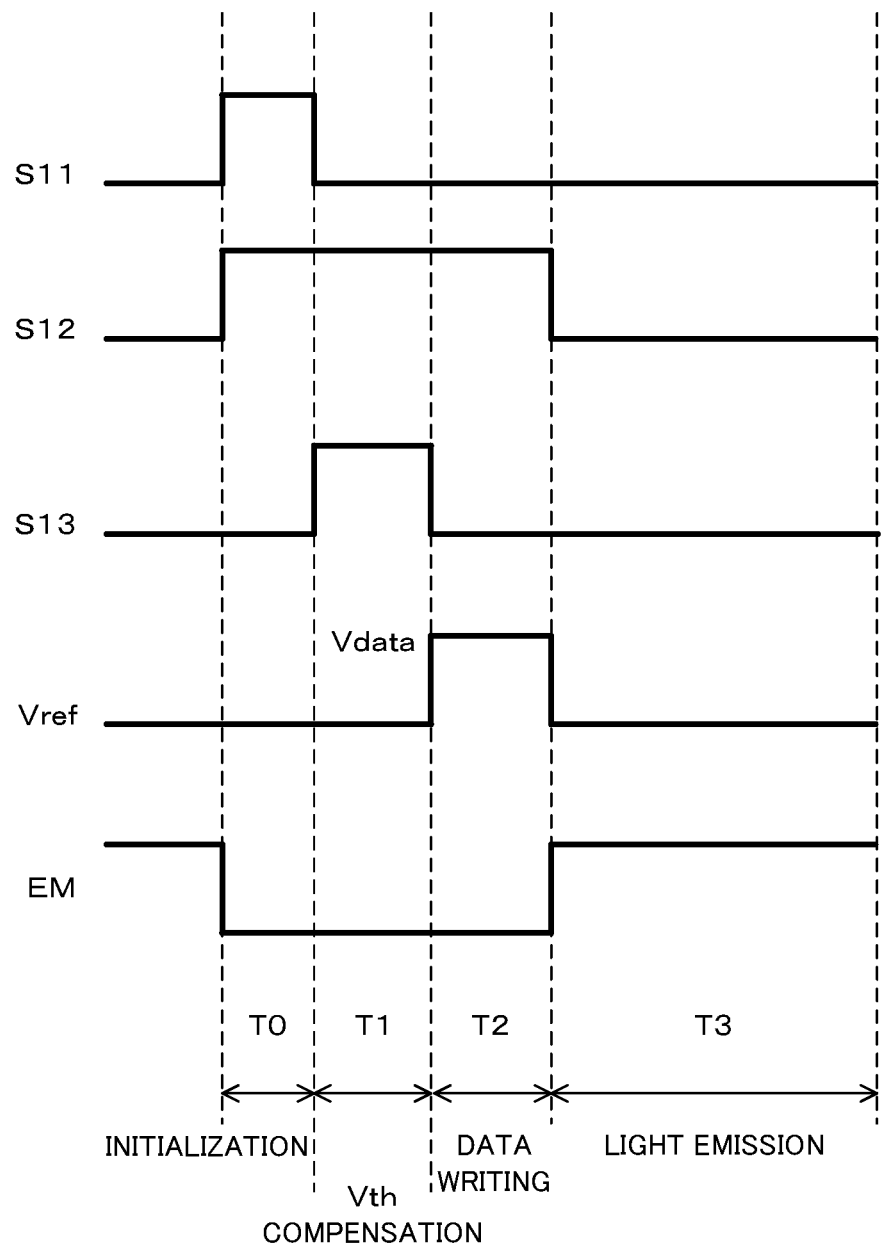
FIG. 56 is a timing diagram relating to driving of the circuit according to Embodiment 9.
Figure 57:
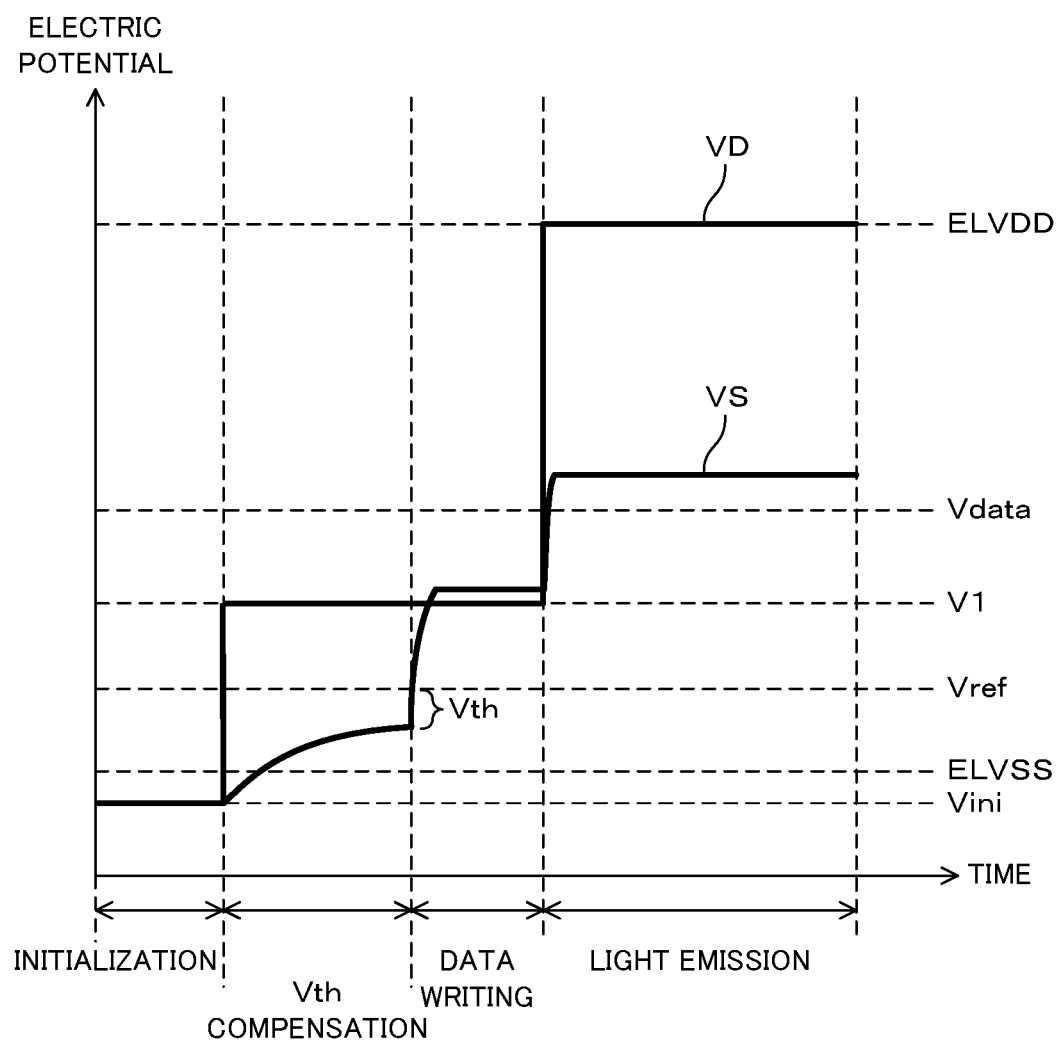
FIG. 57 is a graph that illustrates changes of VD and VS in the circuit according to Embodiment 9.

FIG. 56 is a timing diagram relating to driving of the circuit according to Embodiment 9. FIG. 57 is a graph that illustrates changes of VD and VS in the circuit according to Embodiment 9. In this embodiment, in the light emitting operation of the organic light emitting diode 97, an initialization period T0, a threshold voltage Vth compensation period T1, a data writing period T2, and a light emission period T3 sequentially progress.

As illustrated in FIG. 56, in the initialization period T0, signals input to the switch lines S11 and S12 are at a high level, signals input to the switch lines S13 and EM are at a low level, and the voltage of the input line Vinput is the reference voltage Vref. In the initialization period T0, the switch transistors 96a and 96b are in the ON state, and the switch transistors 96c and 96d, and the drive transistor 98 are in the OFF state. At this time VG=Vref. In addition, as illustrated in FIG. 57, VS=Vini, and VD=VS. As described above, since Vini−ELVSS<Vth−oled, the emission leakage of the organic light emitting diode 97 is prevented. In the initialization period T0, the electric potential of the gate electrode and the source electrode of the drive transistor 98 is initialized.

In the Vth compensation period T1, signals input to the switch lines S12 and S13 are at the high level, signals input to the switch lines S11 and EM are at the low level, and the voltage of the input line Vinput is the reference voltage Vref. In the Vth compensation period T1, the switch transistors 96b and 96c and the drive transistor 98 are in the ON state, and the switch transistors 96a and 96d are in the OFF state. As the drive transistor 98 is in the ON state and is conductive, the electric potential of the point S rises, and an electric potential difference between the point G and the point S converges at the threshold Vth. Accordingly, VG=Vref, and, as illustrated in FIG. 57, VS=Vref−Vth. In addition, VD=V1.

In the data voltage writing period T2, a signal input to the switch line S12 is at the high level, signals input to the switch lines S11, S13, and EM are at the low level, and the voltage of the input line Vinput is Vdata. In the data write period T2, the switch transistor 96b is in the ON state, and the switch transistors 96a, 96c, and 96d and the drive transistor 98 are in the OFF state. Accordingly, the data voltage Vdata is applied between the gate electrode and the source electrode of the drive transistor 98 based on voltage division of the first capacitor 91 and the second capacitor 92 connected in series. Thus, VS=C1/(C1+C2)×Vdata+C2/(C1+C2)×Vref−Vth (Equation (12)), and VG=Vdata. In addition, VD=V1. Here, since VS, similar to Embodiment 2, is acquired through calculation based on the principle of conservation of charge at the point S during the periods T1 and T2, description of the calculation sequence will not be presented.

In the light emission period T3, a signal input to the switch line EM is at the high level, signals input to the switch lines S11, S12, and S13 are at the low level, and the voltage of the input line Vinput is Vref. In the light emission period T3, the switch transistor 96d and the drive transistor 98 are in the ON state, and the switch transistors 96a, 96b, and 96c are in the OFF state. As the switch transistor 96d and the drive transistor 98 become conductive, a current Ioled flows through the organic light emitting diode 97. Here, VD=ELVDD. Since the current Ioled is similar to that of Embodiment 2, detailed description thereof will not be presented.

Here, generally, in the threshold voltage Vth compensation period, a kink effect may easily occur in a case where the gate-to-source voltage is near (Vth+1 to 2 V) the threshold, and, simultaneously, the drain-to-source voltage is increased. Meanwhile by increasing the channel length, the kink effect can be suppressed by weakening an electric field between the drain and the source. However, in such a case, there is a disadvantage for high resolution.

In this embodiment, in the initialization period T0 and the threshold voltage Vth compensation period T1, the drain voltage VD of the drive transistor 98 can be freely set by using the voltage of the setting power source line V1 (here, V1≥Vref−Vth). Accordingly, by lowering the drain-to-source voltage (V1−Vini), a bias stress for the drive transistor 98 can be relieved. Accordingly, the kink effect can be suppressed, and a variation in the threshold Vth of the drive transistor 98 can be suppressed.

In addition, according to this embodiment, since the kink effect is suppressed by lowering the drain-to-source voltage, the channel length can be shortened, and accordingly, there is an advantage for high resolution.

In the initialization period, the signal input to the switch line S13 may be at the high level. In other words, in the initialization period, the switch transistor 96c may be in the conductive state. In a case where the switch transistor 96c is in the conductive state in the initialization period, a current from the setting power source line V1 flows to the initialization power source line Vini through the switch transistors 96c and 96d and the drive transistor 98. In addition, since the voltage of the power source line Vini is less than a sum of a voltage Vth corresponding to the light emission threshold of the organic light emitting diode 97 and the voltage of the low-power source line ELVSS (in other words, Vini<Vth+ELVSS), the current does not flow through the organic light emitting diode 97, and the organic light emitting diode 97 does not emit light.

As described above, according to one aspect of the disclosure, a display apparatus capable of suppressing degradation of image quality can be provided.

In the description of Embodiments 1 to 9 presented above, as an example of the light emitting device, the organic light emitting diode 97 having the organic light emitting layer has been described. However, as the light emitting device, for example, an inorganic light emitting device having an inorganic light emitting layer may be used. For example, the inorganic light emitting device is so-called a light emitting device of a quantum dot type. The light emitting device of the quantum dot type includes a quantum dot that is a material formed from microcrystalline semiconductor and arranged between a first electrode and a second electrode. The quantum dot, similar to the organic light emitting diode, emits light according to a current flowing between the first electrode and the second electrode.

The technical features (constituent elements) described in each embodiment may be combined together, and a new technical feature can be formed through such a combination.

The embodiments disclosed here are examples in all respects and have to be considered not to be restrictive. The scope of the present invention is represented not in the meaning described above but in the claims and is intended to include all the changes within the meaning and the scope equivalent to the claims.

It is to be noted that, as used herein and in the appended claims, the singular forms "a", "an", and "the" include plural referents unless the context clearly dictates otherwise.

What is claimed is:

1. A display apparatus comprising:
    a light emitting device in which a first electrode, a light emitting layer, and a second electrode are laminated;
    a pixel circuit disposed below the light emitting device, and including a drive transistor with a source electrode connected to the first electrode, the drive transistor configured to control a current supplied to the light emitting device;
    a first metal plate facing the light emitting layer across the first electrode and connected to a gate electrode of the drive transistor;
    a second metal plate facing the light emitting layer across the first electrode and connected to a first voltage line; and
    a first insulating layer disposed between the first electrode and both the first metal plate and the second metal plate,
    wherein the first metal plate and the second metal plate are disposed on a same plane surface.

2. The display apparatus according to claim 1, wherein
    a first capacitor includes the first electrode, the first insulating layer, and the first metal plate,
    a second capacitor includes the first electrode, the first insulating layer, and the second metal plate,
    the first capacitor and the second capacitor are connected in series, and
    a connection point of the first capacitor and the second capacitor is connected to the source electrode.

3. The display apparatus according to claim 2, wherein the first capacitor stores at least electric charge according to luminance of the light emitting device.

4. The display apparatus according to claim 2, wherein the pixel circuit applies a second voltage of less than a sum of a voltage corresponding to a light emission threshold of the light emitting device and a voltage of the first voltage line to the first electrode and applies a third voltage of equal to or greater than a sum of a threshold voltage of the drive transistor and the second voltage to the gate electrode.

5. The display apparatus according to claim 4, wherein the pixel circuit causes the drive transistor to be conductive and applies a fourth voltage of equal to or greater than a voltage acquired by subtracting the threshold voltage from the third voltage to a drain electrode of the drive transistor.

6. The display apparatus according to claim 5, wherein the pixel circuit stops applying the fourth voltage to the drain electrode and applies a voltage corresponding to emission luminance of the light emitting device to the gate electrode.

7. The display apparatus according to claim 1, wherein
    the pixel circuit includes a planarization layer on the drive transistors, and
    the first metal plate and the second metal plate are disposed on a same surface of the planarization layer.

8. The display apparatus according to claim 7, wherein
    the same first insulating layer is disposed on the first metal plate and the second metal plate, and cover a slit space between the first metal plate and the second metal plate.

9. The display apparatus according to claim 1, wherein
    the first electrode has a planar shape, and
    the same first insulating layer is disposed between the first metal plate and the first electrode and between the second metal plate and the first electrode.

10. The display apparatus according to claim 1, wherein a distance between the first metal plate and the first electrode is equal to a distance between the second metal plate and the first electrode.

11. The display apparatus according to claim 1, further comprising a second insulating layer, which has a planar shape, including an aperture through which light emission of the light emitting device is output and a non-aperture,
    wherein the second insulating layer is disposed on a layer different from a layer in which the first metal plate and the second metal plate are disposed.

12. The display apparatus according to claim 11, wherein a contact hole of the first metal plate and the gate electrode is covered with the non-aperture.

13. The display apparatus according to claim 11, wherein a contact hole of the source electrode is covered with the non-aperture.

14. The display apparatus according to claim 11, wherein the whole area of the aperture faces the first metal plate across the first electrode.

15. The display apparatus according to claim 11, wherein the whole area of the aperture faces the second metal plate across the first electrode.

16. The display apparatus according to claim 11, wherein
    the aperture includes a first area and a second area not overlapping each other,
    the first area faces the first metal plate across the first electrode, and
    the second area faces the second metal plate across the first electrode.

17. The display apparatus according to claim 1, wherein the first metal plate is connected to the source electrode, and a contact hole of the first metal plate and the source electrode is not covered with the first electrode.

18. The display apparatus according to claim 1, wherein the second metal plate is connected to the second electrode.

19. The display apparatus according to claim 1, wherein the second metal plate is connected to a drain electrode of the drive transistor.

20. A method of manufacturing a display apparatus, the method comprising:
    arranging a transistor including a source electrode, a drain electrode, and a gate electrode on one face of a substrate;
    arranging a third insulating layer covering the transistor on an upper side of the transistor;
    arranging a first metal plate connected to the gate electrode through a first conduction part passing through the third insulating layer and a second metal plate insulated from the first metal plate in a same layer disposed on an upper side of the third insulating layer;
    arranging a first insulating layer on an upper side of the layer of the first metal plate and the second metal plate;
    arranging a first electrode connected to the source electrode through a second conduction part passing through the first insulating layer and the third insulating layer on an upper side of the first insulating layer;

arranging a light emitting layer on an upper side of the first electrode; and arranging a second electrode on an upper side of the light emitting layer.

\* \* \* \* \*